(12) United States Patent
Ueda et al.

(10) Patent No.: US 9,818,923 B2
(45) Date of Patent: Nov. 14, 2017

(54) LIGHT EMITTING DEVICE AND METHOD FOR MANUFACTURING SAME

(71) Applicant: Panasonic Intellectual Property Management Co., Ltd., Osaka (JP)

(72) Inventors: Mitsuhiko Ueda, Osaka (JP); Yoshiharu Sanagawa, Osaka (JP); Takanori Aketa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/503,872

(22) PCT Filed: Oct. 27, 2015

(86) PCT No.: PCT/JP2015/005377
§ 371 (c)(1),
(2) Date: Feb. 14, 2017

(87) PCT Pub. No.: WO2016/103547
PCT Pub. Date: Jun. 30, 2016

(65) Prior Publication Data
US 2017/0279019 A1  Sep. 28, 2017

(30) Foreign Application Priority Data
Dec. 26, 2014 (JP) ................. 2014-264522

(51) Int. Cl.
*H01L 33/62* (2010.01)
*H01L 33/48* (2010.01)
(Continued)

(52) U.S. Cl.
CPC .............. *H01L 33/62* (2013.01); *H01L 33/38* (2013.01); *H01L 33/486* (2013.01); *H01L 33/54* (2013.01);
(Continued)

(58) Field of Classification Search
CPC ........ H01L 33/00–33/64; H01L 33/486; H01L 2933/005; H01L 2933/0016; H01L 2933/0066; H01L 2933/0033
(Continued)

(56) References Cited

U.S. PATENT DOCUMENTS

| 7,262,440 B2 | 8/2007 | Choi et al. |
| 7,816,156 B2 | 10/2010 | Choi et al. |

(Continued)

FOREIGN PATENT DOCUMENTS

| JP | 2006-237141 A | 9/2006 |
| JP | 2006-270046 A | 10/2006 |

(Continued)

OTHER PUBLICATIONS

International Search Report and Written Opinion dated Jan. 12, 2016, issued in International Application No. PCT/JP2015/005377. (w/ partial English translation).

*Primary Examiner* — Selim Ahmed
(74) *Attorney, Agent, or Firm* — McDermott Will & Emery LLP

(57) ABSTRACT

The light emitting device includes the cap including the ultraviolet light transmitting part made of glass for transmitting ultraviolet light. In the light emitting device, the first electrode of the ultraviolet light emitting element and the first conductor of the mounting substrate are bonded with the first bond made of AuSn, the second electrode of the ultraviolet light emitting element and the second conductor of the mounting substrate are bonded with the second bond made of AuSn, and the first bonding metal layer of the mounting substrate and the second bonding metal layer of the cap are bonded with the third bond made of AuSn.

21 Claims, 35 Drawing Sheets

(51) Int. Cl.
*H01L 33/38* (2010.01)
*H01L 33/56* (2010.01)
*H01L 33/54* (2010.01)

(52) U.S. Cl.
CPC ........ *H01L 33/56* (2013.01); *H01L 2933/005* (2013.01); *H01L 2933/0016* (2013.01); *H01L 2933/0033* (2013.01); *H01L 2933/0066* (2013.01)

(58) Field of Classification Search
USPC ........................................ 257/98, 99; 438/22
See application file for complete search history.

(56) References Cited

U.S. PATENT DOCUMENTS

| | | | |
|---|---|---|---|
| 8,450,847 B2 | 5/2013 | Ninz et al. | |
| 2006/0214178 A1 | 9/2006 | Choi et al. | |
| 2008/0038854 A1 | 2/2008 | Choi et al. | |
| 2010/0051982 A1* | 3/2010 | Lin | H01L 33/486 257/98 |
| 2010/0090235 A1* | 4/2010 | Wang | H01L 33/486 257/98 |
| 2011/0140590 A1 | 6/2011 | Nakamura | |
| 2011/0285017 A1 | 11/2011 | Ninz et al. | |

FOREIGN PATENT DOCUMENTS

| | | |
|---|---|---|
| JP | 2007-019053 A | 1/2007 |
| JP | 2007-189031 A | 7/2007 |
| JP | 2007-317787 A | 12/2007 |
| JP | 2008-098247 A | 4/2008 |
| JP | 2009-177098 A | 8/2009 |
| JP | 2010-129698 A | 6/2010 |
| JP | 2011-040577 A | 2/2011 |
| JP | 2011-124449 A | 6/2011 |
| JP | 2011-192845 A | 9/2011 |
| JP | 2012-515441 A | 7/2012 |
| WO | 2014/118838 A1 | 8/2014 |

\* cited by examiner

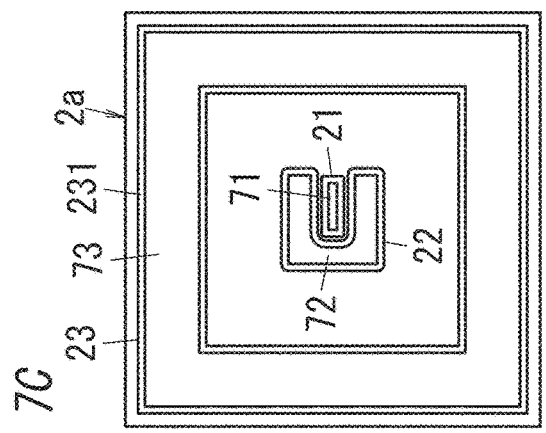
FIG. 7A
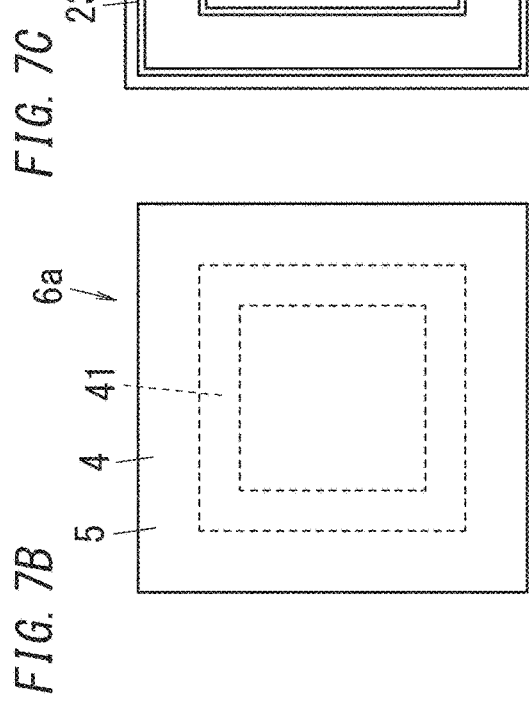
FIG. 7B
FIG. 7C
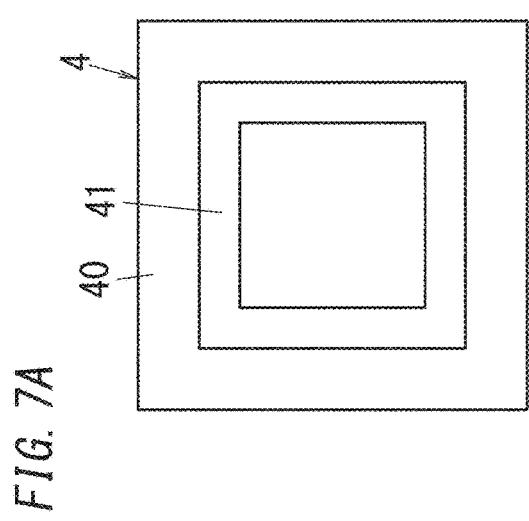
FIG. 7D
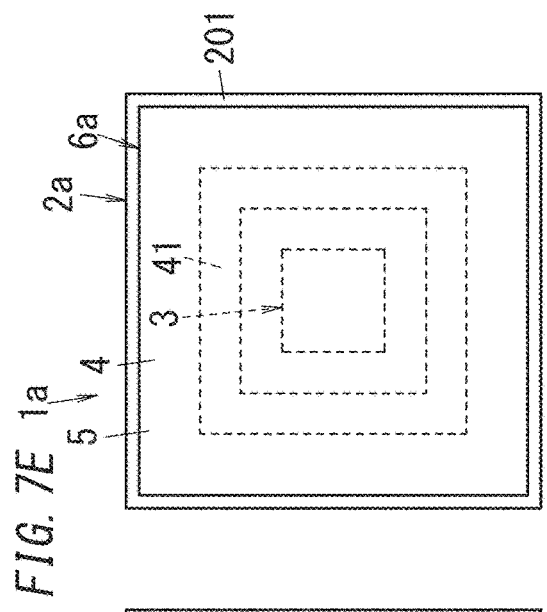
FIG. 7E

LIGHT EMITTING DEVICE AND METHOD FOR MANUFACTURING SAME

RELATED APPLICATIONS

This application is the U.S. National Phase under 35 U.S.C. §371 of International Application No. PCT/JP2015/005377, filed on Oct. 27, 2015; which in turn claims the benefit of Japanese Application No. 2014-264522, filed on Dec. 26, 2014, the disclosures of which are incorporated by reference herein.

TECHNICAL FIELD

The present invention relates to light emitting devices and methods for manufacturing the same.

BACKGROUND ART

In the past, there has been proposed, as a thin light emitting device excellent in heat radiation performance, an LED package including a submount substrate, an LED element mounted on the submount substrate, a spacer having a cavity, and an optical element (Document 1 [JP 2006-270046 A]), for example.

The optical element is formed of, for example, a glass plate.

In the LED package, the LED element is bonded to patterned electrodes, via solder bumps formed on electrodes of the LED element, by flip-chip bonding.

The spacer is formed of a silicon substrate, for example, and is bonded to the submount substrate with an adhesive sheet. The optical element is formed of, for example, a glass plate, and is bonded to an upper surface of the spacer with an adhesive sheet.

Further, there has been known a method for manufacturing a light emitting device, including mounting an LED element on an inorganic material substrate by flip-chip bonding, and subsequently performing a step of covering with a wavelength conversion layer, and thereafter performing a step of bonding the inorganic material substrate to a glass cover (Document 2 [JP 2011-40577 A]).

The inorganic material substrate is provided with AuSn electrodes for mounting the LED element by flip-chip bonding, and an Au layer serving as an adhesion foundation layer for bonding the glass cover.

In the fields of light emitting devices, there would be a demand to improve reliability and reduce production cost.

SUMMARY OF INVENTION

An object of the present invention would be to propose a light emitting device capable of improving reliability and reducing production cost, and a method for manufacturing the same.

The light emitting device of one aspect according to the present invention includes: a mounting substrate; an ultraviolet light emitting element mounted on the mounting substrate; and a cap placed on the mounting substrate and including a recess for accommodating the ultraviolet light emitting element. The mounting substrate includes a support, and a first conductor, a second conductor and a first bonding metal layer supported on the support. The first conductor and the second conductor are placed facing a front surface of the support to face a bottom of the recess of the cap. The cap includes a cap body having a front surface and a rear surface and provided with the recess in the rear surface, and a second bonding metal layer placed on the rear surface of the cap body at a periphery of the recess to face the first bonding metal layer. The cap further includes an ultraviolet light transmitting part between the front surface of the cap body and the bottom of the recess. At least the ultraviolet light transmitting part is made of glass for transmitting ultraviolet light emitted from the ultraviolet light emitting element. The ultraviolet light emitting element includes a first electrode and a second electrode, and the first electrode and the second electrode are placed facing a surface in a thickness direction of the ultraviolet light emitting element. The first conductor, the second conductor, and the first bonding metal layer are formed of a same laminated film facing the front surface of the support. Each of the first conductor, the second conductor, and the first bonding metal layer includes an uppermost layer which is the furthest from the support therein and is made of Au. In the light emitting device, the first electrode and the first conductor are bonded with a first bond made of AuSn, and the second electrode and the second conductor are bonded with a second bond made of AuSn. In the light emitting device, the first bonding metal layer and the second bonding metal layer are bonded with a third bond made of AuSn.

The method for manufacturing a light emitting device, of one aspect according to the present invention is a method for manufacturing a light emitting device having the following configuration.

The light emitting device includes: a mounting substrate; an ultraviolet light emitting element mounted on the mounting substrate; and a cap placed on the mounting substrate and including a recess for accommodating the ultraviolet light emitting element. The mounting substrate includes a support, and a first conductor, a second conductor and a first bonding metal layer supported on the support. The first conductor and the second conductor are placed facing a front surface of the support to face a bottom of the recess of the cap. The cap includes a cap body having a front surface and a rear surface and provided with the recess in the rear surface, and a second bonding metal layer placed on the rear surface of the cap body at a periphery of the recess to face the first bonding metal layer. The cap further includes an ultraviolet light transmitting part between the front surface of the cap body and the bottom of the recess, and at least the ultraviolet light transmitting part is made of glass for transmitting ultraviolet light emitted from the ultraviolet light emitting element. The ultraviolet light emitting element includes a first electrode and a second electrode, and the first electrode and the second electrode are placed facing a surface in a thickness direction of the ultraviolet light emitting element.

The method for manufacturing the light emitting device includes forming the cap. The method for manufacturing the light emitting device includes subsequently bonding the first electrode and the second electrode of the ultraviolet light emitting element, and the second bonding metal layer of the cap, to the first conductor, the second conductor, and the first bonding metal layer of the mounting substrate with a first AuSn layer, a second AuSn layer, and a third AuSn layer, respectively. The first AuSn layer, the second AuSn layer, and the third AuSn layer are formed collectively on/over the mounting substrate by a same process.

BRIEF DESCRIPTION OF DRAWINGS

FIG. 7A is a primary plan for illustration of the method for manufacturing the light emitting device of Embodiment 1. FIG. 7B is a primary plan for illustration of the method for manufacturing the light emitting device of Embodiment 1. FIG. 7C is a primary plan for illustration of the method for manufacturing the light emitting device of Embodiment 1. FIG. 7D is a primary plan for illustration of the method for manufacturing the light emitting device of Embodiment 1. FIG. 7E is a primary plan for illustration of the method for manufacturing the light emitting device of Embodiment 1.

DESCRIPTION OF EMBODIMENTS

Figures mentioned in the following explanation of Embodiments 1 to 7 are schematic, and therefore ratios of sizes or thicknesses of illustrated components may not always reflect actual ratios of dimensions.

Embodiment 1

Figure 1:
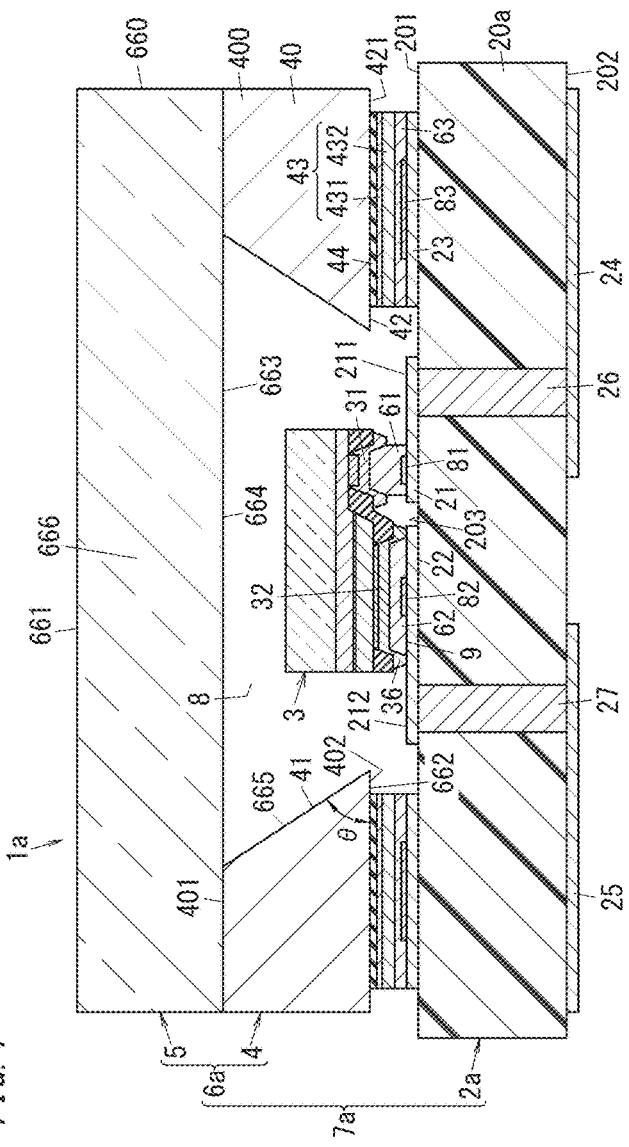
FIG. 1 is a schematic section of the light emitting device of Embodiment 1.
Figure 2:
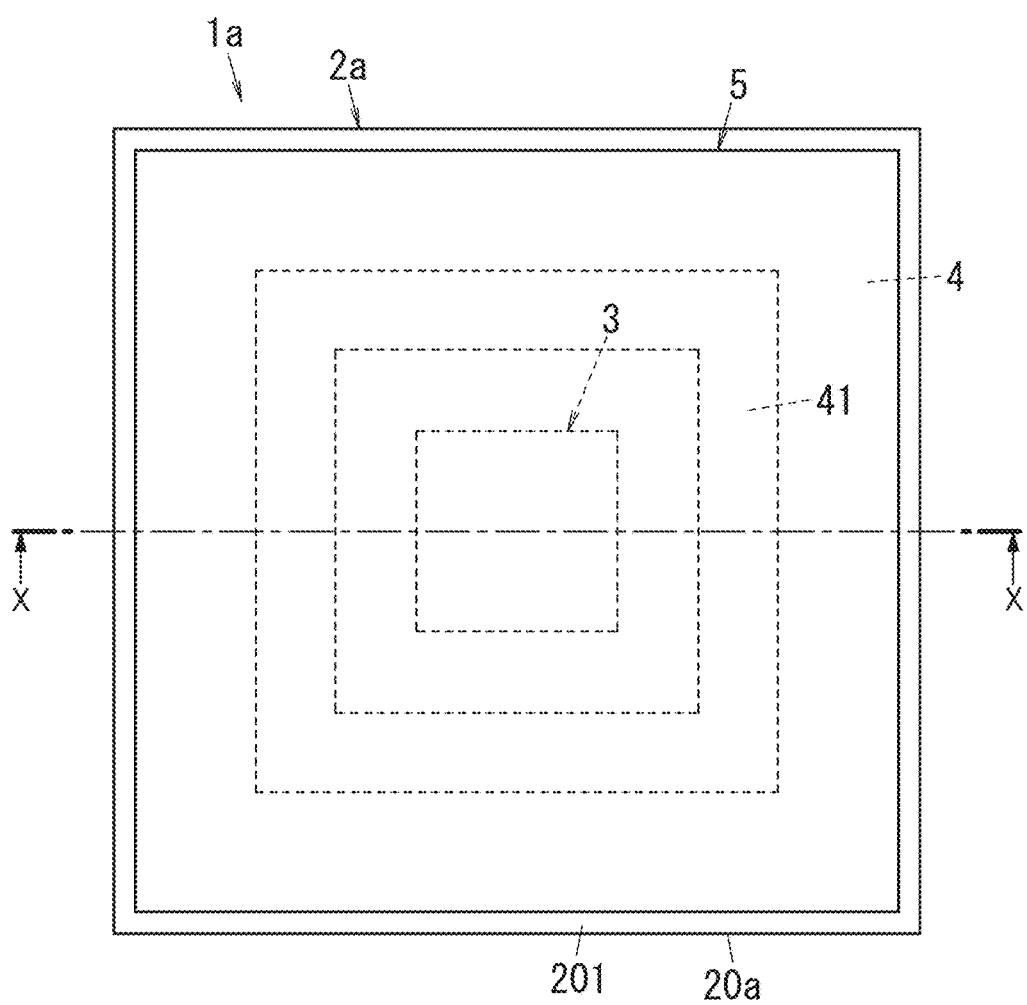
FIG. 2 is a schematic plan of the light emitting device of Embodiment 1.
Figure 3:
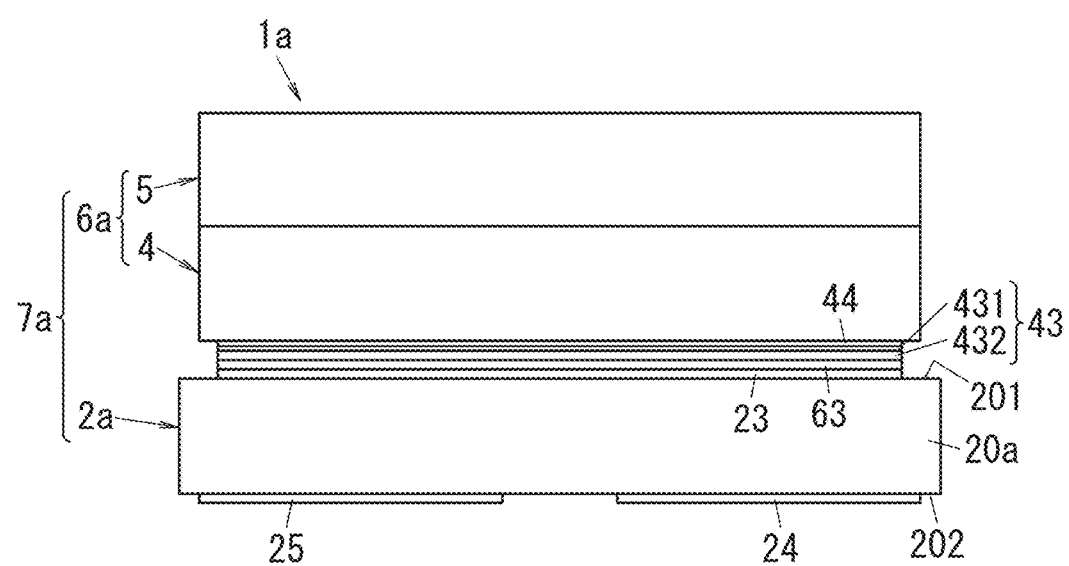
FIG. 3 is a schematic side view of the light emitting device of Embodiment 1.
Figure 4:
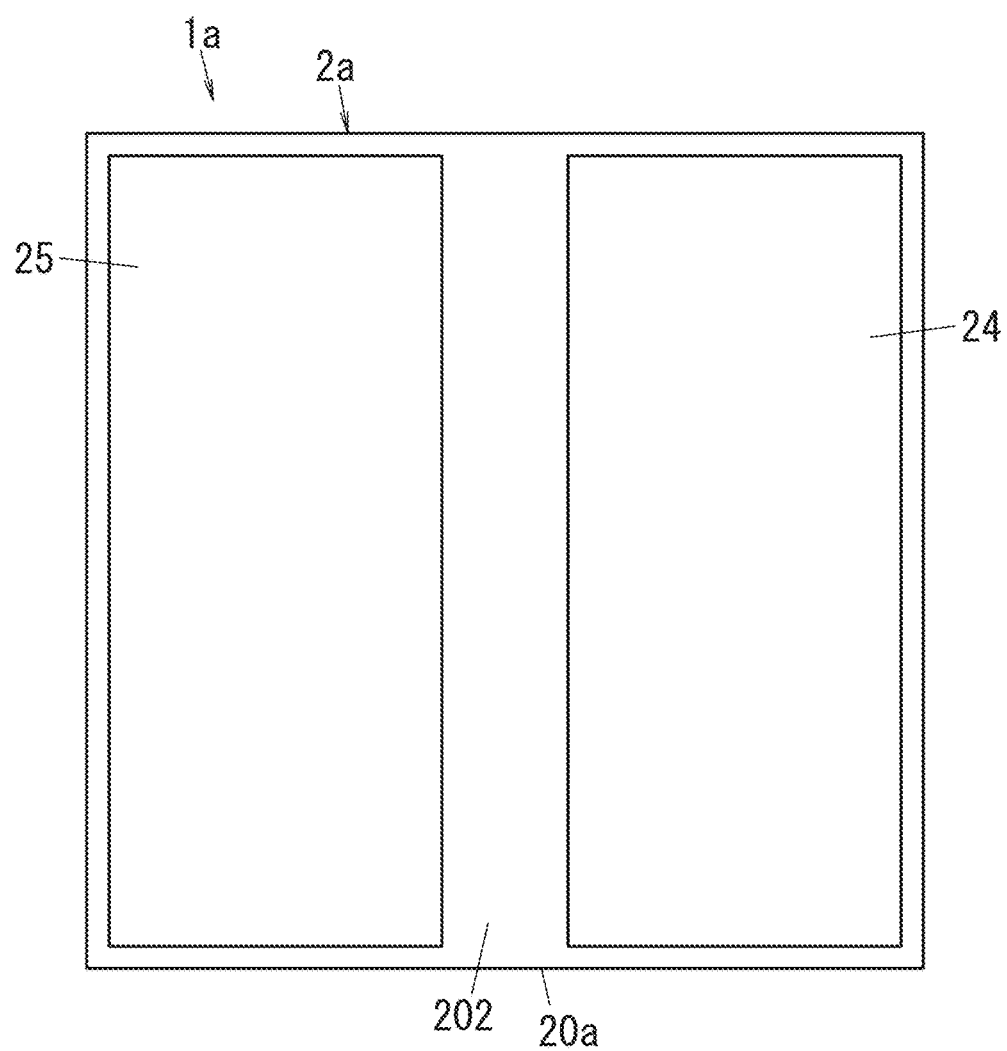
FIG. 4 is a schematic bottom view of the light emitting device of Embodiment 1.

Hereinafter, the light emitting device 1a of the present embodiment is described with reference to FIG. 1 to FIG. 8. Note that, FIG. 1 is a schematic section along X-X line in FIG. 2.

The light emitting device 1a includes a mounting substrate 2a, an ultraviolet light emitting element 3 mounted on the mounting substrate 2a, a spacer 4 placed on the mounting substrate 2a and including a through hole 41 for exposing the ultraviolet light emitting element 3, and a cover 5 placed on the spacer 4 to cover the through hole 41 of the spacer 4. The mounting substrate 2a includes a support 20a, and further includes a first conductor 21, a second conductor 22, and a first bonding metal layer 23 which are supported on the support 20a. The first conductor 21 and the second conductor 22 are placed facing the front surface 201 of the support 20a to be exposed via the through hole 41. The spacer 4 includes a spacer body 40 made of Si, and a second bonding metal layer 43 placed facing a facing surface 42 of the spacer body 40 facing the mounting substrate 2a to face the first bonding metal layer 23. The cover 5 is made of glass for transmitting ultraviolet light emitted from the ultraviolet light emitting element 3. In the light emitting device 1a, the spacer 4 and the cover 5 are bonded to each other. The ultraviolet light emitting element 3 includes a first electrode 31 and a second electrode 32, and the first electrode 31 and the second electrode 32 are placed facing a surface in a thickness direction of the ultraviolet light emitting element 3. In the light emitting device 1a, the first electrode 31 and the first conductor 21 are bonded to each other with a first bond 61 made of AuSn, and the second electrode 32 and the second conductor 22 are bonded to each other with a second bond 62 made of AuSn. In the light emitting device 1a, the second bonding metal layer 43 of the spacer 4 and the first bonding metal layer 23 of the mounting substrate 2a are bonded to each other with a third bond 63 made of AuSn. The light emitting device 1a with the configuration described above can offer advantageous effects of improving reliability and reducing production cost. In the light emitting device 1a, interposed between the first electrode 31 and the first conductor 21 is the first bond 61 which is made of AuSn and bonds the first electrode 31 and the first conductor 21 to each other, and interposed between the second electrode 32 and the second conductor 22 is the second bond 62 which is made of AuSn and bonds the second electrode 32 and the second conductor 22 to each other. Additionally, in the light emitting device 1a, interposed between the second bonding metal layer 43 and the first bonding metal layer 23 is the third bond 63 which is made of AuSn and bonds the second bonding metal layer 43 and the first bonding metal layer 23 to each other.

In the light emitting device 1a, the spacer 4 and the cover 5 constitute a cap 6a for covering the ultraviolet light emitting element 3. The cap 6a includes a recess 663 for accommodating the ultraviolet light emitting element 3. From another point of view, the light emitting device 1a includes the following components.

The light emitting device 1a includes the mounting substrate 2a, the ultraviolet light emitting element 3 mounted on the mounting substrate 2a, and the cap 6a placed on the mounting substrate 2a and including the recess 663 for accommodating the ultraviolet light emitting element 3. The mounting substrate 2a includes the support 20a, and the first conductor 21, the second conductor 22 and the first bonding metal layer 23 supported on the support 20a. The first conductor 21 and the second conductor 22 are placed facing a front surface 201 of the support 20a to face a bottom 664 of the recess 663 of the cap 6a. The cap 6a includes a cap body 660 having a front surface 661 and a rear surface 662 and provided with the recess 663 in the rear surface 662, and the second bonding metal layer 43 placed on the rear surface 662 of the cap body 660 at a periphery of the recess 663 to face the first bonding metal layer 23. The cap 6a further includes an ultraviolet light transmitting part 666 between the front surface 661 of the cap body 660 and the bottom 664 of the recess 663 and at least the ultraviolet light transmitting part 666 is made of glass for transmitting ultraviolet light emitted from the ultraviolet light emitting element 3. The ultraviolet light emitting element 3 includes the first electrode 31 and the second electrode 32, and the first electrode 31 and the second electrode 32 are placed facing the surface in the thickness direction of the ultraviolet light emitting element 3. The first conductor 21, the second conductor 22, and the first bonding metal layer 23 are laminated films which face the front surface 201 of the support 20a and are made of the same material and have the same thickness. In other words, the first conductor 21, the second conductor 22, and the first bonding metal layer 23 are formed of the same laminated film facing the front surface 201 of the support 20a. Each of the first conductor 21, the second conductor 22, and the first bonding metal layer 23 includes an uppermost layer which is the furthest from the support 20a therein and is made of Au. In the light emitting device 1a, the first electrode 31 and the first conductor 21 are bonded with the first bond 61 made of AuSn, and the second electrode 32 and the second conductor 22 are bonded with the second bond 62 made of AuSn. In the light emitting device 1a, the first bonding metal layer 23 and the second bonding metal layer 43 are bonded with the third bond 63 made of AuSn. The light emitting device 1a with the configuration described above can offer advantageous effects of improving reliability and reducing production cost.

The cap 6a includes the spacer 4 placed on the mounting substrate 2a and includes the through hole 41 for exposing the ultraviolet light emitting element 3, and the cover 5 placed on the spacer 4 to cover the through hole 41 of the spacer 4 and bonded to the spacer 4. In the cap 6a, the bottom 664 of the recess 663 is part of a surface of the cover 5 exposed via the through hole 41. The cover 5 is made of glass transmissive for ultraviolet light emitted from the ultraviolet light emitting element 3. The spacer 4 includes the spacer body 40 made of Si, and the second bonding metal layer 43 placed facing the facing surface 42 of the spacer body 40 facing the mounting substrate 2a to face the first bonding metal layer 23. Accordingly, in the light emitting device 1a, the cover 5 easily transmits ultraviolet light emitted from the ultraviolet light emitting element 3 toward the bottom 664 of the recess 663, and the spacer 4 easily reflects ultraviolet light emitted from the ultraviolet light emitting element 3 toward an internal side surface 665 of the recess 663. Hence, the light emitting device 1a can allow ultraviolet light emitted from the ultraviolet light emitting element 3 to emerge outside via the front surface 661 of the cap 6a efficiently. Additionally, in the light emitting device 1a, the cap 6a is made of inorganic material.

In the light emitting device 1a, the third bond 63 (see FIG. 1 and FIG. 3) may preferably extend an entire length of an outer periphery 421 of the facing surface 42 of the spacer body 40 facing the mounting substrate 2a. In other words, the third bond 63 (see FIG. 1 and FIG. 3) may preferably extend an entire length of an outer periphery of the rear surface 662 of the cap body 660. Thus, the light emitting device 1a can suppress outside air, moisture, and the like from reaching the ultraviolet light emitting element 3, the first conductor 21 and the second conductor 22. Hence, reliability can be improved.

Further, in the light emitting device 1a, the mounting substrate 2a, the spacer 4, and the cover 5 constitute a package 7a for accommodating the ultraviolet light emitting element 3. In the light emitting device 1a, the third bond 63 (see FIG. 1 and FIG. 3) may preferably extend the entire length of the outer periphery 421 of the facing surface 42 of the spacer body 40 facing the mounting substrate 2a, as described above, and therefore the ultraviolet light emitting element 3 can be enclosed hermetically.

The following detailed description is made to components of the light emitting device 1a.

The mounting substrate 2a serves as a substrate on which the ultraviolet light emitting element 3 is mounted. The expression "the ultraviolet light emitting element 3 is mounted on the substrate" means that the ultraviolet light emitting element 3 is placed on the substrate and is connected to the substrate mechanically and electrically.

For example, the mounting substrate 2a is designed to allow mounting one ultraviolet light emitting element 3 thereon.

The mounting substrate 2a is larger than the ultraviolet light emitting element 3 in a plan view.

The support 20a supports the first conductor 21, the second conductor 22, and the first bonding metal layer 23. Further, the support 20a electrically insulates the first conductor 21, the second conductor 22, and the first bonding metal layer 23 from each other. Furthermore, the support 20a may preferably server as a heat sink for efficiently transferring heat produced in the ultraviolet light emitting element 3 to an outside.

In the mounting substrate 2a, the support 20a is formed to have a flat plate shape, and the first conductor 21, the second conductor 22, and the first bonding metal layer 23 are formed on the front surface 201 perpendicular to the thickness direction of the support 20a.

The support 20a has an outer shape being a quadrangular shape (square or rectangular shape). The outer shape of the support 20a is not limited to a quadrangular shape, but examples thereof may include polygonal shapes and circular shapes in addition to quadrangular shapes.

The first conductor 21 is an electrically conductive layer electrically connected to the first electrode 31 of the ultraviolet light emitting element 3. The second conductor 22 is an electrically conductive layer electrically connected to the second electrode 32 of the ultraviolet light emitting element 3.

Each of the first conductor 21, the second conductor 22, and the first bonding metal layer 23 can be formed of a laminated film of, for example, a Ti film, a Pt film, and an Au film. Each of the first conductor 21, the second conductor 22, and the first bonding metal layer 23 may be formed of a laminated film such as a laminated film of an Al film, an Ni film, a Pd film, and an Au film, a laminated film of an Ni film and an Au film, and a laminated film of a Cu film, an Ni film, and an Au film. In a case where each of the first conductor 21, the second conductor 22, and the first bonding metal layer 23 is formed of a laminated film, an uppermost layer which is the furthest from the support 20a in the laminated film may be preferably made of Au, and a lowermost layer which is the closest to the support 20a in the laminated film may be made of material with high adhesion to the support 20a. The first conductor 21, the second conductor 22, and the first bonding metal layer 23 may not be formed of a laminated film but may be formed of a single layer film.

As to the mounting substrate 2a, the first conductor 21, the second conductor 22, and the first bonding metal layer 23 are arranged so that the first conductor 21, the second conductor 22, and the first bonding metal layer 23 are spatially separated from each other. The mounting substrate 2a includes a groove 203 formed between the first conductor 21 and the second conductor 22. An inner surface of the groove 203 includes part of the front surface 201 of the support 20a, and surfaces of the first conductor 21 and the second conductor 22 facing each other. In the mounting substrate 2a, the first conductor 21, the second conductor 22, and the first bonding metal layer 23 are formed on the front surface 201 of the support 20a and have the same thickness. Hence, in the mounting substrate 2a, a front surface 211 of the first conductor 21, a front surface 212 of the second conductor 22, and a front surface 231 (see FIG. 8) of the first bonding metal layer 23 are flush with each other.

Figure 5:
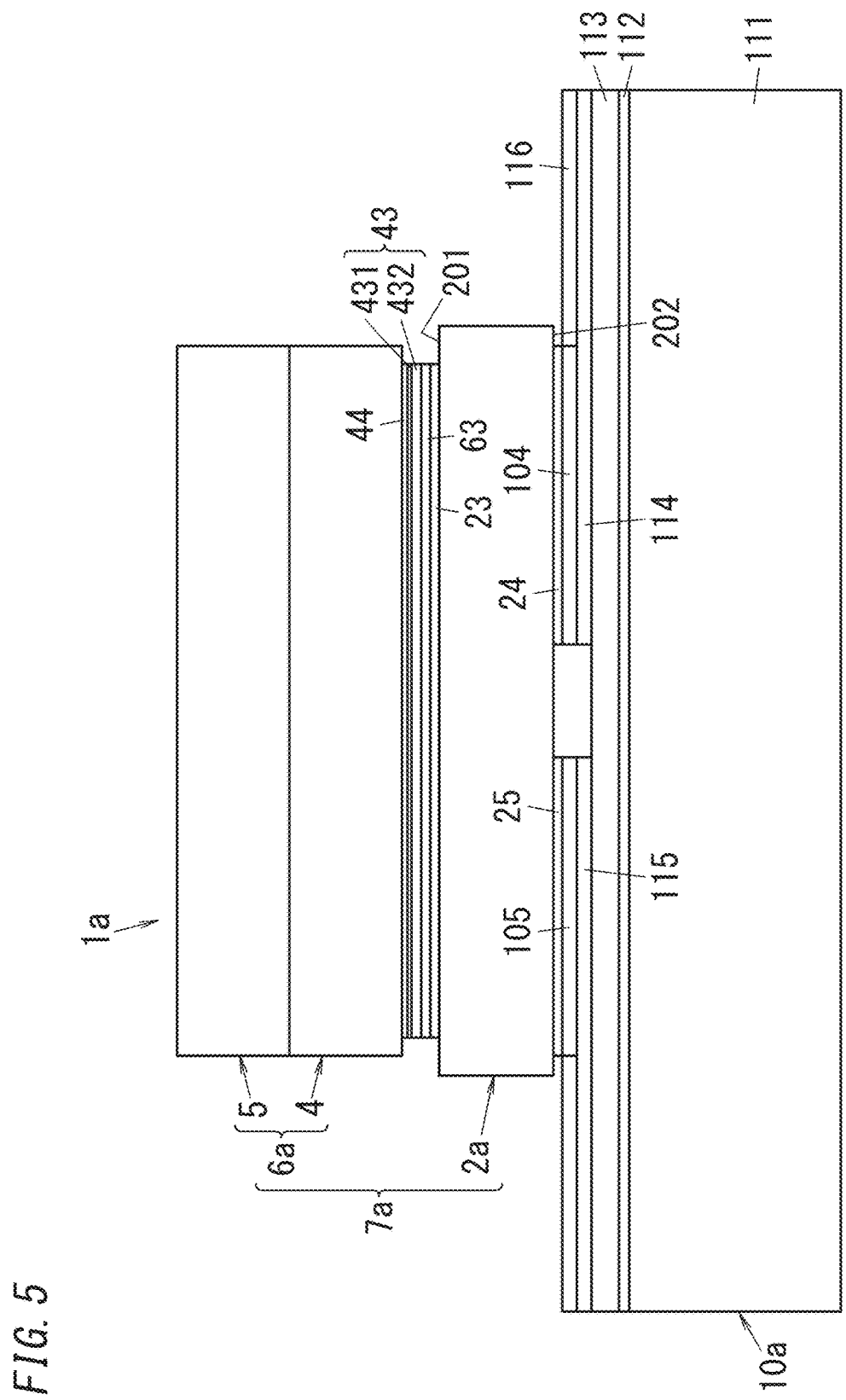
FIG. 5 is a schematic side view of the structure where the light emitting device of Embodiment 1 is mounted on a wiring substrate.

The mounting substrate 2a includes a first external connection electrode 24 and a second external connection electrode 25, and further includes a first penetrating wire 26 and a second penetrating wire 27 formed to penetrate through the support 20a in the thickness direction of the same. The first external connection electrode 24 and the second external connection electrode 25 are formed on the rear surface 202 of the support 20a. The first external connection electrode 24 is electrically connected to the first conductor 21 through the first penetrating wire 26. The second external connection electrode 25 is electrically connected to the second conductor 22 through the second penetrating wire 27. Therefore, as shown in FIG. 5, the light emitting device 1a can be mounted on a wiring substrate 10a by surface mounting, for example.

The wiring substrate 10a serves as a mother substrate. The wiring substrate 10a may be formed of, for example, a metal base printed wiring board. In this case, the wiring substrate 10a may preferably include, for example, a metal plate 111, an Au layer 112 formed on the metal plate 111, and an insulating resin layer 113 formed on the Au layer 112, and further includes a first wiring part 114 and a second wiring part 115 which are formed on the insulating resin layer 113. The metal plate 111 may be formed of a Cu plate but may be formed of, for example, an Al plate. In the ultraviolet LED module including the light emitting device 1a and the wiring substrate 10a, the first external connection electrode 24 is bonded to the first wiring part 114 with a fifth bond 104 made of solder to be electrically connected to the same. Additionally in the ultraviolet LED module, the second external connection electrode 25 is bonded to the second wiring part 115 with a sixth bond 105 made of solder to be electrically connected to the same. In summary, in the ultraviolet LED module, the light emitting device 1a is secondarily-mounted on the wiring substrate 10a. Since the first bond 61, the second bond 62, and the third bond 63 each are made of AuSn, the light emitting device 1a can have heat resistance improved in contrast to a case where they each are made of SnCuAg which is one type of lead-free solder other than AuSn. Accordingly, remelting of the first bond 61, the second bond 62, and the third bond 63 can be suppressed in, for example, secondarily mounting the light emitting device 1a on the wiring substrate 10a. In the ultraviolet LED module, the wiring substrate 10a may be preferably larger than the light emitting device 1a in a plan view. By doing so, the ultraviolet LED module can have heat radiation performance improved.

The wiring substrate 10a may preferably include a resist layer 116 for covering regions of the first wiring part 114 and the second wiring part 115 which do not overlap with the light emitting device 1a. Examples of material of the resist layer 116 may include a white resist. Examples of the white resist may include resin containing a white colorant. Examples of the white colorant may include barium sulfate ($BaSO_4$) and titanium dioxide ($TiO_2$). Examples of the resin may include silicone. As the white resist, "ASA COLOR (trademark) RESIST INK", which is a white resist material of silicone, available from ASAHI RUBBER INC. may be used, for example. The resist layer 116 may be made by coating, for example.

Each of the first external connection electrode 24 and the second external connection electrode 25 may be formed of, for example, a laminated film of a Ti film, a Pt film, and an Au film. Examples of laminated films for the first conductor 21 and the second conductor 22 may include a laminated film of an Al film, an Ni film, an Pd film, and an Au film, a laminated film of an Ni film and an Au film, and a laminated film of a Cu film, an Ni film, and an Au film. In case where each of the first conductor 21 and the second conductor 22 is formed of a laminated film, an uppermost layer which is the furthest from the support 20a in the laminated film may be preferably made of Au, and a lowermost layer which is the closest to the support 20a in the laminated film may be made of material with high adhesion to the support 20a. The first external connection electrode 24 and the second external connection electrode 25 may not be formed of a laminated film but may be formed of a single layer film.

The first penetrating wire 26 and the second penetrating wire 27 may be made of, for example, W, Cu, or the like. The first penetrating wire 26 and the second penetrating wire 27 may be preferably placed not to overlap with the ultraviolet light emitting element 3 in the thickness direction of the ultraviolet light emitting element 3.

The support 20a may be preferably made of AlN ceramic. In this case, the light emitting device 1a can efficiently dissipate heat produced in the ultraviolet light emitting element 3 through the support 20a, compared with a case where the support 20a is formed of a resin substrate. Accordingly, the light emitting device 1a can have heat radiation performance improved. AlN ceramic has electrically insulating properties, and also has relatively high thermal conductivity. For example, AlN ceramic is higher in thermal conductivity than Si.

The ultraviolet light emitting element 3 is an ultraviolet LED chip. The ultraviolet light emitting element 3 has a chip size of 400 μm□ (400 μm×400 μm), but this is a merely example. The ultraviolet light emitting element 3 may have a chip size in an appropriate range of, for example, around 200 μm□ (200 μm×200 μm) to 1 mm□ (1 mm×1 mm). Additionally, a planar shape of the ultraviolet light emitting element 3 is not limited to a square shape, but examples of the planar shape may include a rectangular shape.

The ultraviolet light emitting element 3 is mounted on the mounting substrate 2a by flip-chip mounting.

Figure 6:
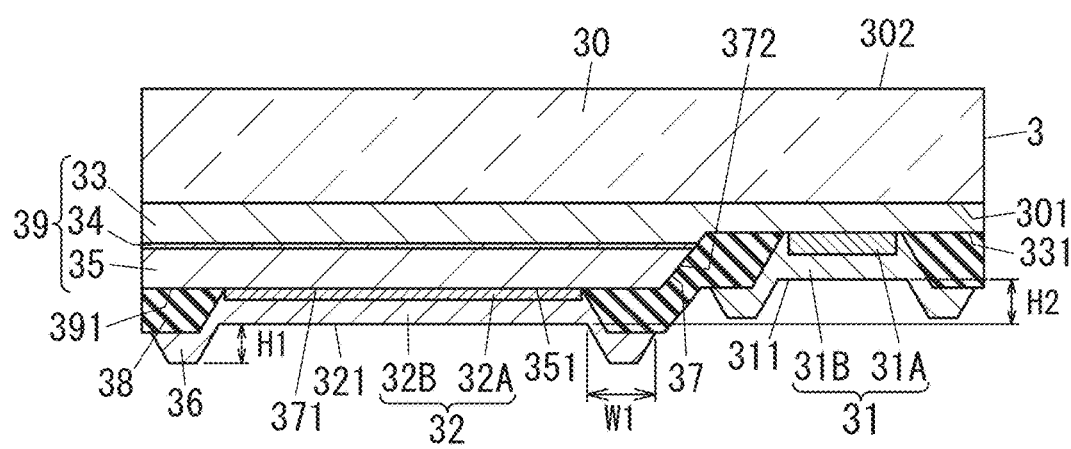
FIG. 6 is a schematic section of the ultraviolet light emitting element of the light emitting device of Embodiment 1

As shown in FIG. 6, the ultraviolet light emitting element 3 includes the substrate 30, and a first conductivity-type semiconductor layer 33 and a second conductivity-type semiconductor layer 35 are stacked facing a first surface 301 of the substrate 30 and arranged in this order from the first surface 301. In summary, the ultraviolet light emitting element 3 includes a semiconductor multilayered film 39 including the first conductivity-type semiconductor layer 33 and the second conductivity-type semiconductor layer 35. In the ultraviolet light emitting element 3, the first conductivity-type semiconductor layer 33 is formed of an n-type semiconductor layer, and the second conductivity-type semiconductor layer 35 is formed of a p-type semiconductor layer. In the ultraviolet light emitting element 3, the first conductivity-type semiconductor layer 33 may be formed of a p-type semiconductor layer, and the second conductivity-type semiconductor layer 35 may be formed of an n-type semiconductor layer.

The substrate 30 supports the semiconductor multilayered film 39. The semiconductor multilayered film 39 may be made by, for example, epitaxial growth. Epitaxial growth may be crystal growth such as, MOVPE (metal organic vapor phase epitaxy), HYPE (hydride vapor phase epitaxy), and MBE (molecular beam epitaxy). Note that, the semiconductor multilayered film 39 may contain impurities such as hydrogen, carbon, oxygen, silicon, and iron which may be unavoidably contained in forming the semiconductor multilayered film 39. The substrate 30 may be formed of a crystal growth substrate used for forming the semiconductor multilayered film 39.

In a case where the ultraviolet light emitting element 3 is an AlGaN ultraviolet LED chip, the substrate 30 may be preferably formed of a sapphire substrate. The substrate 30 may be a substrate made of material capable of efficiently transmitting ultraviolet light emitted from the semiconductor multilayered film 39. Examples of this substrate may include a single-crystalline AlN substrate in addition to a sapphire substrate. The substrate 30 may be preferably transparent for ultraviolet light emitted from the semiconductor multilayered film 39. In the ultraviolet light emitting element 3, a second surface 302 which is an opposite surface of the substrate 30 from the first surface 301 may preferably serve as a light exit surface. In the ultraviolet light emitting element 3, the semiconductor multilayered film 39 may preferably include a buffer layer between the substrate 30 and the first conductivity-type semiconductor layer 33. The buffer layer may be preferably formed of, for example, an AlN layer.

The semiconductor multilayered film 39 may preferably include a light emitting layer 34 between the first conductivity-type semiconductor layer 33 and the second conductivity-type semiconductor layer 35. In this case, ultraviolet light emitted from the semiconductor multilayered film 39 is the same as ultraviolet light emitted from the light emitting layer 34, and an emission peak wavelength thereof may depend on material of the light emitting layer 34. In the ultraviolet light emitting element 3, the light emitting layer 34 may have a single quantum well structure or a multi-quantum well structure, for example, but may be not limited to having such structure. For example, in the ultraviolet light emitting element 3, the first conductivity-type semiconductor layer 33, the light emitting layer 34, and the second conductivity-type semiconductor layer 35 may constitute a double heterostructure.

The first conductivity-type semiconductor layer 33 may be formed of, for example, an n-type AlGaN layer. The first conductivity-type semiconductor layer 33 may have a single layer structure or a multilayered structure.

The second conductivity-type semiconductor layer 35 may have a single layer structure or a multilayered structure. The second conductivity-type semiconductor layer 35 may have a multilayered structure constituted by, for example, a p-type electron block layer, a p-type semiconductor layer, and a p-type contact layer. In this case, the p-type semiconductor layer serves as a layer for transporting holes to the light emitting layer 34. The p-type electron block layer serves as a layer for suppressing leakage (overflow), to the p-type semiconductor layer, of electrons which are not recombined with holes inside the light emitting layer 34. The p-type electron block layer may preferably have higher band-gap energy than the p-type semiconductor layer and the light emitting layer 34. The p-type contact layer serves as a layer for achieving fine ohmic contact with the second electrode 32 by reducing contact resistance with the second electrode 32. The p-type electron block layer and the p-type semiconductor layer may be formed of, for example, AlGaN layers with different compositions. Additionally, the p-type contact layer may be formed of, for example, a p-type GaN layer.

In the ultraviolet light emitting element 3, the semiconductor multilayered film 39 is partially removed by etching the same from a surface 391 of the semiconductor multilayered film 39 until reaching an almost middle of the first conductivity-type semiconductor layer 33. In summary, the ultraviolet light emitting element 3 has a mesa structure 37 formed by etching the semiconductor multilayered film 39 partially. Hence, the ultraviolet light emitting element 3 has a level difference between a front surface 351 of the second conductivity-type semiconductor layer 35 and a front surface 331 of the first conductivity-type semiconductor layer 33. In the ultraviolet light emitting element 3, the first electrode 31 is formed on the exposed front surface 331 of the first conductivity-type semiconductor layer 33, and the second electrode 32 is formed on the front surface 351 of the second conductivity-type semiconductor layer 35. In the ultraviolet light emitting element 3, when a conductivity-type (first conductivity-type) of the first conductivity-type semiconductor layer 33 is an n-type and a conductivity-type (second conductivity-type) of the second conductivity-type semiconductor layer 35 is a p-type, the first electrode 31 and the second electrode 32 serve as a negative electrode and a positive electrode, respectively. Alternatively, in the ultraviolet light emitting element 3, when the first conductivity-type of the first conductivity-type semiconductor layer 33 is a p-type and the second conductivity-type of the second conductivity-type semiconductor layer 35 is an n-type, the first electrode 31 and the second electrode 32 serve as a positive electrode and a negative electrode, respectively.

In the ultraviolet light emitting element 3, the front surface 351 of the second conductivity-type semiconductor layer 35 may preferably have an area larger than an area of the exposed front surface 331 of the first conductivity-type semiconductor layer 33. Accordingly, in the ultraviolet light emitting element 3, an overlap between the second conductivity-type semiconductor layer 35 and the first conductivity-type semiconductor layer 33 in the thickness direction can be enlarged, and thus light emission efficiency can be improved.

In the light emitting device 1a, the ultraviolet light emitting element 3 may preferably include a protrusion structure 36. The protrusion structure 36 may preferably protrude from the front surface 351 of the second conductivity-type semiconductor layer 35 of the ultraviolet light emitting element 3 toward the front surface 212 of the second conductor 22 to be in contact with the front surface 212 of the second conductor 22. Further, the protrusion structure 36 may preferably extend along the outer periphery of the second electrode 32. As shown in FIG. 1, the second bond 62 may be preferably formed to fill up a space 9 (see FIG. 1) surrounded by the second electrode 32, the protrusion structure 36, and the second conductor 22. The shape of the protrusion structure 36 in a plan view is formed so that the protrusion structure 36 extends along the outer periphery of the second electrode 32 to surround the second bond 62.

An overlap between the mounting substrate 2a and the protrusion structure 36 in a plan view may preferably have the same height as or lower than part of the second conductor 22 to be bonded to the second bond 62. Thus, in the light emitting device 1a, the first bond 61 and the second bond 62 each can be made to be thinner, and a bonding area between the first bond 61 and the first conductor 21 and a bonding area between the second bond 62 and the second conductor 22 can be increased. Accordingly, the light emitting device 1a can reduce thermal resistance between the ultraviolet light emitting element 3 and the mounting substrate 2a. Additionally, in the light emitting device 1a, the thickness of the second bond 62 can be controlled by use of the protrusion structure 36. Accuracy of the thickness and size of the second bond 62 can be improved and this can lead to decreases in thermal resistance and individual differences in thermal resistance. The phrase "the thickness of the second bond 62 can be controlled by use of the protrusion structure 36" means that the thickness of the second bond 62 can be decided based on a protrusion amount H1 (see FIG. 6) of the protrusion structure 36 in the thickness direction of the ultraviolet light emitting element 3. Therefore, according to the light emitting device 1a, differences between thermal resistances of individual products can be reduced. Consequently, the light emitting device 1a can improve heat radiation performance and reliability. The expression "shape of the protrusion structure 36 in a plan view" means a shape of the protrusion structure 36 when viewed in the thickness direction of the protrusion structure 36 extending along the thickness direction of the ultraviolet light emitting element 3.

In the ultraviolet light emitting element 3, the protrusion structure 36 extends along the outer periphery of the second electrode 32, and protrudes from the front surface 351 of the second conductivity-type semiconductor layer 35.

In the ultraviolet light emitting element 3, the second electrode 32 may be preferably larger than the first electrode 31 and the protrusion structure 36 may preferably extend an entire length of the outer periphery of the second electrode 32. Thereby, it is possible to more suppress formation of a short circuit between the second electrode 32 and the first electrode 31 due to AuSn for forming the second bond 62 in manufacturing the light emitting device 1a. Additionally, according to the light emitting device 1a, reproducibility of the shape of the second bond 62 can be improved in mounting the ultraviolet light emitting element 3 to the mounting substrate 2a, and thereby individual differences in thermal resistance can be reduced. Further, according to the light emitting device 1a, the thickness of the second bond 62 can be controlled by use of the protrusion structure 36 irrespective of the thickness of the first bond 61. Hence, the light emitting device 1a can improve accuracy of the thickness and size of the second bond 62 bonding the second electrode 32 and the second conductor 22 which give large heat radiation areas. Consequently, the light emitting device 1a can decrease thermal resistance and individual differences in thermal resistance.

The protrusion structure 36 may be preferably formed to extend along the outer periphery of the second electrode 32 and have a constant width W1 (see FIG. 6). By doing so, in the light emitting device 1a, the contact area between the second electrode 32 and the second conductivity-type semiconductor layer 35 can be enlarged, as well as formation of a short circuit between the second electrode 32 and the first electrode 31 due to solder can be suppressed. The width W1 of the protrusion structure 36 may be preferably in a range of, for example, about 5 μm to 10 μm.

As to the ultraviolet light emitting element 3, the second electrode 32 may be preferably formed to cover an almost whole of the front surface 351 of the second conductivity-type semiconductor layer 35. The expression "almost whole of the front surface 351 of the second conductivity-type semiconductor layer 35" may not always mean the entire front surface 351. For example, in a supposed case where the ultraviolet light emitting element 3 includes an insulating film 38 described below and an outer peripheral part of the front surface 351 of the second conductivity-type semiconductor layer 35 is covered with the insulating film 38, the expression "almost whole of the front surface 351 of the second conductivity-type semiconductor layer 35" may mean part of the front surface 351 of the second conductivity-type semiconductor layer 35 which is not covered with the insulating film 38. In summary, in the ultraviolet light emitting element 3, the second electrode 32 may be preferably formed to cover the front surface 351 of the second conductivity-type semiconductor layer 35 in a planar manner. Thereby, the light emitting device 1a can have heat radiation performance improved.

In the mounting substrate 2a, the first conductor 21 and the second conductor 22 may preferably have thicknesses greater than an interval between the second electrode 32 and the second conductor 22. The expression "interval between the second electrode 32 and the second conductor 22" may mean an interval between a center of the front surface 321 (see FIG. 6) of the second electrode 32 and the front surface 212 of the second conductor 22. The interval between the second electrode 32 and the second conductor 22 can be decided based on the protrusion amount H1 of the protrusion structure 36. In other words, the interval between the second electrode 32 and the second conductor 22 is approximately equal to the protrusion amount H1 (see FIG. 6) of the protrusion structure 36.

According to the light emitting device 1a, if some of melted AuSn protrudes from the space 9 in manufacturing, a flow rate of such protruded AuSn can be reduced by the groove 203. Additionally, in the light emitting device 1a, a side surface of the second conductor 22 can act as a solder guide which guides protruded AuSn toward the front surface 201 of the support 20a in manufacturing. Consequently, the light emitting device 1a can suppress formation of a short circuit between the second electrode 32 and the first electrode 31 due to protruded AuSn from the space 9. Note that, the front surface 201 of the support 20a may preferably have higher solderability than the side surfaces of the first conductor 21 and the second conductor 22.

The ultraviolet light emitting element 3 may preferably include the insulating film 38. The insulating film 38 may be preferably formed on the front surface 351 of the second conductivity-type semiconductor layer 35 to surround a contact region of the second electrode 32 with the second conductivity-type semiconductor layer 35. Additionally, in the ultraviolet light emitting element 3, the second electrode 32 may be preferably formed to extend over the front surface 351 of the second conductivity-type semiconductor layer 35 and a front surface of the insulating film 38, and an outer peripheral part of the second electrode 32 which protrudes away from the second conductivity-type semiconductor layer 35 more than a central part thereof, may preferably function as the protrusion structure 36. Accordingly, the light emitting device 1a can have the bonding area between the second electrode 32 and the second conductor 22 increased, and thereby improving heat radiation performance and reducing contact resistance.

Material of the insulating film 38 is $SiO_2$. Therefore, the insulating film 38 is a silicon oxide film. It is sufficient that the insulating film 38 be an electrically insulating film. For this reason, it is sufficient that the material of the insulating film 38 be selected from materials with electrically insulating properties. Thus, examples of the material of the insulating film 38 may include $Si_3N_4$, $Al_2O_3$, $TiO_2$, $Ta_2O_5$, $ZrO_2$, $Y_2O_3$, $CeO_2$, and $Nb_2O_5$ in addition to $SiO_2$. The insulating film 38 may preferably also serve as a passivation film for protecting functionality of the semiconductor multilayered film 39. In this case, the insulating film 38 may be preferably made of $SiO_2$ and $Si_3N_4$. Thus, the light emitting device 1a can have reliability improved. For example, the insulating film 38 may have a thickness of 1 μm. The insulating film 38 may be made of, for example, CVD (chemical vapor deposition), evaporation, and sputtering. The insulating film 38 may be a single layer film or a multilayered film. The multilayered film serving as the insulating film 38 may be a dielectric multilayered film for reflecting light produced by the semiconductor multilayered film 39.

The insulating film 38 may be preferably formed to extend over the front surface 371 of the mesa structure 37, the side surface 372 of the mesa structure 37, and the front surface 331 of the first conductivity-type semiconductor layer 33. The front surface 371 of the mesa structure 37 is formed of the front surface 351 of the second conductivity-type semiconductor layer 35. Part of the insulating film 38 formed on the front surface 331 of the first conductivity-type semiconductor layer 33 may be preferably formed to surround the contact region of the first electrode 31 with the first conductivity-type semiconductor layer 33.

The first electrode 31 may preferably include a first ohmic electrode layer 31A and a first pad electrode layer 31B.

The first ohmic electrode layer 31A is formed on the front surface 331 of the first conductivity-type semiconductor layer 33 to achieve ohmic contact with the first conductivity-type semiconductor layer 33. The first pad electrode layer 31B is formed to cover the first ohmic electrode layer 31A to be bonded to the mounting substrate 2a with the first bond 61. The first ohmic electrode layer 31A may be formed by, for example, forming a first laminated film of a first Al film, a first Ni film, a second Al film, a second Ni film, and an Au film, on the front surface 331 of the first conductivity-type semiconductor layer 33 and subsequently annealing and slowly cooling the same. Thereby, the first ohmic electrode layer 31A has a solidification structure containing Ni and Al as its main components. The solidification structure may mean a crystalline structure resulting from transformation of molten metal. The solidification structure containing Ni and Al as its main components may include Au and N as impurities, for example. In one example of the laminated film, each of the first Al film, the first Ni film, the second Al film, the second Ni film and the Au film has a thickness in a range of 10 to 200 nm. The first ohmic electrode layer 31A may not contain Ni and Al as its main components, but may be made of, for example, other material containing Ti and/or the like.

For example, the first pad electrode layer 31B may be formed of a laminated film of a Ti film and an Au film. The first pad electrode layer 31B may be formed of a different laminated film, providing that an Au film is on an uppermost surface side. In other words, the first electrode 31 may preferably include the first pad electrode layer 31B having an uppermost surface being a surface of an Au film. The first pad electrode layer 31B may be made by, for example, evaporation. The first pad electrode layer 31B may have a single layer structure of an Au film, or a laminated film of a Ti film and an Au film, for example. Alternatively, in the ultraviolet light emitting element 3, for example, the first electrode 31 may be entirely occupied by the first ohmic electrode layer 31A, or the first electrode 31 may include additional one or more electrode layers between the first ohmic electrode layer 31A and the first pad electrode layer 31B.

The second electrode 32 may preferably include a second ohmic electrode layer 32A and a second pad electrode layer 32B.

The second ohmic electrode layer 32A is formed on the front surface 351 of the second conductivity-type semiconductor layer 35 to achieve ohmic contact with the second conductivity-type semiconductor layer 35. The second pad electrode layer 32B is formed to cover the second ohmic electrode layer 32A to be bonded to the mounting substrate 2a with the second bond 62. The second ohmic electrode layer 32A may be formed by, for example, forming a second laminated film of an Ni film and an Au film on the front surface 351 of the second conductivity-type semiconductor layer 35 and subsequently annealing the same.

For example, the second pad electrode layer 32B may be formed of a laminated film of a Ti film and an Au film. The second pad electrode layer 32B may be formed of a different laminated film, providing that an Au film is on an uppermost surface side. In other words, the second electrode 32 may preferably include the second pad electrode layer 32B having an uppermost surface being a surface of an Au film. The second pad electrode layer 32B may be made by, for example, evaporation. The second pad electrode layer 32B may have a single layer structure of an Au film, or a laminated film of a Ti film and an Au film, for example. Alternatively, in the ultraviolet light emitting element 3, for example, the second electrode 32 may be entirely occupied by the second ohmic electrode layer 32A, or the second electrode 32 may include additional one or more electrode layers between the second ohmic electrode layer 32A and the second pad electrode layer 32B.

The second pad electrode layer 32B may be preferably formed to extend over the front surface of the second ohmic electrode layer 32A and the front surface of the insulating film 38. Additionally, in the light emitting device 1a, the outer peripheral part of the second electrode 32 which protrudes away from the second conductivity-type semiconductor layer 35 more than the central part thereof, may preferably function as the protrusion structure 36. Accordingly, the light emitting device 1a can have the bonding area between the ultraviolet light emitting element 3 and the mounting substrate 2a increased, and thereby reducing thermal resistance and heat produced in the semiconductor multilayered film 39 of the ultraviolet light emitting element 3 can be easily transferred to the mounting substrate 2a through the protrusion structure 36. Consequently, the light emitting device 1a can improve heat radiation performance.

Figure 9:
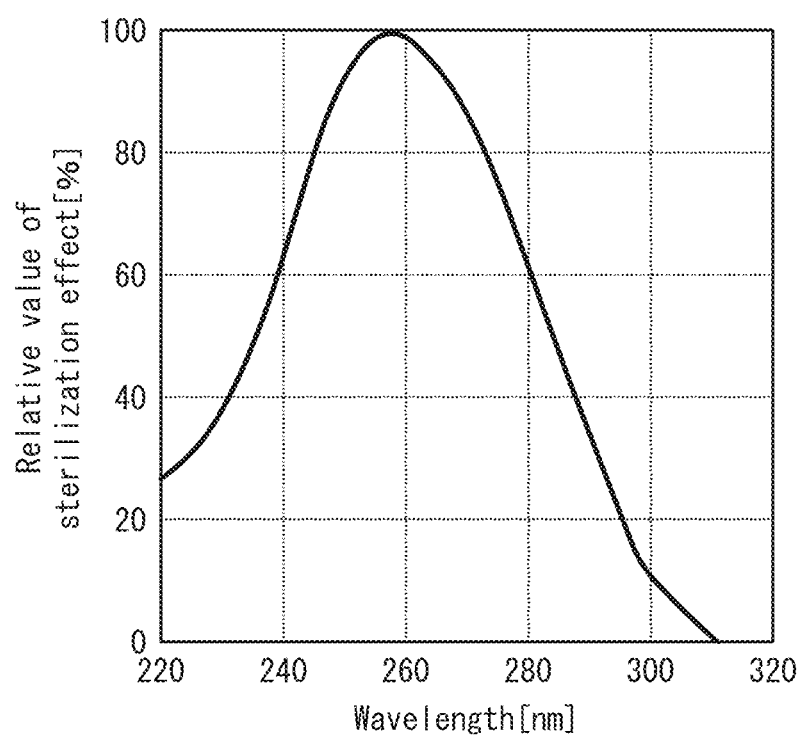
FIG. 9 shows the sterilization effect curve.

When the light emitting device 1a is applied in fields of application of sterilization, medical procedure, high-speed processing of environmental pollutant and the like, the ultraviolet light emitting element 3 may preferably have an emission peak wavelength in a wavelength range of 210 nm to 280 nm. In summary, the ultraviolet light emitting element 3 may be preferably configured to emit ultraviolet light having an emission peak wavelength within a wavelength range of UV-C. By doing so, the light emitting device 1a can be suitable for sterilization, for example. The term "wavelength range of UV-C" means a range of 100 nm to 280 nm according to classification of wavelength of ultraviolet light designated by the International Commission on Illumination (CIE), for example. In a case of applying the light emitting device 1a in the fields of sterilization, the ultraviolet light emitting element 3 may more preferably have an emission peak wavelength in a wavelength range of 240 nm to 280 nm. According to JIS Z8811-1968, the term "ultra-violet rays for sterilization" is defined as ultraviolet light within a wavelength range indicated by a sterilization effect curve showing a maximum sterilization effect near a wavelength of 260 nm. FIG. 9 is a diagram of a rewrite of the aforementioned sterilization effect curve. FIG. 9 shows a horizontal axis denoting a wavelength and a vertical axis denoting a relative value of sterilization effect. The "sterilization effect curve" is a curve based on data given by Reference Document 1 (M. Luckiesh: Applications of Germicidal, Erythemal, and Infrared Energy (1946), p. 115). Referring to the sterilization effect curve, it is considered that when a wavelength of ultraviolet light emitted from the ultraviolet light emitting element 3 of the light emitting device 1a falls within a range of 240 nm to 280 nm the relative value of sterilization effect becomes equal to or more than 60% and thus relatively high sterilization effect can be obtained. In one example of the ultraviolet light emitting element 3, the emission peak wavelength is set to 265 nm.

The spacer 4 has a height greater than the thickness of the ultraviolet light emitting element 3. Therefore, the light emitting device 1a can suppress the ultraviolet light emitting element 3 from being in contact with the cover 5. The spacer 4 may preferably have a rectangular or square outer shape in a plan view. The spacer 4 may be preferably smaller than the mounting substrate 2a in a plan view. In more detail, the outer shape of the spacer 4 in a plan view may be preferably smaller than an outer shape of the mounting substrate 2a in a plan view. Additionally, an outer limit of the spacer 4 in a plan view may be preferably more inward from an outer limit of the mounting substrate 2a in a plan view. By doing so, in the light emitting device 1a, the spacer 4 can be suppressed from protruding outward from the mounting substrate 2a in manufacture.

The through hole 41 is formed in the spacer body 40. The through hole 41 may preferably have an opening area which gradually increases with an increase in a distance from the mounting substrate 2a. In summary, the opening area of the through hole 41 of the spacer 4 gradually increases with an increase in the distance from the mounting substrate 2a in the thickness direction of the mounting substrate 2a. Thus, in the light emitting device 1a, the spacer 4 can be made to serve as a reflector for reflecting some of ultraviolet light emitted laterally from the ultraviolet light emitting element 3 toward the cover 5. As described above, the spacer body 40 is made of Si. In a case of an incident angle of 5° to 55°, an Si substrate shows a reflectance greater than 70% for ultraviolet light with a wavelength ranging from 260 nm to 280 nm. Hence, the spacer 4 can act as a reflector with a relatively high reflectance without forming reflective films such as Al films on an internal side surface of the through hole 41 (the internal side surface 665 of the recess 663). For this reason, the light emitting device 1a can reduce production cost and increase light output.

The through hole 41 of the spacer 4 may preferably be a tapered hole in the form of a truncated pyramid. In more detail, the spacer body 40 may be preferably formed of a single-crystalline Si substrate 400 having a front surface 401 being a (100)-plane. In a preferable aspect of the spacer 4, the internal side surface of the through hole 41 is a surface parallel to a {111}-plane. In summary, in a preferable aspect of the spacer 4, a crystal plane serving as the internal side surface of the through hole 41 is a {111}-plane. In this case, in the light emitting device 1a, an angle θ between a rear surface 402 of the single-crystalline Si substrate 400 and the internal side surface of the through hole 41 can be made to be approximately 55° (theoretically, 54.7°). The aforementioned through hole 41 can be easily formed by etching with an alkaline solution. In summary, the through hole 41 can be formed by crystalline anisotropy etching. Examples of the alkaline solution may include a TMAH (tetramethylammonium hydroxide) aqueous solution. Examples of the alkaline solution may include a TMAH solution heated at about 85° C., a KOH aqueous solution, and ethylenediamine pyrocatechol, in addition to a TMAH aqueous solution. Etching in forming the through hole 41 may be conducted by two steps. For example, in forming the through hole 41, etching with a KOH aqueous solution may be conducted from the front surface 401 of the single-crystalline Si substrate 400 until reaching an almost middle of the single-crystalline Si substrate 400 in the thickness direction, and then etching with a TMAH aqueous solution may be conducted until reaching the rear surface 402 of the single-crystalline Si substrate 400. The facing surface 42 of the spacer body 40 facing the mounting substrate 2a is formed of the rear surface 402 of the single-crystalline Si substrate 400. The spacer body 40 includes a silicon oxide film 44 between the facing surface 42 of the spacer body 40 facing the mounting substrate 2a, and the second bonding metal layer 43. The second bonding metal layer 43 may be preferably formed of, for example, a laminated film of a foundation film 431 and an Au film 432. Examples of material of the foundation film 431 may include Al.

In the spacer 4, the internal side surface of the through hole 41 may be formed of a surface of an silicon oxide film formed parallel to the {111}-plane. In this case, in the light emitting device 1a, the {111}-plane which is a crystal plane forming the internal side surface of the through hole 41 is covered with the silicon oxide film, and therefore a production yield ratio can be increased and change in ultraviolet light output due to deterioration can be suppressed. The silicon oxide film may be formed of, for example, native oxide or thermal oxide.

In a preferable aspect of the light emitting device 1a, glass forming the cover 5 contains an alkaline component, and the spacer 4 and the cover 5 are directly bonded to each other. In the light emitting device 1a, when glass forming the cover 5 contains an alkaline component, the cover 5 and the spacer 4 are allowed to be directly bonded to each other by anodic bonding. This may result in decreasing production cost. Examples of the alkaline component may include Na, K, $Na_3O$, and $K_2O$. The expression "the cover 5 and the spacer 4 are directly bonded to each" means that the cover 5 and the spacer 4 are bonded to each other without using bonding material or the like.

The glass for forming the cover 5 may preferably have transmissivity equal to or more than 70% for ultraviolet light emitted from the ultraviolet light emitting element 3 and more preferably have transmissivity equal to or more than 80% for the same. In a case where the ultraviolet light emitting element 3 emits ultraviolet light with an emission peak wave length in a wavelength range of UV-C, examples of the glass for forming the cover 5 may include borosilicate glass. Such borosilicate glass contains an alkaline component. Examples of such borosilicate glass may be a product named as "8347" available from SCHOTT AG and a product named as "8337B" available from SCHOTT AG, which can achieve transmissivity equal to or more than 80% for ultraviolet light with a wavelength of 265 nm.

With regard to the light emitting device 1a, a difference between coefficients in linear thermal expansion of the cover 5 and the spacer body 40 may be preferably as small as possible, in a point of view of reducing stress on the cover 5 or the like due to such a difference between coefficients in linear thermal expansion of the cover 5 and the spacer body 40.

The cover 5 may be preferably smaller than the mounting substrate 2a in a plan view. In more detail, the cover 5 may preferably have the same size as the spacer 4 in a plan view. In summary, the outer shape of the cover 5 in a plan view may be the same as the outer shape of the spacer 4 in a plan view. For this reason, the outer shape of the cover 5 in a plan view may be rectangular or square. In this case, in the method for manufacturing the light emitting device 1a, forming the cap 6a can include, for example, bonding a first wafer provided with the multiple spacers 4 to and a second wafer serving as a base for the multiple covers 5 at the wafer-level, and dividing them into multiple caps 6a. The cap 6a may be preferably smaller than the mounting substrate 2a in a plan view. In this case, in the light emitting device 1a, it is possible to suppress the cap 6a from protruding outside from the mounting substrate 2a, even if displacement of the cap 6a occurs in manufacturing.

The cover 5 may be limited to having a flat plate shape, but may have a shape formed integrally with a lens, for example. In summary, in the light emitting device 1a, part of a whole of the cover 5 may serve as a lens.

In the light emitting device 1a, a space 8 enclosed by the mounting substrate 2a, the spacer 4, and the cover 5 may be preferably filled with an inactive gas atmosphere. In other words, in the light emitting device 1a, a space enclosed by the mounting substrate 2a and the cap 6a may be preferably filled with an inactive gas atmosphere. Thus, in the light emitting device 1a, oxidation of the ultraviolet light emitting element 3, the first conductor 21 and the second conductor 22 can be suppressed, and thereby reliability can be more improved.

The inactive gas atmosphere may preferably be an $N_2$ gas atmosphere. The purity of inactive gas of the inactive gas atmosphere may be preferably as high as possible but may be not required to 100%. For example, when the inactive gas is $N_2$ gas, the inactive gas atmosphere may avoidably contain about 100 to 200 ppm of $O_2$. Examples of the inactive gas may include Ar gas and mixed gas of $N_2$ gas and Ar gas, in addition to $N_2$ gas.

The light emitting device 1a may preferably include a first barrier layer 81 formed between the first conductor 21 and the first bond 61, a second barrier layer 82 formed between the second conductor 22 and the second bond 62, and a third barrier layer 83 formed between the first bonding metal layer 23 and the third bond 63. The first barrier layer 81, the second barrier layer 82, and the third barrier layer 83 may be preferably made of the same material and have the same thickness. Thus, in manufacturing the light emitting device 1a, it is possible to suppress diffusion of metal between the first conductor 21 and the first bond 61, between the second conductor 22 and the second bond 62, and between the first bonding metal layer 23 and the third bond 63. Further, in manufacturing the light emitting device 1a, the first barrier layer 81, the second barrier layer 82, and the third barrier layer 83 can have substantially the same barrier properties. Therefore, in manufacturing the light emitting device 1a, it is possible to improve bondability of the ultraviolet light emitting element 3 and the cap 6a to the mounting substrate 2a.

In the light emitting device 1a, the first electrode 31 may preferably include the first pad electrode layer 31B including an Au film having a surface serving as an uppermost surface of the first pad electrode layer 31B, and the second electrode 32 may preferably include the second pad electrode layer 32B including an Au film having a surface serving as an uppermost surface of the second pad electrode layer 32B, and the second bonding metal layer 43 may preferably be a laminated film of a foundation film and an Au film. Therefore, in manufacturing the light emitting device 1a, it is possible to improve bondability of the ultraviolet light emitting element 3 and the cap 6a to the mounting substrate 2a.

The following description referring to FIG. 7A to FIG. 7E and FIG. 8 is made to the method for manufacturing the light emitting device 1a.

The method for manufacturing the light emitting device 1a may include, for example, the following first process, second process, third process and fourth process which are performed sequentially.

The first process includes forming the spacer 4 by forming a laminated structure of the silicon oxide film 44 and the second bonding metal layer 43 on the rear surface 402 of the single-crystalline Si substrate 400, and subsequently forming the through hole 41 by etching a region of the single-crystalline Si substrate 400 reserved for the through hole 41 (see FIG. 7A). The silicon oxide film 44 may be formed by, thin film formation techniques, photolithography techniques, or etching techniques. Further, the second bonding metal layer 43 may be formed by, thin film formation techniques, photolithography techniques, and etching techniques. Forming the through hole 41 may include forming appropriate etching masks individually facing the front surface 401 and the rear surface 402 of the single-crystalline Si substrate 400, and subsequently etching the single-crystalline Si substrate 400 from the front surface 401 with a TMAH aqueous solution.

The second process includes forming the cap 6a by bonding the spacer 4 and the cover 5 to each other (FIG. 7B). In more detail, the cap 6a is formed by directly bonding the spacer 4 and the cover 5 by anodic bonding. In anodic bonding, for example, under a vacuum atmosphere, a periphery of the through hole 41 in the spacer body 40 and a periphery of the cover 5 are in direct contact with each other, and a predetermined DC voltage is applied across a laminate of the spacer 4 and the cover 5 so that the spacer 4 has a higher potential and the cover 5 has a lower potential. The predetermined DC voltage may be, for example, 600 V. The anodic bonding may include, for example, heating the laminate of the spacer 4 and the cover 5 at a predetermined bonding temperature and applying the predetermined DC voltage across the laminate for predetermined time while heating it, and lowering the temperature of the laminate. The bonding temperature may be, for example, 400° C.

The aforementioned first process and second process may be preferably performed at the wafer-level. In more detail, in the first process, it is preferably that the multiple spacers 4 be formed on a first wafer serving as a base for the single-crystalline Si substrate 400. In the second process, forming the cap 6a may include, for example, bonding the first wafer provided with the multiple spacers 4 are formed, to a second wafer serving as a base for the multiple covers 5 at the wafer-level, and dividing them into the multiple caps 6a.

The third process includes forming, on the mounting substrate 2a, a first AuSn layer 71, a second AuSn layer 72 and a third AuSn layer 73 serving as bases for the first bond 61, the second bond 62, and the third bond 63, respectively (FIG. 7C). In more detail, the third process includes forming the first AuSn layer 71, the second AuSn layer 72, and the third AuSn layer 73, so as to face the front surface 211 of the first conductor 21, the front surface 212 of the second conductor 22, and the front surface 231 of the first bonding metal layer 23, of the mounting substrate 2a, respectively. The first AuSn layer 71, the second AuSn layer 72, and the third AuSn layer 73 may be made, for example, by evaporation, plating, or the like.

In the third process, the first AuSn layer 71, the second AuSn layer 72 and the third AuSn layer 73 are set to have the same thickness. The area of a front surface of the first AuSn layer 71 is set to be smaller than the area of a front surface 311 (see FIG. 6) of the first electrode 31. Further, the area of a front surface of the second AuSn layer 72 is set to be smaller than the area of the front surface 321 (see FIG. 6) of the second electrode 32. Furthermore, the area of a front surface of the third AuSn layer 73 is set to be smaller than the area of the front surface 231 (see FIG. 7C and FIG. 8) of the first bonding metal layer 23.

The thicknesses of the first AuSn layer 71 and the second AuSn layer 72 are set to be larger, by a predetermined thickness (a), than a sum (H1+H2) of the protrusion amount H1 (see FIG. 6) of the protrusion structure 36 of the ultraviolet light emitting element 3 and a value H2 (see FIG. 6) of the level difference between the second electrode 32 and the first electrode 31 in the thickness direction of the ultraviolet light emitting element 3. In short, the thicknesses of the first AuSn layer 71 and the second AuSn layer 72 are equal to H1+H2+α. For example, when H1 is 1 μm and H2 is 1 μm, the thicknesses of the first AuSn layer 71 and the second AuSn layer 72 are set to be about 3 μm. In this case, "α" is 1 μm. These numerical values are mere examples, and thus can be appropriately changed based on structure and the like of the ultraviolet light emitting element 3. The first AuSn layer 71 and the second AuSn layer 72 may be preferably formed on centers of regions of the mounting substrate 2a to face the first electrode 31 and the second electrode 32, respectively. The second AuSn layer 72 is placed on the front surface 212 of the second conductor 22 so as to be inside a vertical projection region of the protrusion structure 36 and be separate from an outer limit of the vertical projection region. The vertical projection region of the protrusion structure 36 means a projection region in the thickness direction of the protrusion structure 36. In other words, the vertical projection region of the protrusion structure 36 means a vertical projection region with a projection direction along the thickness direction of the protrusion structure 36. In other words, the vertical projection region of the protrusion structure 36 means a vertical projection region of the protrusion structure 36 on a plane perpendicular to the thickness direction of the protrusion structure 36.

AuSn for forming the first AuSn layer 71 and the second AuSn layer 72 may preferably have a composition ratio of Au smaller than that of eutectic composition (70 at % Au, 30 at % Sn), and have composition (for example, 60 at % Au, 40 at % Sn) allowing melting at a temperature equal to or higher than 300° C. and lower than 400° C., for example.

The third process may preferably include forming the first barrier layer 81, the second barrier layer 82, and the third barrier layer 83 between the first conductor 21, the second conductor 22, and the first bonding metal layer 23, and the first AuSn layer 71, the second AuSn layer 72, and the third AuSn layer 73, respectively. The first barrier layer 81, the second barrier layer 82, and the third barrier layer 83 serve as diffusion barrier layers for variations of composition of AuSn due to diffusion of metal (for example, Sn) between the first AuSn layer 71, the second AuSn layer 72, and the third AuSn layer 73 and the first conductor 21, the second conductor 22, and the first bonding metal layer 23, respectively. Examples of materials of the first barrier layer 81, the second barrier layer 82, and the third barrier layer 83 may include Pt as well as Pd. In the third process, the first barrier layer 81, the second barrier layer 82 and the third barrier layer 83 are set to have the same thickness. The thicknesses of the first barrier layer 81, the second barrier layer 82, and the third barrier layer 83 may be preferably about 0.2 μm. The first barrier layer 81, the second barrier layer 82, and the third barrier layer 83 can be made by, for example, evaporation, plating, or the like.

Further, the third process may preferably include forming a first Au layer 91, a second Au layer 92, and the third Au layer 93 on the first AuSn layer 71, the second AuSn layer 72, and the third AuSn layer 73, respectively. The first Au layer 91, the second Au layer 92, and the third Au layer 93 are provided for suppressing oxidation of Sn in the first AuSn layer 71, the second AuSn layer 72, and the third AuSn layer 73, respectively. Thicknesses of the first Au layer 91, the second Au layer 92, and the third Au layer 93 may be preferably thinner sufficiently than the thicknesses of the first AuSn layer 71, the second AuSn layer 72, and the third AuSn layer 73 and may preferably be equal to or smaller than, for example, 0.15 μm. The thicknesses of the first Au layer 91, the second Au layer 92, and the third Au layer 93 are required to allow bonding the first conductor 21, the second conductor 22, and the first bonding metal layer 23 to the first electrode 31, the second electrode 32, and the second bonding metal layer 43 respectively due to thermal diffusion of Au into the first AuSn layer 71, the second AuSn layer 72, and the third AuSn layer 73 when the first AuSn layer 71, the second AuSn layer 72, and the third AuSn layer 73 are melted. The thicknesses of the first Au layer 91, the second Au layer 92, and the third Au layer 93 may be preferably in a range of, for example, about 0.05 μm to 0.15 μm. The first Au layer 91, the second Au layer 92, and the third Au layer 93 may be made by, for example, evaporation, plating, or the like. Hereinafter, a laminated film of the first barrier layer 81, the first AuSn layer 71, and the first Au layer 91 is referred to as a first bonding layer 101, and a laminated film of the second barrier layer 82, the second AuSn layer 72, and the second Au layer 92 is referred to as a second bonding layer 102. Further, hereinafter, a laminated film of the third barrier layer 83, the third AuSn layer 73, and the third Au layer 93 is referred to as a third bonding layer 103. The first bonding layer 101 is required to include at least the first AuSn layer 71, and therefore may be a laminated film or a single layer film. The second bonding layer 102 is required to include at least the second AuSn layer 72, and therefore may be a laminated film or a single layer film. The third bonding layer 103 is required to include at least the third AuSn layer 73, and therefore may be a laminated film or a single layer film.

The fourth process includes first and second steps for mounting the ultraviolet light emitting element 3 on the mounting substrate 2a (FIG. 7D), and subsequent third and fourth steps for bonding the cap 6a to the mounting substrate 2a (FIG. 7E). Thereby, in the method for manufacturing of the light emitting device 1a, the light emitting device 1a can be obtained. In the fourth process, bonding apparatus is used. In more detail, in the fourth process, the first step, the second step, the third step, and the fourth step are performed sequentially with single bonding apparatus. When the cap 6a is considered a die different in size from the ultraviolet light emitting element 3, the bonding apparatus can be considered die bonding apparatus, or flip-chip bonding apparatus.

The bonding apparatus includes, for example, a first suction holder, a second suction holder, a stage, a first heater, a second heater, and a bonding room. The first suction holder is a first collet for holding the ultraviolet light emitting element 3 by suction. The second suction holder is a second collet for holding the cap 6a by suction. The stage bears the mounting substrate 2a. The first heater is provided to the stage for heating the mounting substrate 2a. The second heater is mounted to a holder for holding one selected from the first suction holder and the second suction holder, for heating a die. In the bonding apparatus, instead of the holder not including the second heater, each of the first collet and the second collet may include the second heater. The above die means the ultraviolet light emitting element 3 held by the first suction holder by suction, or the cap 6a held by the second suction holder by suction. The bonding room accommodates the stage, and serves as a treatment room for performing bonding the ultraviolet light emitting element 3 and the cap 6a to the mounting substrate 2a on the stage. An atmosphere inside the bonding room may be appropriately controlled in accordance with a predetermined atmosphere inside the package 7a. In the method for manufacturing of the light emitting device 1a of the present embodiment, the atmosphere inside the bonding room may be, for example, an $N_2$ gas atmosphere. In the bonding apparatus, the bonding room has open entrance, and objects such as the mounting substrate 2a, the first suction holder, and the second suction holder are put in or taken out from the bonding room through the entrance while an $N_2$ gas is supplied from outside to the bonding room through the entrance. Hence, this bonding apparatus can have production cost decreased, compared with configuration where bonding is performed inside a vacuum chamber.

Figure 8:
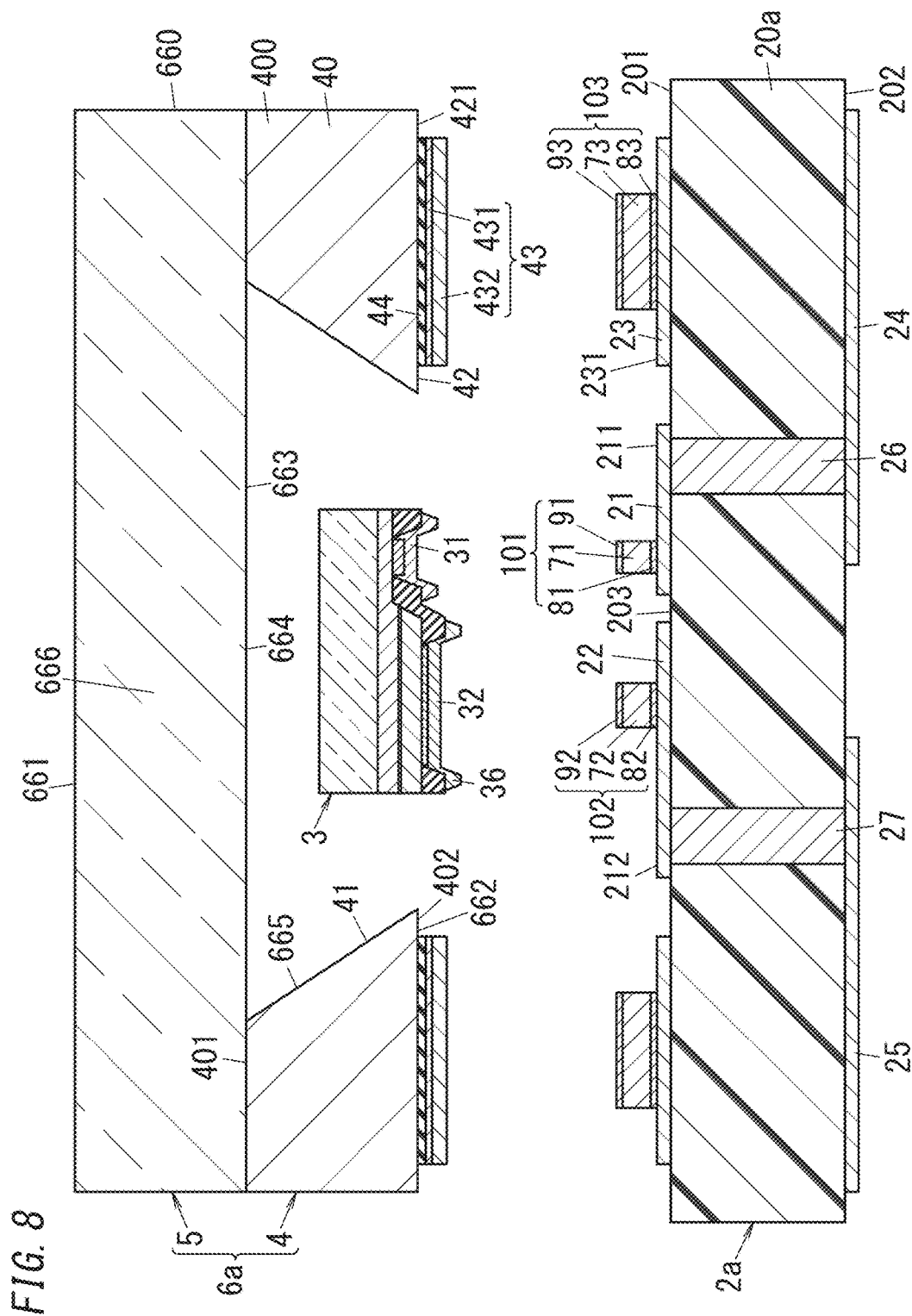
FIG. 8 is a primary section for illustration of the method for manufacturing the light emitting device of Embodiment 1.

As shown in FIG. 8, the first step including placing the ultraviolet light emitting element 3 and the mounting substrate 2a to face each other. The phrase "placing the ultraviolet light emitting element 3 and the mounting substrate 2a to face each other" means placing the ultraviolet light emitting element 3 and the mounting substrate 2a to face each other so that the first electrode 31 and the second electrode 32 of the ultraviolet light emitting element 3 face the first conductor 21 and the second conductor 22 of the mounting substrate 2a, respectively.

In the first step, the first electrode 31 and the second electrode 32 of the ultraviolet light emitting element 3 held by the first suction holder by suction is made to face the first conductor 21 and the second conductor 22 of the mounting substrate 2a, respectively. In more detail, in the first step, the first electrode 31 is made to face the first AuSn layer 71 on the front surface 211 of the first conductor 21, and the second electrode 32 is made to face the second AuSn layer 72 on the front surface 212 of the second conductor 22.

The second step includes bonding the first electrode 31 and the second electrode 32 of the ultraviolet light emitting element 3 to the first conductor 21 and the second conductor 22 of the mounting substrate 2a with the first AuSn layer 71 and the second AuSn layer 72, respectively. The first bond 61 may not be limited to being made of AuSn only. The first bond 61 may include part made of AuSn as well as the first barrier layer 81. The second bond 62 may not be limited to being made of AuSn only. The second bond 62 may include part made of AuSn as well as the second barrier layer 82.

The aforementioned second step includes melting the first AuSn layer 71 and the second AuSn layer 72 while performing appropriate heating and pressing under a condition where the first electrode 31 and the second electrode 32 of the ultraviolet light emitting element 3 are placed on the first bonding layer 101 and the second bonding layer 102 of the mounting substrate 2a to be in contact therewith, respectively. When the first AuSn layer 71 is melted, Au is diffused in molten AuSn from the first Au layer 91, and this may result in an increase in the Au composition ratio of the molten AuSn. Further, when the second AuSn layer 72 is melted, Au is diffused in molten AuSn from the second Au layer 92, and this may result in an increase in the Au composition ratio of the molten AuSn.

In the second step, the ultraviolet light emitting element 3 is pressed so that the protrusion structure 36 becomes into contact with the second conductor 22 after the first AuSn layer 71 and the second AuSn layer 72 are melted. Thereby, molten AuSn is pressed down to spread laterally, and thus the space 9 is filled with the molten AuSn. Thereafter, the molten AuSn is solidified by cooling.

The second step may include heating the mounting substrate 2a with the first heater only, but may additionally include heating the ultraviolet light emitting element 3 with the second heater. In consideration of bondability between the mounting substrate 2a and the ultraviolet light emitting element 3, the second step may preferably include heating with the first heater and the second heater. Further, the second step includes performing pressing by applying appropriate pressure. The pressure may be preferably adjusted in a range of 0.1 to 1 kg/cm$^2$ per one ultraviolet light emitting element 3, for example. A length of time for applying pressure may be preferably adjusted in a range of 0.1 to 1 second, for example. The second step may be preferably conducted under an $N_2$ gas atmosphere.

The first AuSn layer 71 and the second AuSn layer 72 may preferably have melting temperatures lower than a heatproof temperature of the ultraviolet light emitting element 3. The first AuSn layer 71 and the second AuSn layer 72 may be preferably made of, for example, AuSn having an Au composition ratio smaller than that of eutectic composition (70 at % Au, 30 at % Sn) and having composition (for example, 60 at % Au, 40 at % Sn) melting at a temperature equal to or higher than 300° C. and lower than 400° C.

Note that, a volume the second bonding layer 102 formed by the third process may be preferably set equal to a volume of the space 9 so as to prevent AuSn for forming the second bond 62 from protruding outside from the space 9.

In the second step of the fourth process, under a condition where the first AuSn layer 71 and the second AuSn layer 72 are melted, the ultraviolet light emitting element 3 and the mounting substrate 2a are bonded to each other by pressing down melted AuSn so as to bring the protrusion structure 36 of the ultraviolet light emitting element 3 into contact with the front surface 212 of the second conductor 22. Consequently, in the second step of the fourth process, it is possible to suppress incomplete bonding between the first electrode 31 and the first conductor 21.

According to the second step of the fourth process, the protrusion structure 36 is in contact with the second conductor 22, the first electrode 31 and the first conductor 21 are bonded with the first bond 61 made of AuSn, and the second electrode 32 and the second conductor 22 are bonded with the second bond 62 made of AuSn. Therefore, in the method for manufacturing the light emitting device 1a, the second bond 62 is formed to fill up the space 9 enclosed by the second electrode 32, the protrusion structure 36, and the second conductor 22. In the method for manufacturing the light emitting device 1a, molten AuSn of the second bonding layer 102 is pressed down to spread laterally, and however the protrusion structure 36 can stop a flow of molten AuSn along the front surface of the ultraviolet light emitting element 3. Therefore, in the method for manufacturing the light emitting device 1a, it is possible to suppress formation of a short circuit between the first electrode 31 and the second electrode 32 due to AuSn. Additionally, the method for manufacturing the light emitting device 1a can produce the light emitting device 1a capable of decreasing the thermal resistance between the ultraviolet light emitting element 3 and the mounting substrate 2a and reducing individual differences in the thermal resistance.

Note that, in the second step of the fourth process, pressure may be preferably applied so that an entire uppermost surface of the protrusion structure 36 is in contact with the front surface 212 of the second conductor 22. However, in the second step of the fourth process, in some cases it may be difficult to bring the entire uppermost surface of the protrusion structure 36 in contact with the front surface 212 of the second conductor 22 due to a difference between flatness of the uppermost surface of the protrusion structure 36 and flatness of the front surface 212 of the second conductor 22. In these cases, one part of the uppermost surface of the protrusion structure 36 is in contact with the front surface 212 of the second conductor 22, and there may be a thin AuSn layer made of AuSn intruding in manufacturing into a gap between the remaining part of the uppermost surface of the protrusion structure 36 and the front surface 212 of the second conductor 22. In summary, in the light emitting device 1a, the protrusion structure 36 may be in partial contact with the front surface 212 of the second conductor 22, providing that parallelism of the ultraviolet light emitting element 3 to the mounting substrate 2a falls within a desired range. In the second step of the fourth process, increasing the applied pressure can reduce influences due to a difference between flatness of the uppermost surface of the protrusion structure 36 and flatness of the front surface 212 of the second conductor 22, thereby increasing the contact area between the protrusion structure 36 and the second conductor 22. Further, in the second step of the fourth process, when the protrusion structure 36 is made of, for example, metal, increasing the applied pressure can change in shape of the protrusion structure 36 as if the protrusion structure 36 is compressed, thereby increasing the contact area between the protrusion structure 36 and the second conductor 22.

In the method for manufacturing the light emitting device 1a, the aforementioned third process may preferably include forming the first Au layer 91 and the second Au layer 92 on the first AuSn layer 71 and the second AuSn layer 72, respectively. By doing so, in the method for manufacturing the light emitting device 1a, it is possible to suppress oxidation of Sn in the first AuSn layer 71 and the second AuSn layer 72 before the fourth process, and thereby bondability between the ultraviolet light emitting element 3 and the mounting substrate 2a can be improved. The bondability can be evaluated by die shear strength, for example. The die shear strength is measured as strength necessary for peeling the ultraviolet light emitting element 3 bonded to the mounting substrate 2a by pressing it in a direction parallel to a bonding plane therebetween. The die shear strength may be measured with, for example, apparatus such as a die shear tester.

The third step of the fourth process including placing the second bonding metal layer 43 of the cap 6a held by the second suction holder by suction to face the first bonding metal layer 23 of the mounting substrate 2a. In more detail, in the third step, the second bonding metal layer 43 is made to face the third AuSn layer 73 on the front surface 231 of the first bonding metal layer 23.

The fourth step further includes bonding the second bonding metal layer 43 of the cap 6a to the first bonding metal layer 23 of the mounting substrate 2a with the third AuSn layer 73. The third bond 63 may not be limited to being made of AuSn only. The third bond 63 may include part made of AuSn as well as the third barrier layer 83.

The aforementioned fourth step includes melting the third AuSn layer 73 while performing appropriate heating and pressing under a condition where the second bonding metal layer 43 of the cap 6a is placed on the third bonding layer 103 of the mounting substrate 2a to be in contact therewith. When the third AuSn layer 73 is melted, Au is diffused in molten AuSn from the third Au layer 93, and this may result in an increase in the Au composition ratio of the molten AuSn. In the fourth step, the cap 6a is pressed after the third AuSn layer 73 is melted. Thereby, molten AuSn is pressed down to spread laterally, and thereafter is solidified by cooling.

The fourth step may include heating the mounting substrate 2a with the first heater only, but may additionally include heating the cap 6a with the second heater. In consideration of bondability between the mounting substrate 2a and the cap 6a, the fourth step may preferably include heating with the first heater and the second heater. Further, the fourth step includes performing pressing by applying appropriate pressure. The pressure may be preferably adjusted in a range of 0.1 to 1 kg/cm$^2$ per one cap 6a, for example. A length of time for applying pressure may be preferably adjusted in a range of 0.1 to 1 second, for example. The fourth step may be preferably conducted under an N$_2$ gas atmosphere.

In the method for manufacturing the light emitting device 1a, as for the third process, the third bonding layer 103 may be preferably formed on the mounting substrate 2a. Therefore, the method for manufacturing the light emitting device 1a can be facilitated in contrast to a case where the third bonding layer 103 is formed on the cap 6a.

The method for manufacturing the light emitting device 1a of the present embodiment described above includes forming the cap 6a by bonding the spacer 4 and the cover 5 to each other, and subsequently bonding the first electrode 31 and the second electrode 32 of the ultraviolet light emitting element 3, and the second bonding metal layer 43 of the cap 6a to the first conductor 21, the second conductor 22, and the first bonding metal layer 23 of the mounting substrate 2a with the first AuSn layer 71, the second AuSn layer 72, and the third AuSn layer 73 respectively. Therefore, the method for manufacturing the light emitting device 1a of the present embodiment can offer advantageous effects of improving reliability and reducing production cost.

The method for manufacturing the light emitting device 1a is defined as a method for manufacturing the light emitting device 1a including the following components.

The light emitting device 1a includes: the mounting substrate 2a; the ultraviolet light emitting element 3 mounted on the mounting substrate 2a; and the cap 6a placed on the mounting substrate 2a and including the recess 663 for accommodating the ultraviolet light emitting element 3. The mounting substrate 2a includes the support 20a and further includes the first conductor 21, the second conductor 22, and the first bonding metal layer 23 supported on the support 20a. The first conductor 21 and the second conductor 22 are placed facing the front surface 201 of the support 20a to face the bottom 664 of the recess 663 of the cap 6a. The cap 6a including the cap body 660 having the front surface 661 and the rear surface 662 and provided with the recess 663 in the rear surface 662, and the second bonding metal layer 43 placed on the rear surface 662 of the cap body 660 at the periphery of the recess 663 to face the first bonding metal layer 23. The cap 6a further includes the ultraviolet light transmitting part 666 between the front surface 661 of the cap body 660 and the bottom 664 of the recess 663 and at least the ultraviolet light transmitting part 666 is made of glass for transmitting ultraviolet light emitted from the ultraviolet light emitting element 3. The ultraviolet light emitting element 3 includes the first electrode 31 and the second electrode 32, and the first electrode 31 and the second electrode 32 are placed facing the surface in the thickness direction of the ultraviolet light emitting element 3.

The method for manufacturing the light emitting device 1a includes steps of: forming the cap 6a; and subsequently bonding the first electrode 31 and the second electrode 32 of the ultraviolet light emitting element 3, and the second bonding metal layer 43 of the cap 6a, to the first conductor 21, the second conductor 22, and the first bonding metal layer 23 of the mounting substrate 2a with the first AuSn layer 71, the second AuSn layer 72, and the third AuSn layer 73, respectively. The first AuSn layer 71, the second AuSn layer 72, and the third AuSn layer 73 are formed collectively on/over the mounting substrate 2a by the same process. Therefore, the method for manufacturing the light emitting device 1a can offer advantageous effects of improving reliability and reducing production cost. In the method for manufacturing the light emitting device 1a, the first AuSn layer 71 and the second AuSn layer 72 as well as the third AuSn layer 73 can be collectively formed directly or indirectly on the mounting substrate 2a through the same process, and this may lead to a decrease in production cost.

In the method for manufacturing the light emitting device 1a, a first bonding process is performed to bond the first electrode 31 and the second electrode 32 of the ultraviolet light emitting element 3, to the first conductor 21 and the second conductor 22 of the mounting substrate 2a with the first AuSn layer 71 and the second AuSn layer 72, respectively. In the method for manufacturing the light emitting device 1a, a second bonding process subsequent to the first bonding process is performed to bond the second bonding metal layer 43 of the cap 6a to the first bonding metal layer 23 of the mounting substrate 2a with the third AuSn layer 73. In the method for manufacturing the light emitting device 1a, the first bonding process and the second bonding process may preferably be sequentially performed in a bonding room of single bonding apparatus. Therefore, the method for manufacturing the light emitting device 1a can offer advantageous effects of reducing production cost.

Note that, the light emitting device 1a may preferably include a zener diode connected in antiparallel to the ultraviolet light emitting element 3. In this case, the light emitting device 1a can have resistance to static electricity improved. In summary, the light emitting device 1a can suppress insulation breakdown of the ultraviolet light emitting element 3 due to static electricity. The zener diode may be preferably mounted on the mounting substrate 2a to be inside the package 7a, for example. The zener diode may preferably have a chip size smaller than a chip size of the ultraviolet light emitting element 3. The zener diode may be preferably mounted on the mounting substrate 2a by flip-chip mounting with AuSn in a similar manner to the ultraviolet light emitting element 3. In this case, in the method for manufacturing the light emitting device 1a, a mounting substrate provided with a third conductor and a fourth conductor for mounting the zener diode is prepared as the mounting substrate 2a. The third process further includes forming a fourth bonding layer including a fourth AuSn layer and a fifth bonding layer including a fifth AuSn layer on a front surface of the third conductor and a front surface of the fourth conductor, respectively. The fourth process may further include, between the second step and the third step or before the first step, mounting the zener diode on the mounting substrate 2a by flip-chip mounting with the aforementioned bonding apparatus.

Figure 10:
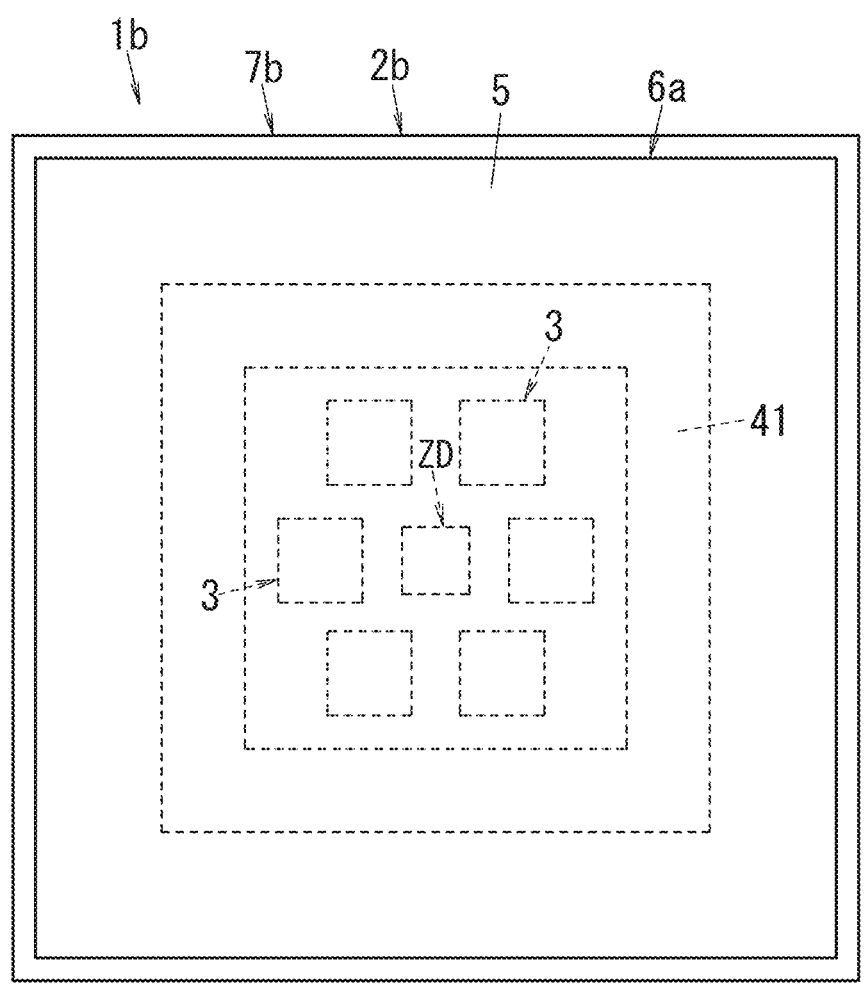
FIG. 10 is a schematic plan of a modification of the light emitting device of Embodiment 1.
Figure 11A:
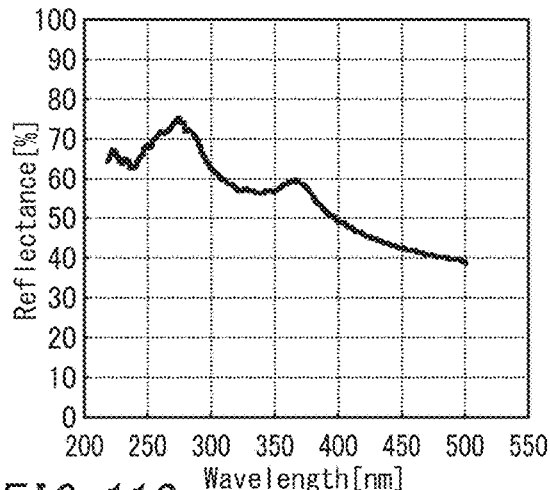
FIG. 11A is a diagram for illustration of a relationship between wavelengths and reflectances for rays of light striking an evaluation sample including the Si substrate at the incident angle of 5°.
Figure 11B:
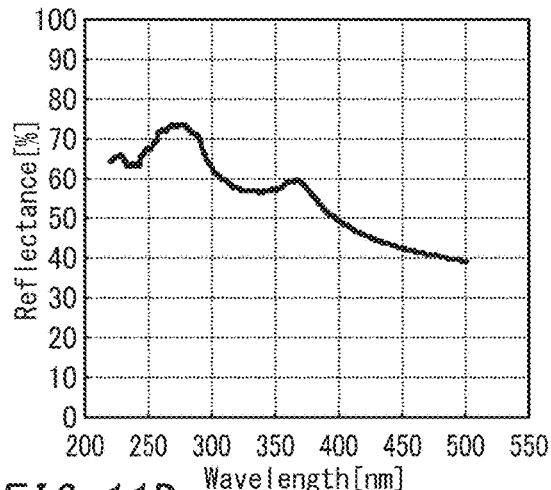
FIG. 11B is a diagram for illustration of a relationship between wavelengths and reflectances for rays of light striking an evaluation sample including the Si substrate at the incident angle of 15°.
Figure 11C:
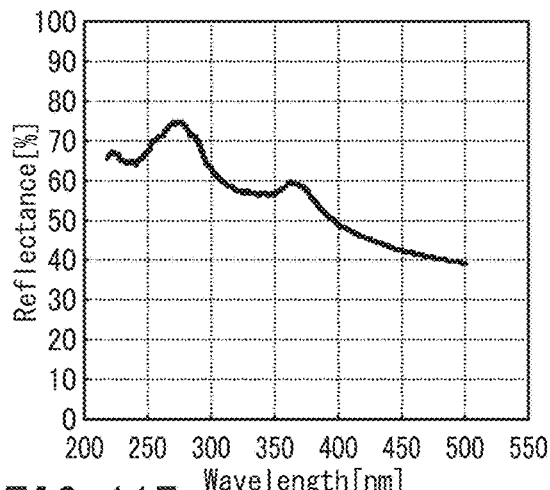
FIG. 11C is a diagram for illustration of a relationship between wavelengths and reflectances for rays of light striking an evaluation sample including the Si substrate at the incident angle of 25°.
Figure 11D:
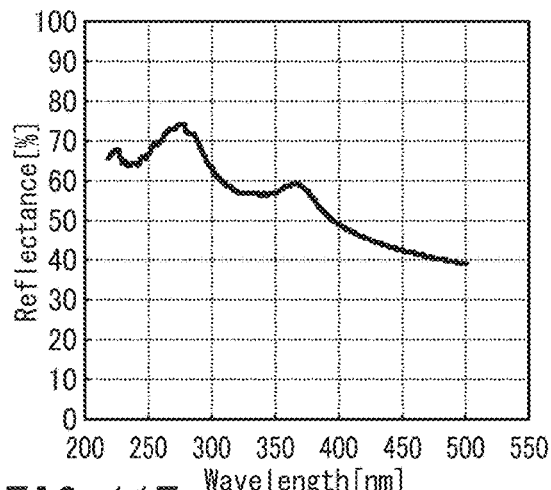
FIG. 11D is a diagram for illustration of a relationship between wavelengths and reflectances for rays of light striking an evaluation sample including the Si substrate at the incident angle of 35°.
Figure 11E:
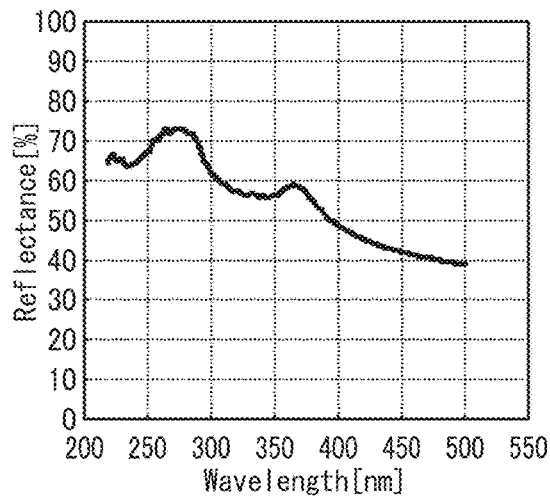
FIG. 11E is a diagram for illustration of a relationship between wavelengths and reflectances for rays of light striking an evaluation sample including the Si substrate at the incident angle of 45°.
Figure 11F:
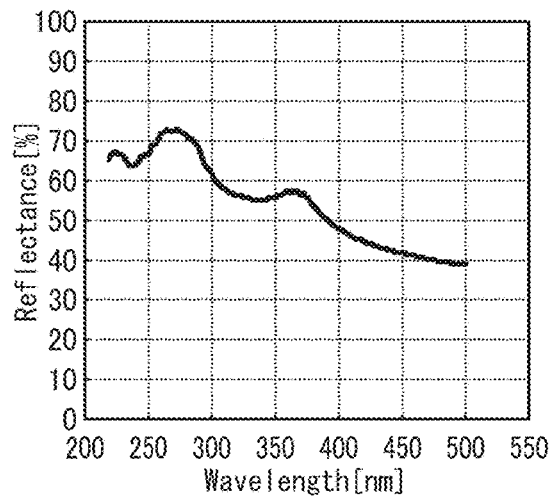
FIG. 11F is a diagram for illustration of a relationship between wavelengths and reflectances for rays of light striking an evaluation sample including the Si substrate at the incident angle of 55°.
Figure 12A:
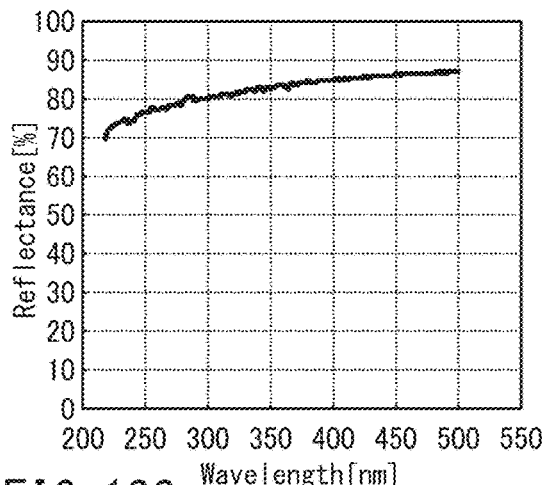
FIG. 12A is a diagram for illustration of a relationship between wavelengths and reflectances for rays of light striking the Al substrate at the incident angle of 15°.
Figure 12B:
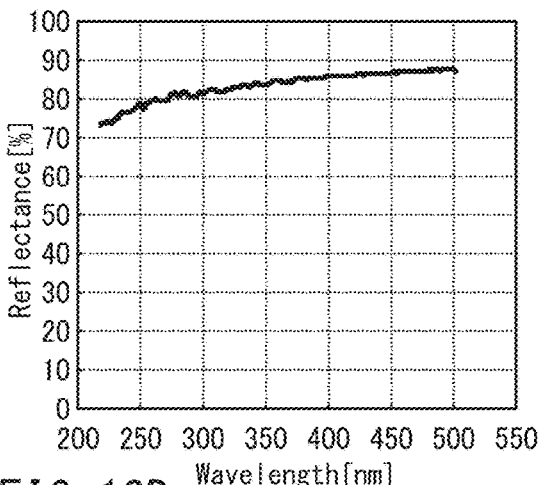
FIG. 12B is a diagram for illustration of a relationship between wavelengths and reflectances for rays of light striking the Al substrate at the incident angle of 25°.
Figure 12C:
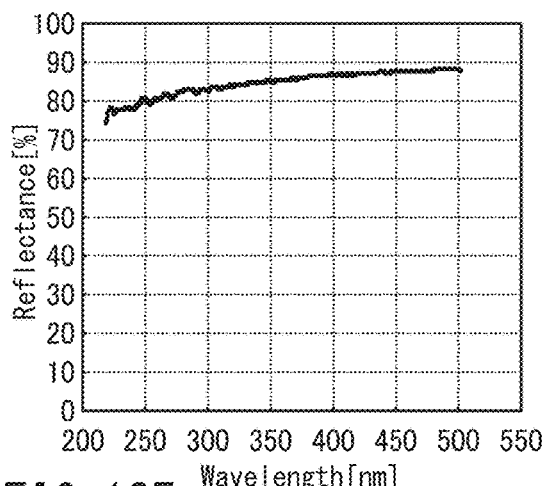
FIG. 12C is a diagram for illustration of a relationship between wavelengths and reflectances for rays of light striking the Al substrate at the incident angle of 35°.
Figure 12D:
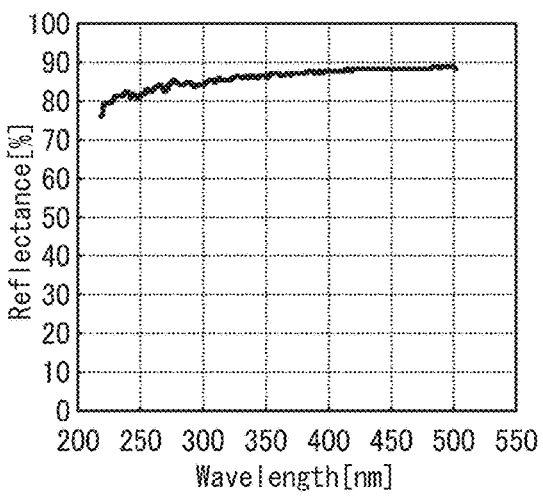
FIG. 12D is a diagram for illustration of a relationship between wavelengths and reflectances for rays of light striking the Al substrate at the incident angle of 45°.
Figure 12E:
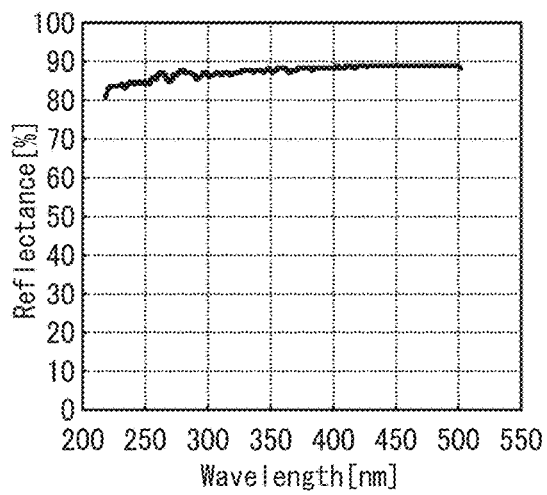
FIG. 12E is a diagram for illustration of a relationship between wavelengths and reflectances for rays of light striking the Al substrate at the incident angle of 55°.

FIG. 10 is a schematic plan of a light emitting device 1b of the first modification. The light emitting device 1b of the first modification is different in including a mounting substrate 2b on which multiple ultraviolet light emitting elements 3 are mounted, instead of the mounting substrate 2a. Note that, components common to the light emitting device 1b and the light emitting device 1a are attached with common reference signs to avoid redundant explanations.

In the light emitting device 1b, the multiple ultraviolet light emitting elements 3 are mounted on the mounting substrate 2b. The multiple ultraviolet light emitting elements 3 may be preferably arranged on one virtual circle at regular intervals. The light emitting device 1b may preferably include a zener diode ZD for improving resistance to static electricity. The zener diode ZD may be preferably placed on the center of the aforementioned virtual circle.

The light emitting device 1b includes a package 7b constituted by the mounting substrate 2b and the cap 6a, instead of the package 7a of the light emitting device 1a.

In the light emitting device 1b, the multiple ultraviolet light emitting elements 3 are connected in parallel to each other. Alternatively, the multiple ultraviolet light emitting elements 3 may be connected in series with each other or in series-parallel with each other.

Note that, Document 1 discloses that the spacer can be made of a silicon substrate or electrically insulating resin. Further, Document 1 discloses reflective metal films of Ag or Al may be preferably formed on side surfaces of the cavity to achieve sufficient effects of reflection of light by the side surfaces of the cavity.

Additionally, there has been proposed, as light emitting devices, an optoelectronics element including a carrier, an optoelectronics semiconductor chip being a light emitting diode mounted on a main surface of the carrier, and an optical part mounted on the carrier (Document 3 [JP 2012-515441 A]). The carrier is a printed circuit substrate or a ceramic substrate. The optical part includes a frame, and a glass plate. The frame is made of silicon. The glass plate transmits radiation emitted from the optoelectronics semiconductor chip.

In the fields of light emitting devices for emitting ultraviolet light, there may be a demand to increase output of ultraviolet light.

In a different point of view, the aforementioned light emitting device 1a includes the following components.

The light emitting device 1a includes the mounting substrate 2a, the ultraviolet light emitting element 3 mounted on the mounting substrate 2a, the spacer 4 placed on the mounting substrate 2a and including the through hole 41 for exposing the ultraviolet light emitting element 3, and the cover 5 placed on the spacer 4 to cover the through hole 41 of the spacer 4. The ultraviolet light emitting element 3 is configured to emit ultraviolet light with an emission peak wavelength within an ultraviolet wavelength range. The spacer 4 includes the spacer body 40 made of Si. The through hole 41 is formed in the spacer body 40. The through hole 41 has an opening area which gradually increases with an increase in a distance from the mounting substrate 2a. The cover 5 is made of glass transmissive for ultraviolet light emitted from the ultraviolet light emitting element 3. In the light emitting device 1a, the spacer 4 and the cover 5 are bonded to each other. The light emitting device 1a with such configuration can offer advantageous effects of increasing output of ultraviolet light.

The ultraviolet light emitting element 3 may be allowed to have an emission peak wavelength in an ultraviolet wavelength range. The emission peak wavelength may not be limited to a wavelength falling within the wavelength range of UV-C, but may fall within the wavelength range of UV-B or the wavelength range of UV-A. The "wavelength range of UV-B" ranges from 280 nm to 315 nm based on classification of wavelength of ultraviolet light designated by the International Commission on Illumination (CIE), for example. The "wavelength range of UV-A" ranges from 315 nm to 400 nm based on classification of wavelength of ultraviolet light designated by the International Commission on Illumination, for example.

The present inventors experimented to measure reflectances of an evaluation sample including an Si substrate, and measure reflectances of an Al substrate. The evaluation sample is a sample prepared by forming native oxide with a thickness of about 1 nm on a surface of the Si substrate in conformity with the same specifications as the single-crystalline Si substrate 400. The reflectances were measured with a spectrophotometer. In more detail, as for the reflectances of the evaluation sample, light reflected from the evaluation sample in ultraviolet light striking the surface of the evaluation sample (the surface of the native oxide) at a predetermined incident angle was measured spectroscopically with the spectrophotometer. As for the reflectances of the Al substrate, light reflected from the Al substrate in ultraviolet light striking the surface of the Al substrate at a predetermined incident angle was measured spectroscopically with the spectrophotometer.

FIG. 11A, FIG. 11B, FIG. 11C, FIG. 11D, FIG. 11E and FIG. 11F show reflectivity of the evaluation sample for incident angles of 5°, 15°, 25°, 35°, 45°, and 55°. Further, FIG. 12A, FIG. 12B, FIG. 12C, FIG. 12D, and FIG. 12E show reflectivity of the Al substrate for incident angles of 15°, 25°, 35°, 45°, and 55°.

It is confirmed that the evaluation sample has a reflectance of 50% or more for ultraviolet light with a wavelength in a range of 220 nm to 390 nm irrespective of values of the incident angles, and has a reflectance of about 50% for ultraviolet light with a wavelength of 400 nm. Note that, when the Al substrate is oxidized, a reflectance thereof for ultraviolet light in the wavelength range of UV-C tends to decrease. This may be because aluminum oxide has a reflectance which greatly decreases in the wavelength range of UV-C and an aluminum oxide film formed on the Al substrate causes a decrease in a reflectance of a whole (the Al substrate with the aluminum oxide film). Conversely, development of surface oxidation of the Al substrate may cause a decrease in the reflectance for ultraviolet light in the wavelength range of UV-C. Oxidative corrosion of the Al substrate develops faster than oxidation of the surface of the Si substrate. Hence, it may be recommended to pay attention in application of Al substrates and Al films to reflection of ultraviolet light in the wavelength range of UV-C.

In the light emitting device 1a, the spacer 4 includes the spacer body 40 made of Si, and the through hole 41 formed in the spacer body 40 has the opening area gradually increasing with an increase in the distance from the mounting substrate 2a. In the light emitting device 1a, the internal side surface of the through hole 41 of the spacer body 40 serves as a reflective surface for reflecting ultraviolet light and thus light extraction efficiency can be improved and output of the ultraviolet light can be increased. Additionally, the light emitting device 1a can reduce a variation of the output and suppress deterioration of the reflectivity compared with a comparative example which has the same configuration as the light emitting device 1a but includes an Al film serving as a reflection film on the internal side surface of the through hole 41. Hence, the light emitting device 1a can reduce production cost yet increase output of ultraviolet light, as well as improve reliability.

Embodiment 2

Figure 13:
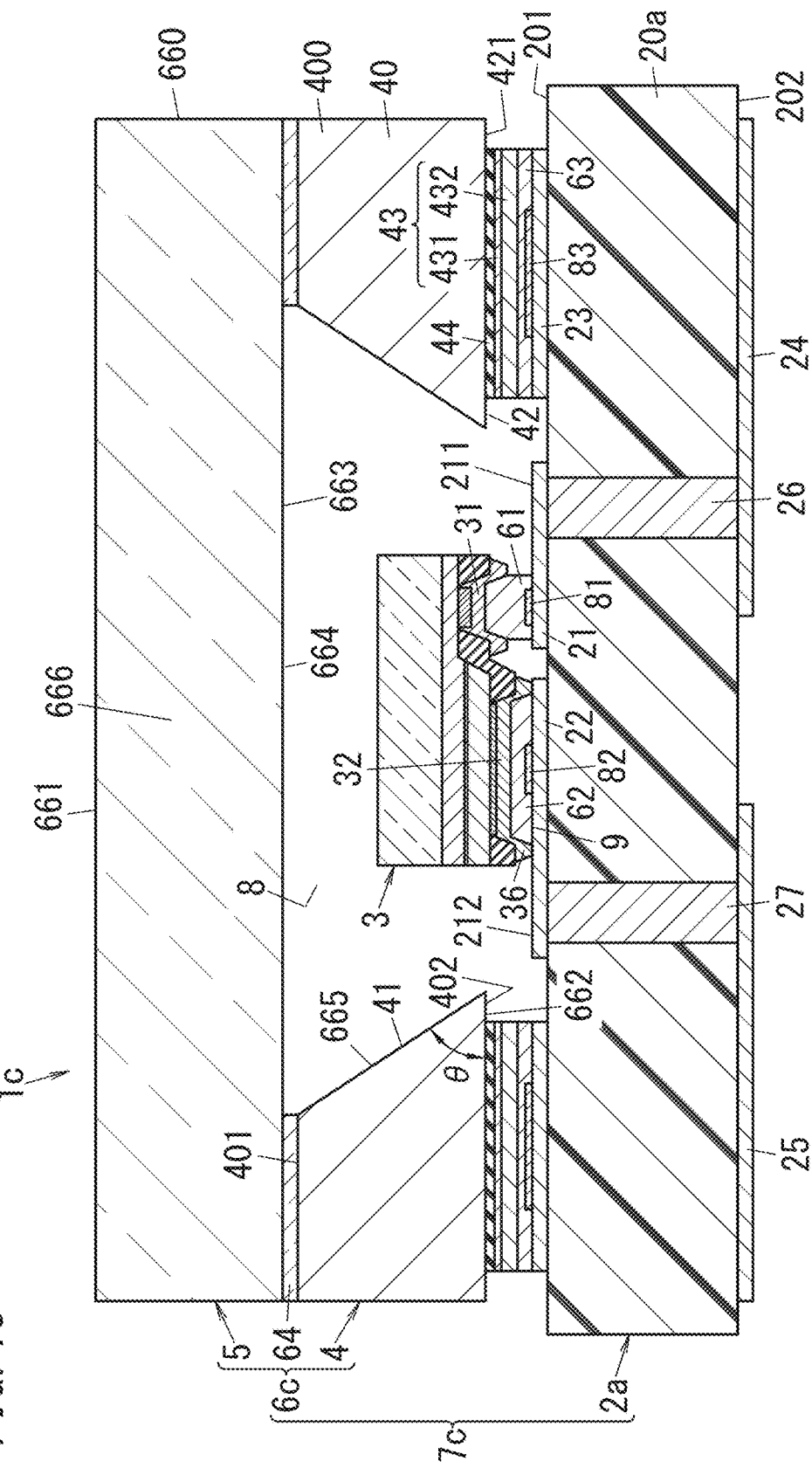
FIG. 13 is a schematic section of the light emitting device of Embodiment 2.
Figure 14:
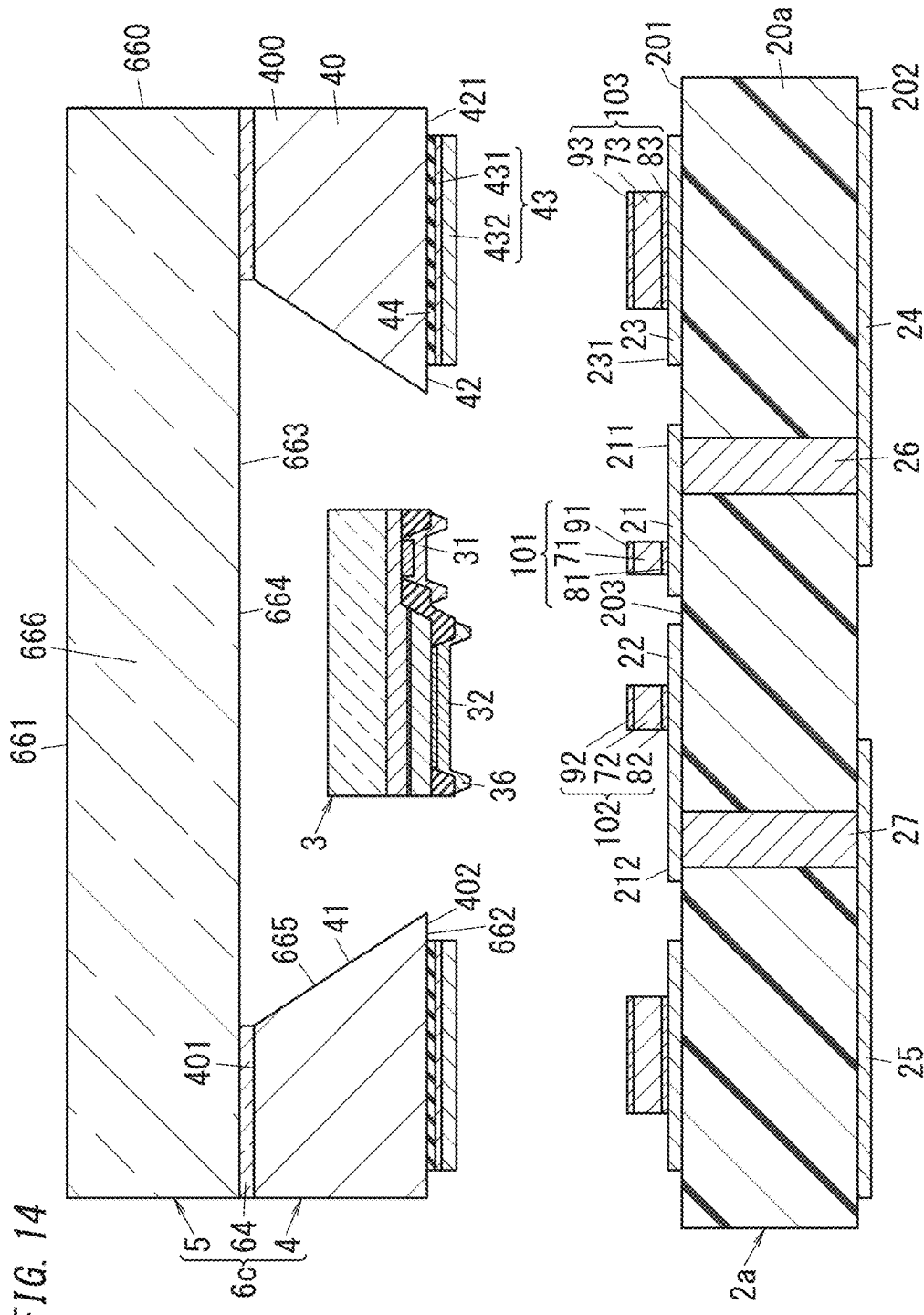
FIG. 14 is a primary section for illustration of the method for manufacturing the light emitting device of Embodiment 2.
Figure 15:
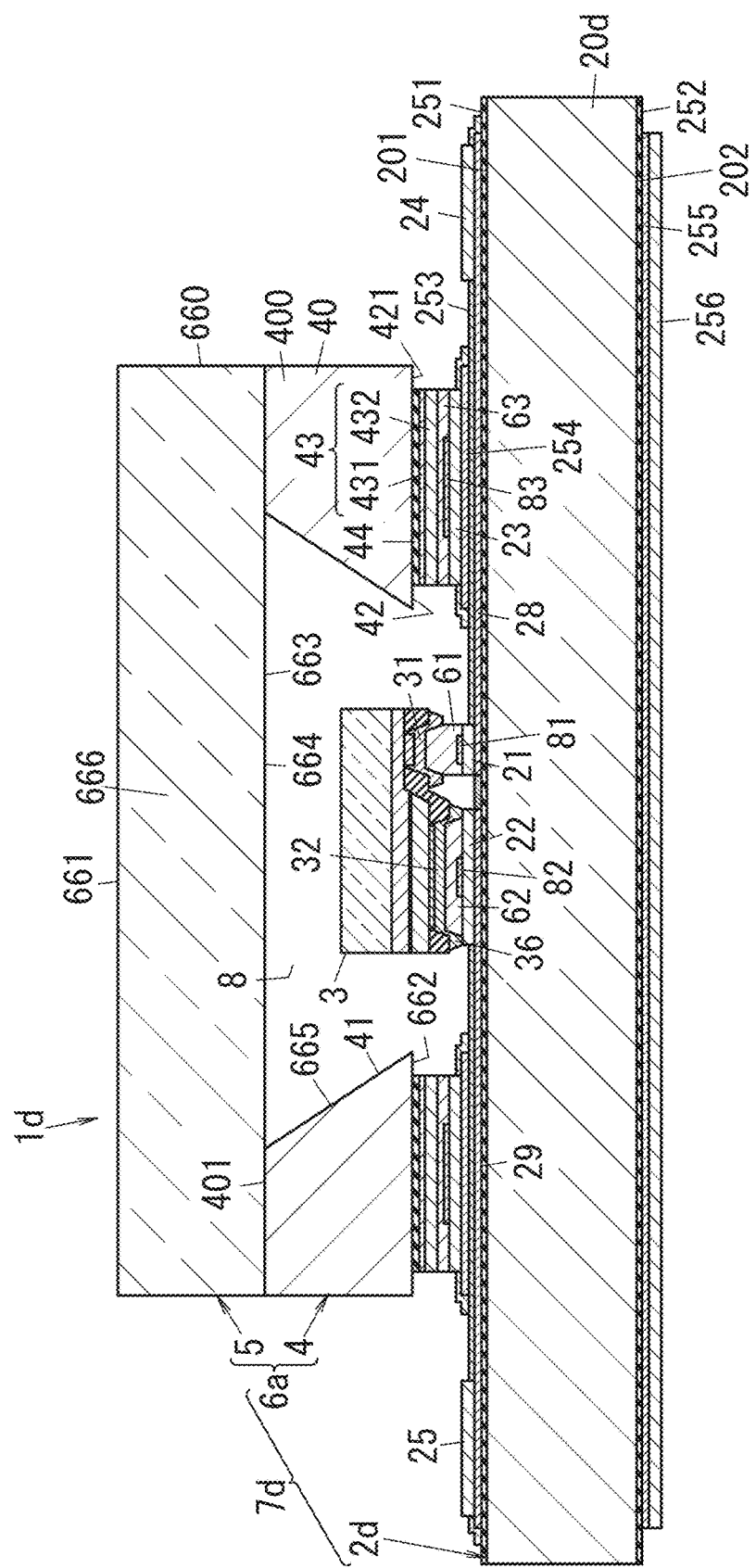
FIG. 15 is a schematic section of the light emitting device of Embodiment 3.
Figure 16:
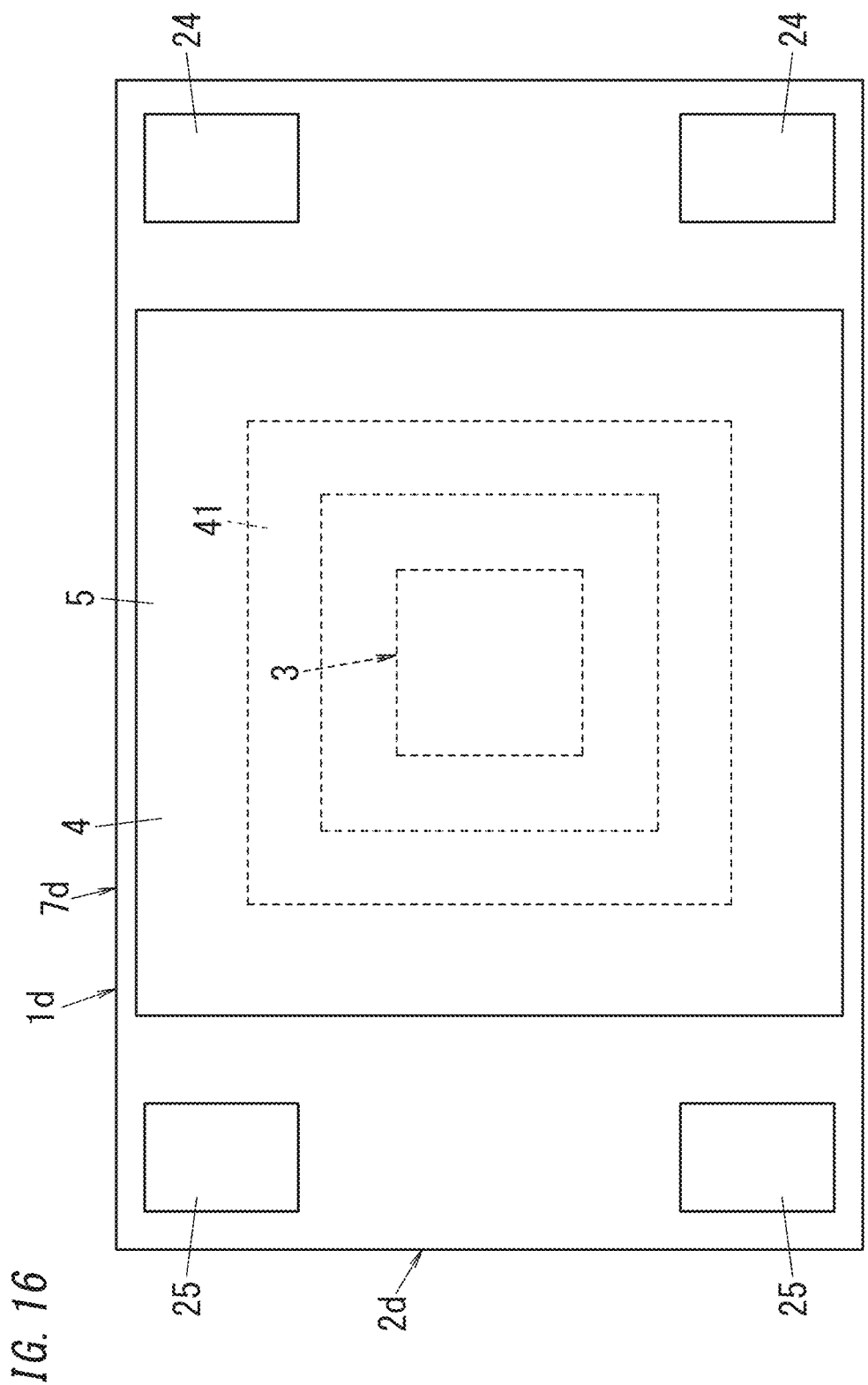
FIG. 16 is a schematic plan of the light emitting device of Embodiment 3.
Figure 17:
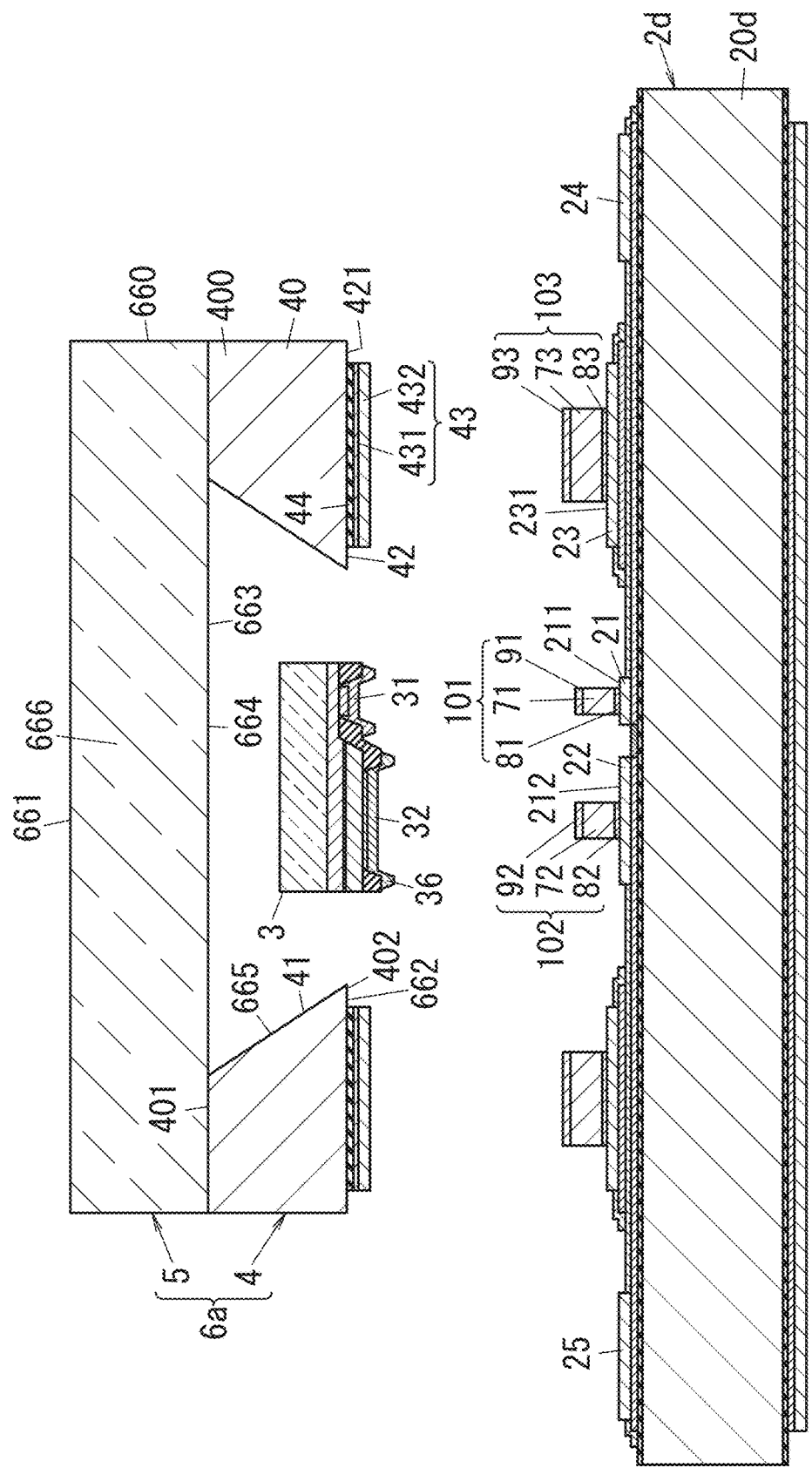
FIG. 17 is a primary section for illustration of the method for manufacturing the light emitting device of Embodiment 3.

Hereinafter, a light emitting device 1c of the present embodiment is described with reference to FIG. 13 and FIG. 14. The light emitting device 1c is different from the light emitting device 1a of Embodiment 1 in that the spacer 4 and the cover 5 are bonded with inorganic bonding material. Note that, components common to the light emitting device 1c and the light emitting device 1a are attached with common reference signs to avoid redundant explanations.

In the light emitting device 1c, the spacer 4 and the cover 5 are bonded with a fourth bond 64 made of low melting point glass having a coefficient of thermal expansion between a coefficient of thermal expansion of the spacer body 40 and a coefficient of thermal expansion of the cover 5. Therefore, in the light emitting device 1c, examples of material of the cover 5 can include quartz glass in addition to glass containing an alkaline component.

In the present description, low melting point glass may be glass with a softening point equal to or lower than 600° C., and preferably be glass with a softening point equal to or lower than 500° C., and more preferably be glass with a softening point equal to or lower than 400° C. Examples of the low melting point glass may include glass containing as main components lead oxide (PbO) and boron trioxide ($B_2O_3$).

The light emitting device 1c includes a cap 6c constituted by the spacer 4, the fourth bond 64, and the cover 5, instead of the cap 6a of the light emitting device 1a. The cap 6c is made of inorganic material. The cap 6c includes the cap body 660 having the front surface 661 and the rear surface 662 and including the recess 663 in the rear surface 662, and the second bonding metal layer 43 placed on the rear surface 662 of the cap body 660 at the periphery of the recess 663 to face the first bonding metal layer 23. Additionally, the light emitting device 1c includes a package 7c constituted by the cap 6c and the mounting substrate 2a, instead of the package 7a of the light emitting device 1a.

The method for manufacturing the light emitting device 1c of the present embodiment is almost same as the method for manufacturing the light emitting device 1a, but is different in bonding the spacer 4 and the cover 5 in the second process. In the case of the method for manufacturing the light emitting device 1b, the second process including forming the cap 6c by bonding the spacer 4 and the cover 5 to each other. In more detail, in the case of the method for manufacturing the light emitting device 1c, in the second process, the spacer 4 and the cover 5 are bonded with low melting point glass. In the second process, a pellet of low melting point glass or a paste of low melting point glass is available.

The method for manufacturing the light emitting device 1c of the present embodiment includes: forming the cap 6c by bonding the spacer 4 and the cover 5 to each other; and subsequently bonding the first electrode 31 and the second electrode 32 of the ultraviolet light emitting element 3, and the second bonding metal layer 43 of the cap 6c, to the first conductor 21, the second conductor 22, and the first bonding metal layer 23 of the mounting substrate 2a, with the first AuSn layer 71, the second AuSn layer 72, and the third AuSn layer 73, respectively. Therefore, the method for manufacturing the light emitting device 1c of the present embodiment can offer advantageous effects of improving reliability and reducing production cost.

Embodiment 3

Hereinafter, a light emitting device 1d of the present embodiment is described with reference to FIG. 15 to FIG. 18. The light emitting device 1d is different from the light emitting device 1a of Embodiment 1 in including a mounting substrate 2d instead of the mounting substrate 2a of the light emitting device 1a. Note that, components common to the light emitting device 1d and the light emitting device 1a are attached with common reference signs to avoid redundant explanations.

The light emitting device 1d includes a package 7d constituted by the cap 6a and the mounting substrate 2d, instead of the package 7a of the light emitting device 1a.

Figure 18:
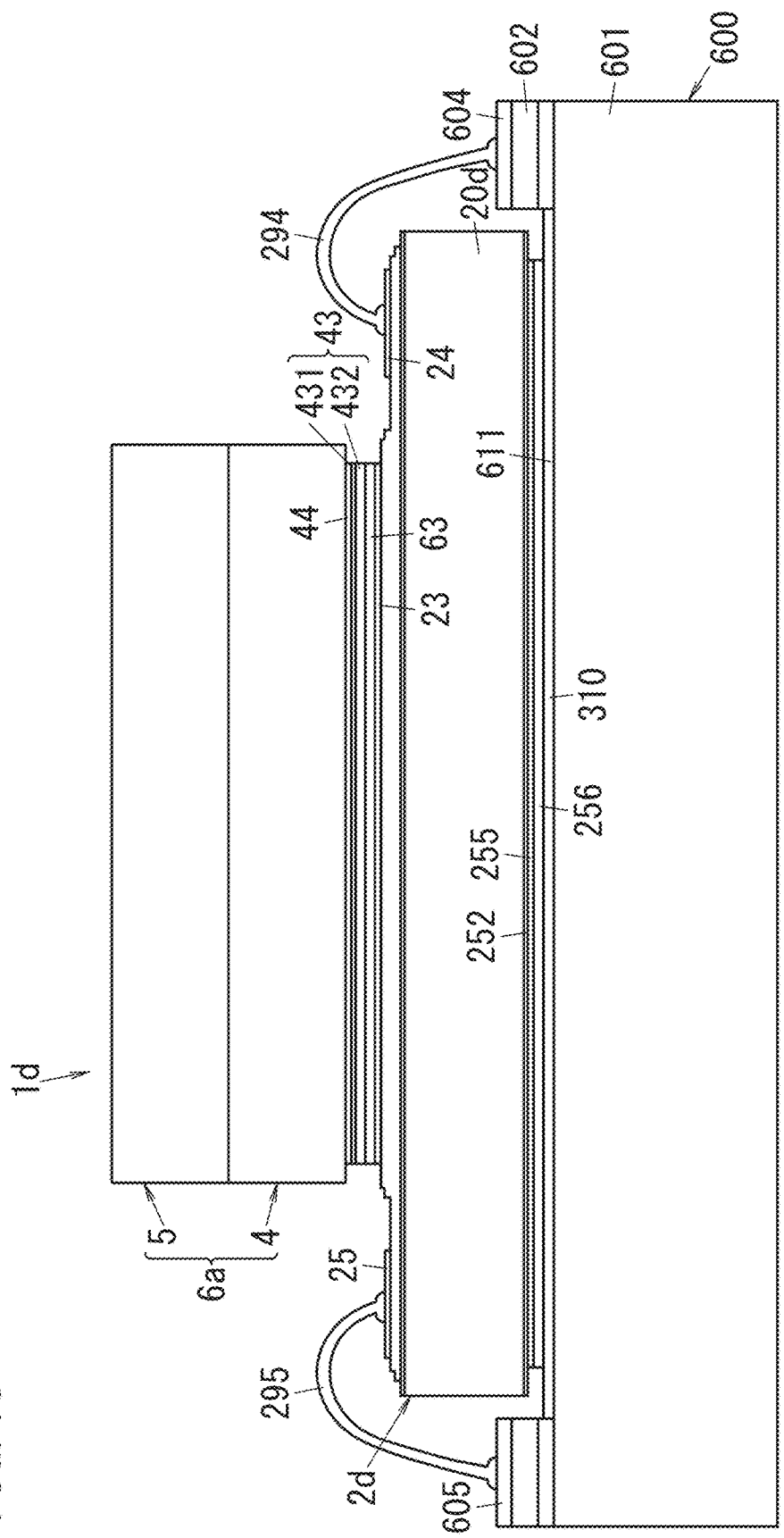
FIG. 18 is a schematic side view of the structure where the light emitting device of Embodiment 3 is mounted on a wiring substrate.

The mounting substrate 2d is a multilayered substrate. The mounting substrate 2d includes the first external connection electrode 24 and the second external connection electrode 25, and further includes a first wiring layer 28, a second wiring layer 29, and an electrically insulating layer 253. The first wiring layer 28 and the second wiring layer 29 are placed facing the front surface 201 of the support 20d. The first conductor 21 and the first external connection electrode 24 are placed on the first wiring layer 28 and electrically connected to the first wiring layer 28. The second conductor 22 and the second external connection electrode 25 are placed on the second wiring layer 29 and electrically connected to the second wiring layer 29. The electrically insulating layer 253 is placed facing the front surface 201 of the support 20d so as to cover the first wiring layer 28 and the second wiring layer 29. The first bonding metal layer 23 is placed on the electrically insulating layer 253. Hence, for example, as shown in FIG. 18, the light emitting device 1d can be mounted on a wiring substrate 600 by use of the first external connection electrode 24 and the second external connection electrode 25 facing the front surface of the mounting substrate 2d.

The mounting substrate 2d includes a second electrically insulating layer 251 different from a first electrically insulating layer being the electrically insulating layer 253. The support 20d is made of Si. The second electrically insulating layer 251 is placed on the front surface 201 of the support 20d. The first wiring layer 28 and the second wiring layer 29 are placed on the second electrically insulating layer 251. Therefore, the light emitting device 1d can have heat radiation performance improved.

The mounting substrate 2d may preferably include a first foundation layer 254 between the first bonding metal layer 23 and the electrically insulating layer 253.

The mounting substrate 2d includes a fourth electrically insulating layer 252 formed on the rear surface 202 of the support 20d. Further, the mounting substrate 2d includes a second foundation layer 255 and a conductive layer 256 so that the conductive layer 256 is formed on the fourth electrically insulating layer 252 with the second foundation layer 255 in-between.

Each of the first electrically insulating layer, the second electrically insulating layer 251, the third electrically insulating layer, and the fourth electrically insulating layer 252 may be formed of, for example, a silicon oxide film.

Each of the first foundation layer 254 and the second foundation layer 255 may be formed of, for example, an Al film or the like. The first foundation layer 254 and the second foundation layer 255 are made of the same material, but may be made of different materials.

The conductive layer 256 may be formed of, for example, a laminated film of an Ni film, a Pd film, and an Au film.

The wiring substrate 600 serves as a mother substrate. The wiring substrate 600 may be formed of, for example, a metal base printed wiring board. In this case, the wiring substrate 600 may preferably include, for example, a metal plate 601 and an insulating resin layer 602 formed on the metal plate 601, and further includes a first wiring part 604 and a second wiring part 605 which are formed on the insulating resin layer 602. The metal plate 601 may be formed of a Cu plate but may be formed of, for example, an Al plate. The wiring substrate 600 has a projection region of the light emitting device 1d exposed on the front surface 611 of the metal plate 601.

In the ultraviolet LED module including the light emitting device 1d and the wiring substrate 600, the conductive layer 256 on the rear surface side of the light emitting device 1d is bonded to the metal plate 601 with a bonding layer 310. The bonding layer 310 may be made of solder, but may be made of sintered silver. The sintered silver is sintered material in which silver particles are coupled by sintering. The sintered silver is porous silver. In the case of the bonding layer 310 formed of sintered silver, a paste containing silver particles and a volatile binder may be formed on the front surface 611 of the metal plate 601 and thereafter the light emitting device 1d may be placed on the metal plate 601 with the paste in-between, and then the paste may be heated to form sintered silver.

Further, in the ultraviolet LED module, the first external connection electrode 24 is electrically connected to the first wiring part 604 via a first wire 294. Furthermore, in the ultraviolet LED module, the second external connection electrode 25 is electrically connected to the second wiring part 605 via a second wire 295. Each of the first wire 294 and the second wire 295 may be preferably an Au wire. In the ultraviolet LED module, the light emitting device 1d is mounted on the wiring substrate 600 secondarily. In the ultraviolet LED module, the wiring substrate 600 may be preferably larger than the light emitting device 1a in a plan view. Consequently, the ultraviolet LED module can have heat radiation performance improved.

The method for manufacturing the light emitting device 1d of the present embodiment is basically same as the method for manufacturing the light emitting device 1a. The method for manufacturing the light emitting device 1d of the present embodiment includes: forming the cap 6a by bonding the spacer 4 and the cover 5 to each other; and subsequently bonding the first electrode 31 and the second electrode 32 of the ultraviolet light emitting element 3, and the second bonding metal layer 43 of the cap 6a, to the first conductor 21, the second conductor 22, and the first bonding metal layer 23 of the mounting substrate 2a, with the first AuSn layer 71, the second AuSn layer 72, and the third AuSn layer 73, respectively. Therefore, the method for manufacturing the light emitting device 1d of the present embodiment can offer advantageous effects of improving reliability and reducing production cost.

The light emitting device 1d may include the cap 6c of the light emitting device 1c of Embodiment 2, instead of the cap 6a.

Embodiment 4

Figure 19:
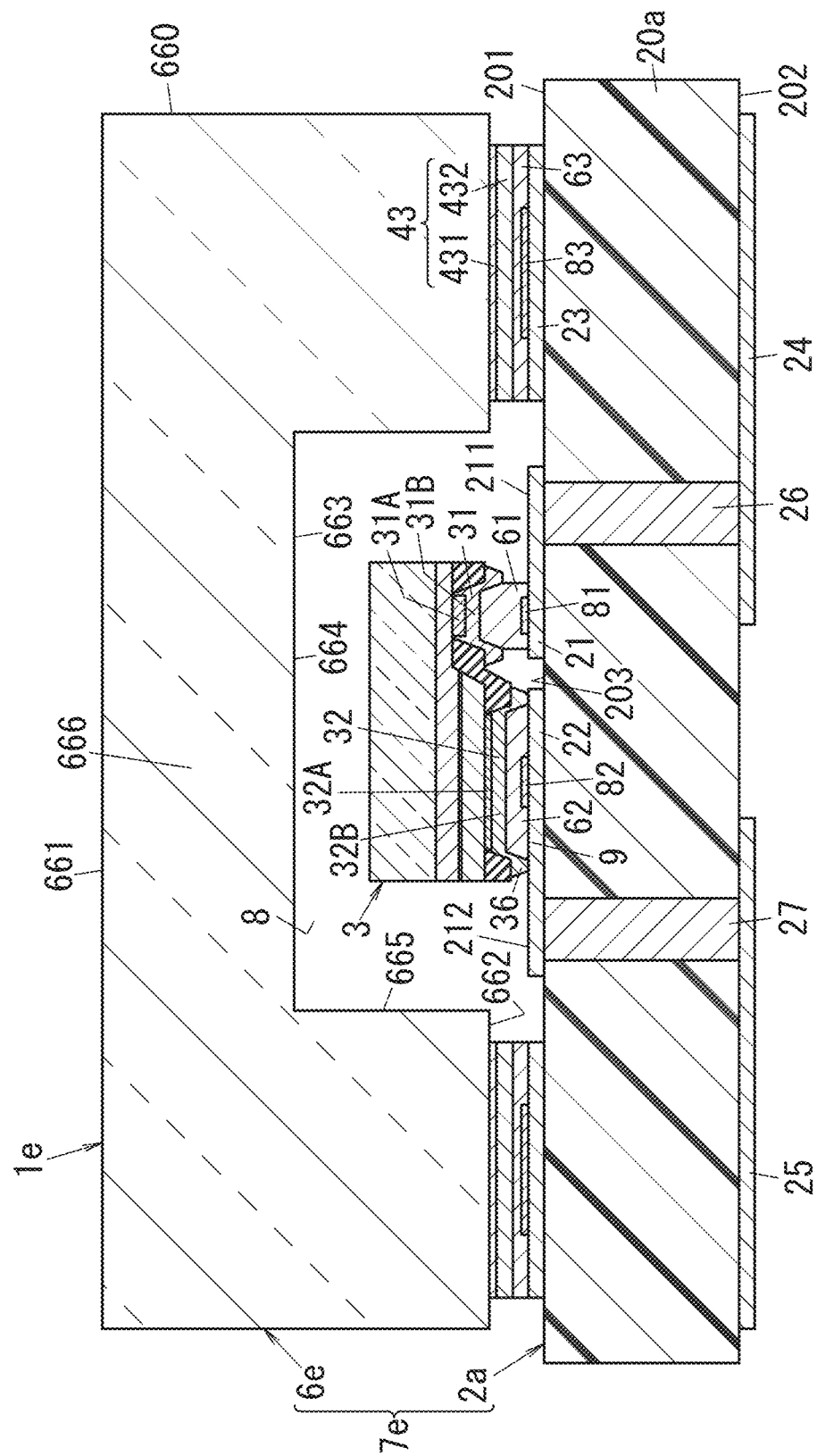
FIG. 19 is a schematic section of the light emitting device of Embodiment 4.
Figure 20:
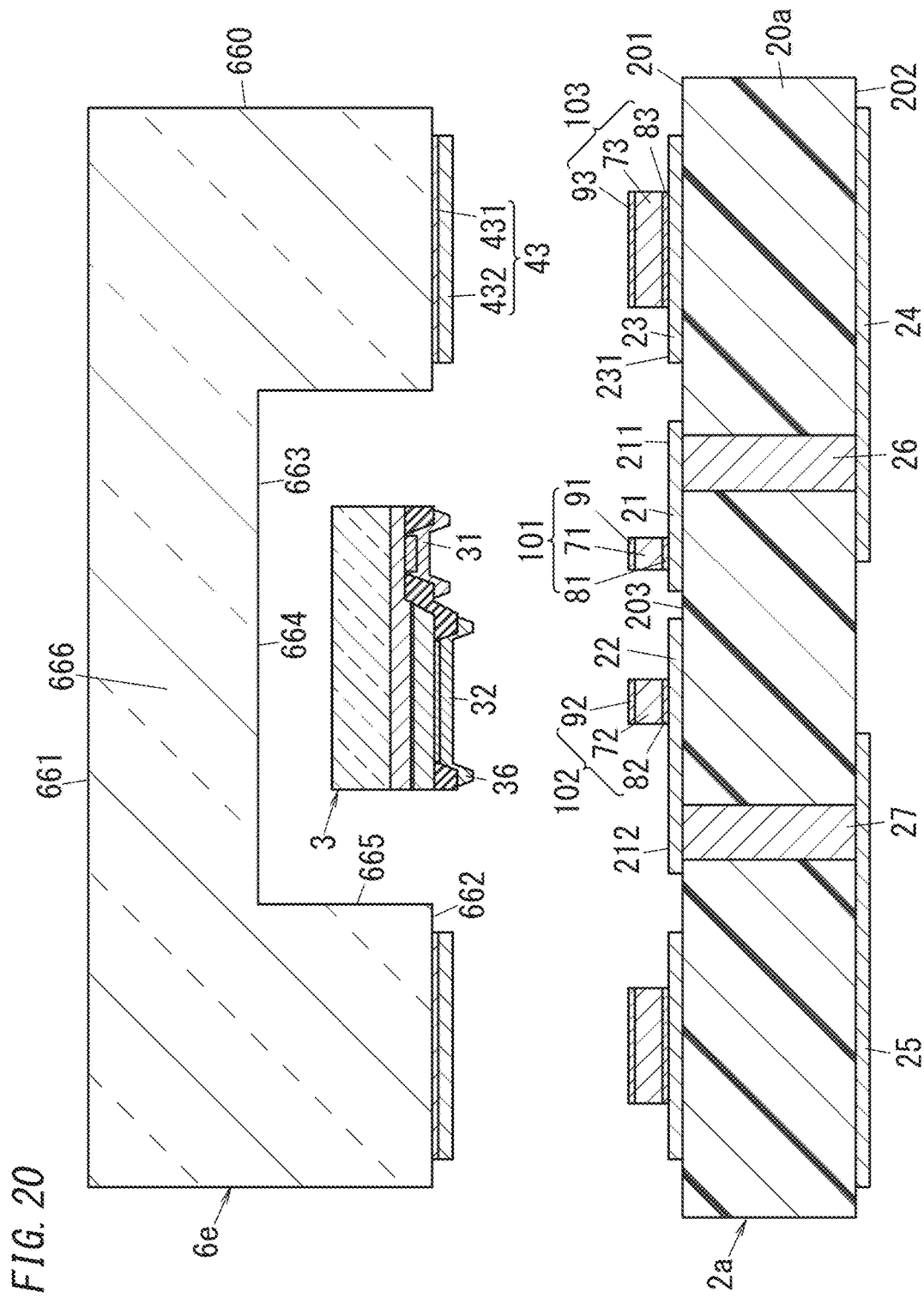
FIG. 20 is a primary section for illustration of the method for manufacturing the light emitting device of Embodiment 4.

Hereinafter, a light emitting device 1e of the present embodiment is described with reference to FIG. 19 and FIG. 20. The light emitting device 1e is different from the light emitting device 1a of Embodiment 1 in including a cap 6e instead of the cap 6a of the light emitting device 1a of Embodiment 1. Note that, components common to the light emitting device 1e and the light emitting device 1a are attached with common reference signs to avoid redundant explanations.

The light emitting device 1e includes a package 7e constituted by the cap 6e and the mounting substrate 2a, instead of the package 7a of the light emitting device 1a.

In the cap 6e, a whole of the cap body 660 is made of glass transmissive for ultraviolet light emitted from the ultraviolet light emitting element 3. Consequently, the light emitting device 1e of the present embodiment can offer advantageous effects of improving reliability and reducing production cost, compared with the light emitting device 1a of Embodiment 1.

A method of forming the cap 6e includes a first step of forming the second bonding metal layer 43 in a flat glass plate serving as a base for the cap body 660. The method of forming the cap 6e includes a second step of forming a hole corresponding to the recess 663 in the glass plate by drilling. The method of forming the cap 6e may preferably include an additional smoothing step of smoothing an internal surface of the hole with etchant (for example, hydrofluoric acid).

In manufacturing the light emitting device 1e, the above method of forming the cap 6e is adopted. Therefore, in the light emitting device 1e, the recess 663 in the rear surface 662 of the cap body 660 can have the opening area approximately equal to the area of the bottom 664 of the recess 663. The recess 663 has a depth of, for example, 300 µm.

The second bonding metal layer 43 may be preferably formed of, for example, a laminated film of the foundation film 431 and the Au film 432. The foundation film 431 may be formed of, for example, a laminated film of a Cr film formed on the rear surface 662 of the cap body 660 and a Pt film formed on the Cr film. In the light emitting device 1e, adhesion between the cap body 660 made of glass and the second bonding metal layer 43 can be improved, providing that the foundation film 431 of the second bonding metal layer 43 includes the Cr film. The second bonding metal layer 43 may be made by, for example, thin film forming techniques (for example, evaporation, sputtering, and plating), photolithography techniques, and etching techniques.

The method for manufacturing the light emitting device 1e of the present embodiment is almost same as the method for manufacturing the light emitting device 1a of Embodiment 1. Accordingly, the method for manufacturing the light emitting device 1e of the present embodiment includes: forming the cap 6e; and subsequently bonding the first electrode 31 and the second electrode 32 of the ultraviolet light emitting element 3, and the second bonding metal layer 43 of the cap 6e, to the first conductor 21, the second conductor 22, and the first bonding metal layer 23 of the mounting substrate 2a, with the first AuSn layer 71, the second AuSn layer 72, and the third AuSn layer 73, respectively. The first AuSn layer 71, the second AuSn layer 72, and the third AuSn layer 73 are formed collectively on/over the mounting substrate 2a by the same process. The phrase "the first AuSn layer 71, the second AuSn layer 72, and the third AuSn layer 73 are formed collectively by the same process" means that the first AuSn layer 71, the second AuSn layer 72, and the third AuSn layer 73 are formed simultaneously by use of the same process. Therefore, the method for manufacturing the light emitting device 1e can offer advantageous effects of improving reliability and reducing production cost. In the method for manufacturing the light emitting device 1e, the first AuSn layer 71 and the second AuSn layer 72, and the third AuSn layer 73 can be formed collective on/over the mounting substrate 2a by the same process, and therefore production cost can be decreased. The individual Au films of the first electrode 31 and the second electrode 32 of the ultraviolet light emitting element 3 may preferably have a thickness relatively close to or equal to the thickness of the Au film 432 of the second bonding metal layer 43. Accordingly, a successive process of mounting the ultraviolet light emitting element 3 to the mounting substrate 2a and mounting the cap 6e to the mounting substrate 2a can be facilitated. The individual Au films of the first electrode 31 and the second electrode 32 of the ultraviolet light emitting element 3 have a thickness of 1.3 µm, for example. Further, the Au film 432 of the second bonding metal layer 43 has a thickness of 1.0 µm, for example.

Figure 21:
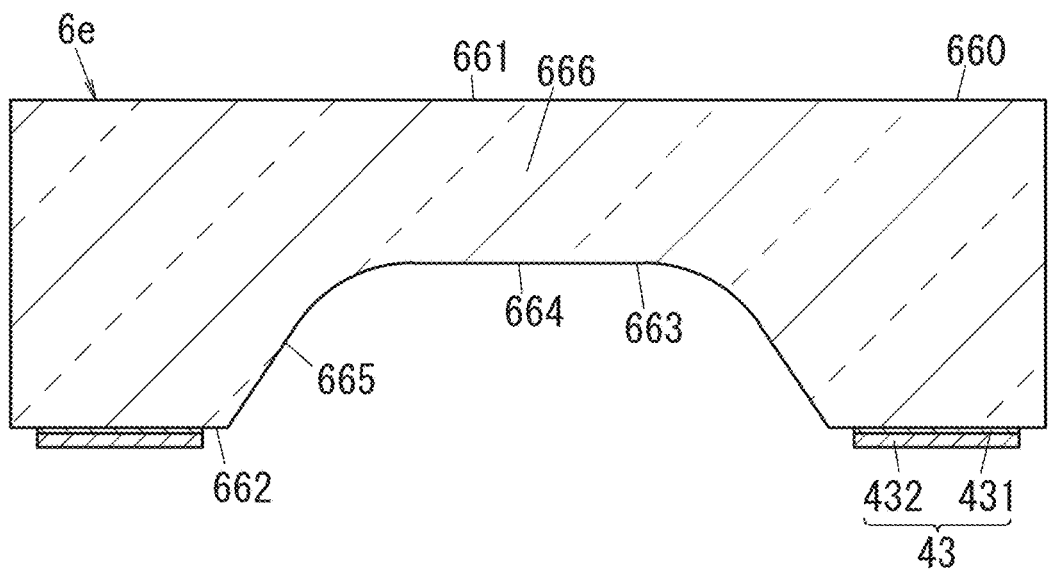
FIG. 21 is a schematic section of the first modification of the cap of Embodiment 4.

FIG. 21 is a schematic section of the first modification of the cap 6e of Embodiment 4. The cap 6e of the first modification is different from the cap 6e of Embodiment 4 in that the recess 663 of the cap body 660 is formed by blasting. Examples of the blasting may include sand blasting. In the cap 6e of the first modification, the bottom 664 of the recess 663 is like a surface of frosted glass. In other words, the bottom 664 of the recess 663 has a fine uneven structure. Further, in the cap 6e of the first modification, the recess 663 has an opening area decreasing gradually with a decrease in the distance to the deepest part of the recess 663. A method of forming the cap 6e of the first modification includes a first step of forming the second bonding metal layer 43 in a flat glass plate serving as a base for the cap body 660. The method of forming the cap 6e of the first modification includes a second step of forming the cap body 660 by forming the recess 663 in the glass plate by blasting.

Figure 22:
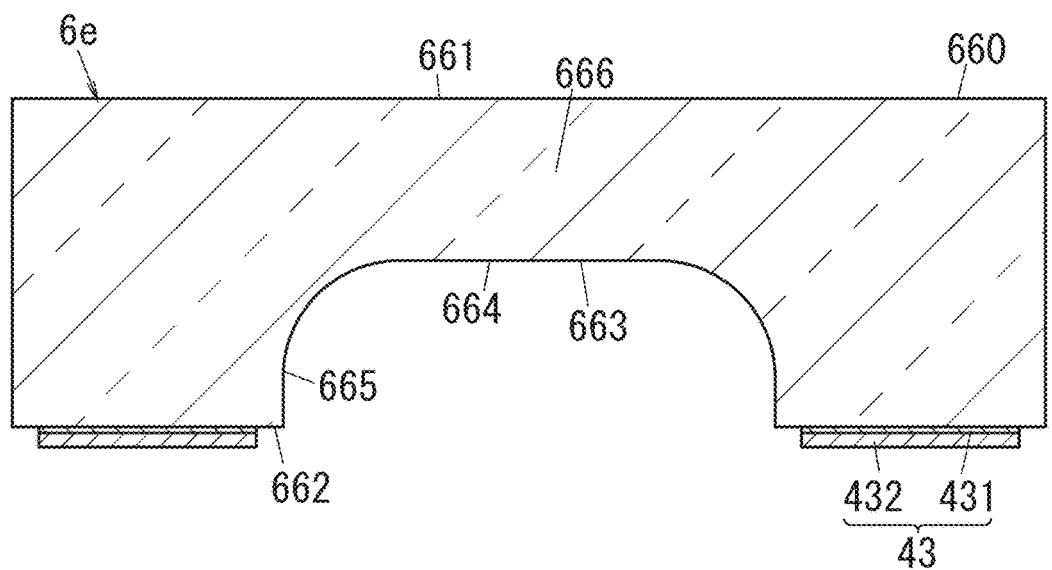
FIG. 22 is a schematic section of the second modification of the cap of Embodiment 4.

FIG. 22 is a schematic section of the second modification of the cap 6e of Embodiment 4. The cap 6e of the second modification is different from the cap 6e of Embodiment 4 in that the recess 663 of the cap body 660 is formed by wet etching. Examples of the wet etching may include isotropic etching with hydrofluoric acid. Thus, the internal side surface 665 of the recess 663 is like a surface that curves inwards in a rounded manner. A method of forming the cap 6e of the second modification includes a first step of forming the cap body 660 by forming the recess 663 in a flat glass plate serving as a base for the cap body 660 by wet etching. The method of forming the cap 6e of the second modification includes a second step of forming the second bonding metal layer 43 on the cap body 660.

Figure 23:
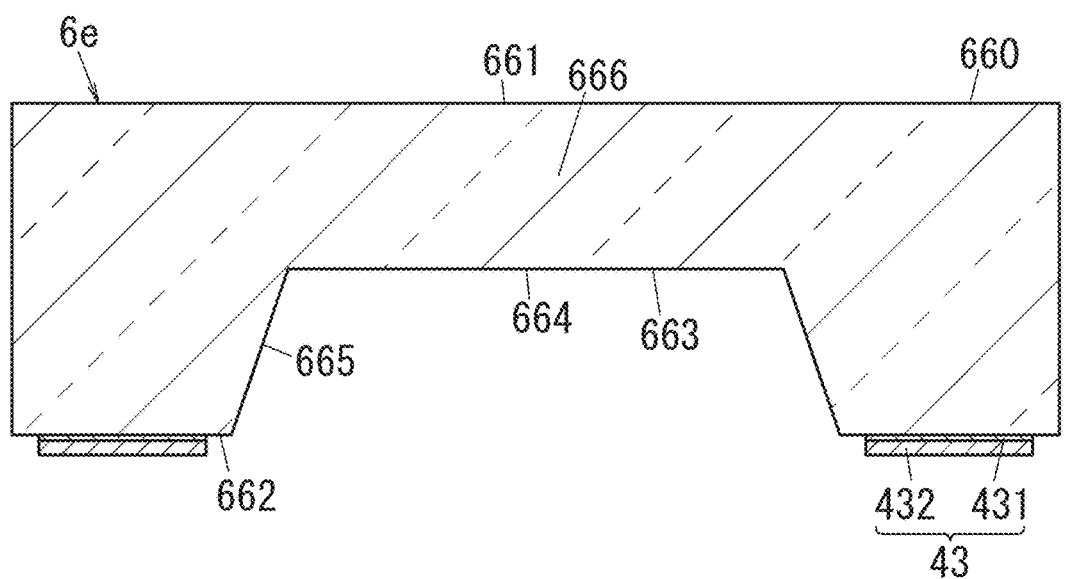
FIG. 23 is a schematic section of the third modification of the cap of Embodiment 4.

FIG. 23 is a schematic section of the third modification of the cap 6e of Embodiment 4. In the cap 6e of the third modification, the cap body 660 is formed by press molding. In other words, in this cap 6e, the recess 663 is formed at press molding of the cap body 660. Accordingly, in the cap 6e of the third modification, in consideration of facilitating mold releasing, the opening area of the recess 663 in the rear surface 662 of the cap body 660 is larger than the area of the bottom 664 of the recess 663. In other words, in the cap 6e of the third modification, the recess 663 has a tapered shape with an opening area decreasing gradually with a decrease in the distance to the deepest part of the recess 663. As for the recess 663 of the cap 6e of the third modification, examples of the tapered shape may include a shape of a truncated pyramid. A method of forming the cap 6e of the third modification includes a first step of forming the cap body 660 by press molding. The method of forming the cap 6e of the third modification includes a second step of forming the second bonding metal layer 43 on the cap body 660.

Figure 24:
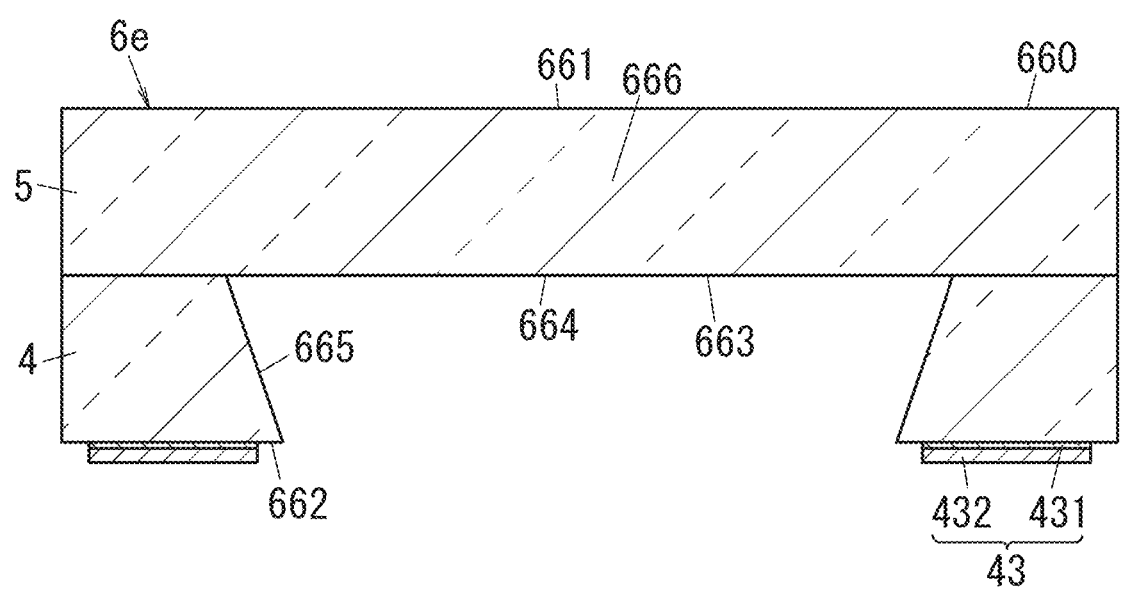
FIG. 24 is a schematic section of the fourth modification of the cap of Embodiment 4.

FIG. 24 is a schematic section of the fourth modification of the cap 6e of Embodiment 4. The cap 6e of the fourth modification is formed by bonding the cover 5 made of glass, to the spacer 4 made of glass. Accordingly, the surface of the bottom 664 of the recess 663 can be smoother in the cap 6e of the fourth modification than in the first modification, the second modification, and the third modification. In the cap 6e of the fourth modification, a whole of the cap 6e may be made of glass transmissive for ultraviolet light emitted from the ultraviolet light emitting element 3, or only the cover 5 may be made of glass transmissive for ultraviolet light emitted from the ultraviolet light emitting element 3.

Embodiment 5

Figure 25:
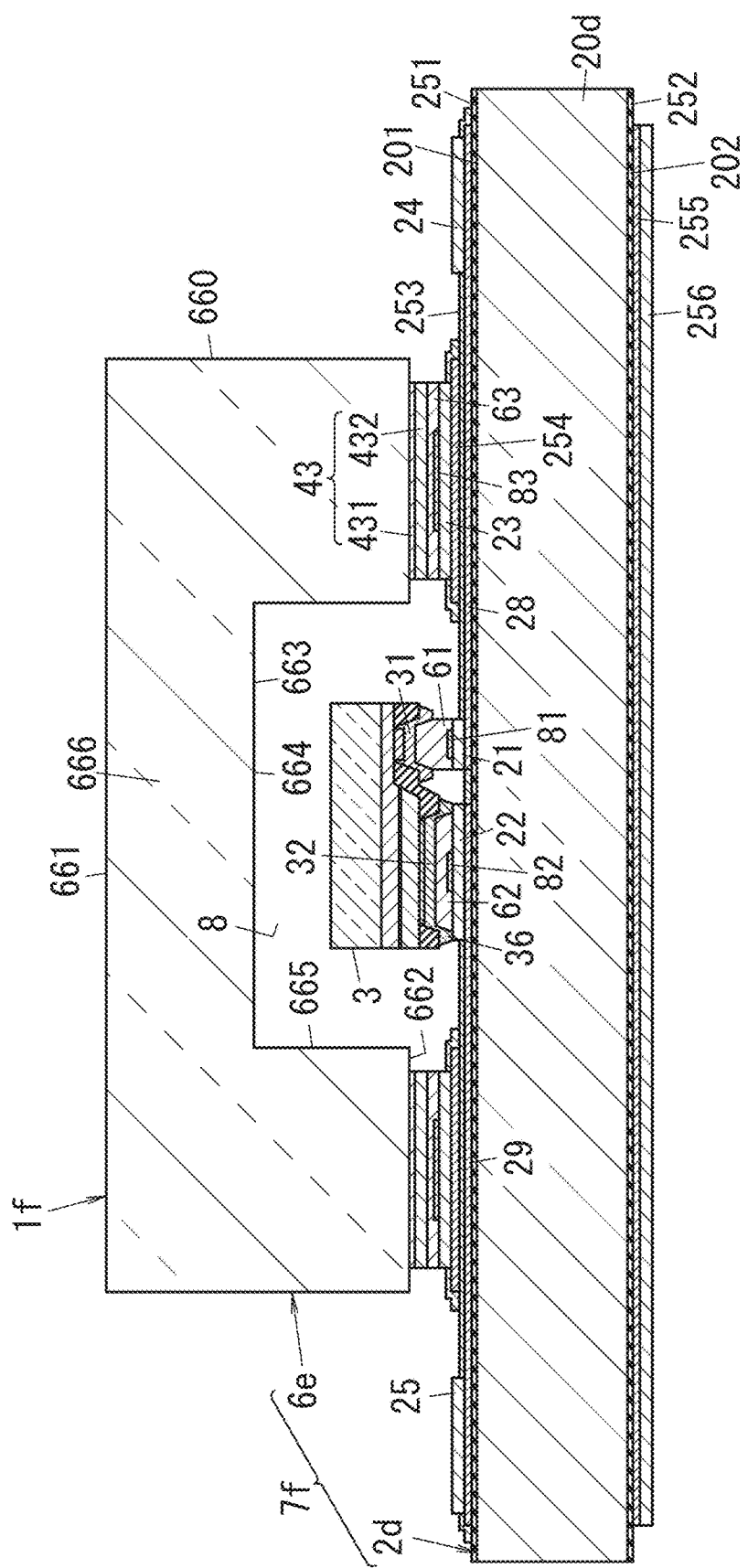
FIG. 25 is a schematic section of the light emitting device of Embodiment 5.
Figure 26:
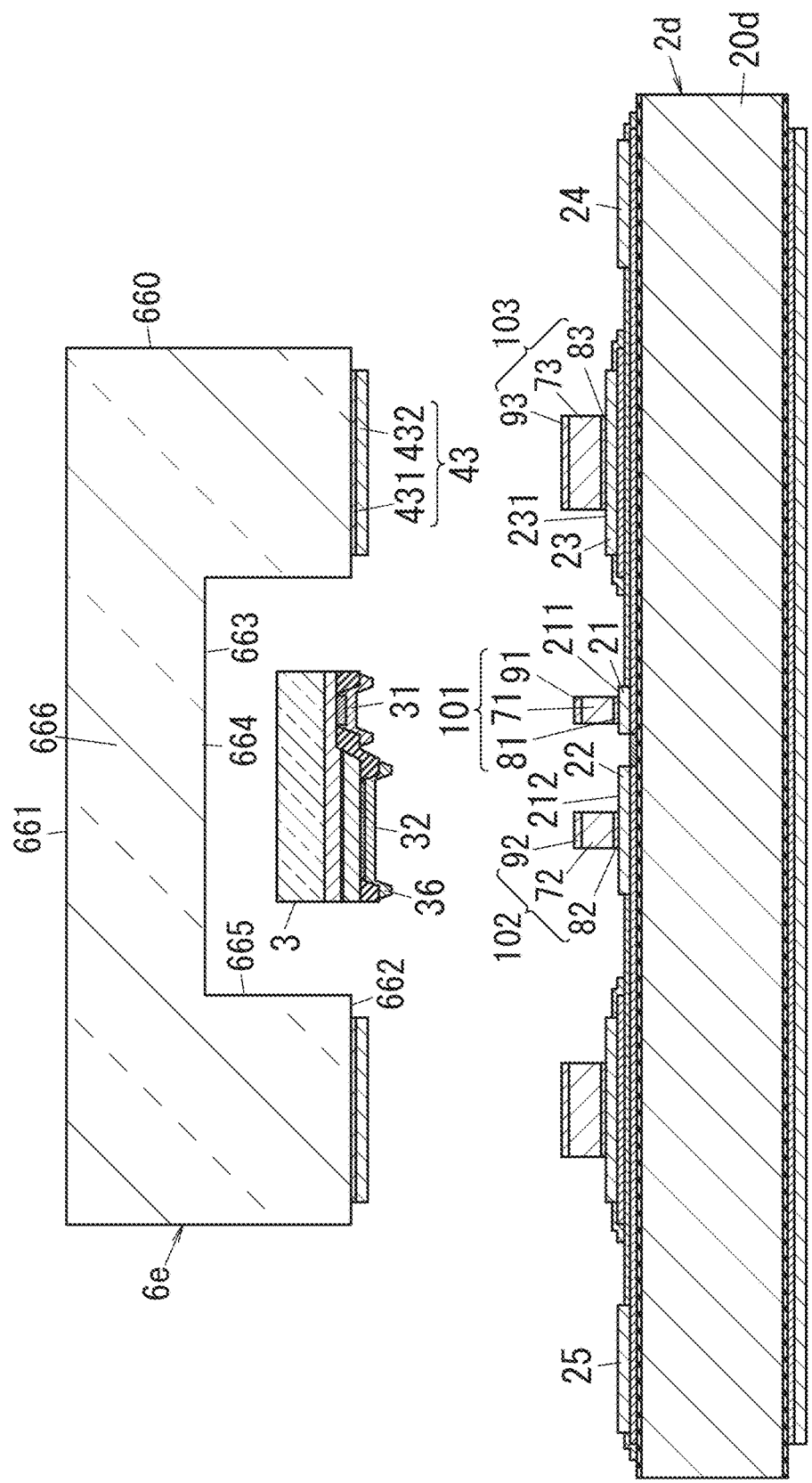
FIG. 26 is a primary section for illustration of the method for manufacturing the light emitting device of Embodiment 5.

Hereinafter, a light emitting device 1f of the present embodiment is described with reference to FIG. 25 and FIG. 26. The light emitting device 1f is different from the light emitting device 1e of Embodiment 4 in including the mounting substrate 2d instead of the mounting substrate 2a of the light emitting device 1e. Note that, components common to the light emitting device 1f and the light emitting device 1e are attached with common reference signs to avoid redundant explanations.

The light emitting device 1f includes a package 7f constituted by the cap 6e and the mounting substrate 2d, instead of the package 7e of the light emitting device 1e.

The mounting substrate 2d is a multilayered substrate. The mounting substrate 2d includes the first external connection electrode 24 and the second external connection electrode 25, and further includes the first wiring layer 28, the second wiring layer 29, and the electrically insulating layer 253. The first wiring layer 28 and the second wiring layer 29 are placed facing the front surface 201 of the support 20d. The first conductor 21 and the first external connection electrode 24 are placed on the first wiring layer 28 and electrically connected to the first wiring layer 28. The second conductor 22 and the second external connection electrode 25 are placed on the second wiring layer 29 and electrically connected to the second wiring layer 29. The electrically insulating layer 253 is placed facing the front surface of the support 20d so as to cover the first wiring layer 28 and the second wiring layer 29. The first bonding metal layer 23 is placed on the electrically insulating layer 253. Hence, for example, the light emitting device 1f can be mounted on the wiring substrate 600 (see FIG. 18) by use of the first external connection electrode 24 and the second external connection electrode 25 facing the front surface of the mounting substrate 2d.

The mounting substrate 2d includes the second electrically insulating layer 251 different from the first electrically insulating layer being the electrically insulating layer 253. The support 20d is made of Si. The second electrically insulating layer 251 is placed on the front surface 201 of the support 20d. The first wiring layer 28 and the second wiring layer 29 are placed on the second electrically insulating layer 251. Therefore, the light emitting device 1f can have heat radiation performance improved.

The mounting substrate 2d may preferably include the first foundation layer 254 between the first bonding metal layer 23 and the electrically insulating layer 253.

The mounting substrate 2d includes the fourth electrically insulating layer 252 formed on the rear surface 202 of the support 20d. Further, the mounting substrate 2d includes the second foundation layer 255 and the conductive layer 256 so that the conductive layer 256 is formed on the fourth electrically insulating layer 252 with the second foundation layer 255 in-between.

Each of the first electrically insulating layer, the second electrically insulating layer 251, the third electrically insulating layer, and the fourth electrically insulating layer 252 may be formed of, for example, a silicon oxide film.

Each of the first foundation layer 254 and the second foundation layer 255 may be formed of, for example, an Al film or the like. The first foundation layer 254 and the second foundation layer 255 are made of the same material, but may be made of different materials.

The conductive layer 256 may be formed of, for example, a laminated film of an Ni film, a Pd film, and an Au film.

Embodiment 6

As described above, in the fields of light emitting devices for emitting ultraviolet light, there is a demand to increase output of ultraviolet light.

As for the case of the light emitting device 1a of Embodiment 1, when the ultraviolet light emitting element 3 is configured to emit ultraviolet light with an emission peak wavelength with in a wavelength range of UV-C, it is preferable to adopt the product named as "8337B" available from SCHOTT AG rather than the product named as "8347" available from SCHOTT AG, in a viewpoint of improving transmissivity of ultraviolet light. The product named as "8337B" available from SCHOTT AG has a coefficient of thermal expansion larger than a coefficient of thermal expansion of Si. A difference between the coefficient of thermal expansion of the product named as "8337B" available from SCHOTT AG and the coefficient of thermal expansion of Si is larger than a difference between the coefficient of thermal expansion of the product named as "8347" available from SCHOTT AG and the coefficient of thermal expansion of Si.

In the method for manufacturing the light emitting device 1a, the method of forming the cap 6a can include, for example, performing a bonding process of forming a wafer-level bonded member by bonding the first wafer provided with the multiple spacers 4 to and the second wafer serving as a base for the multiple covers 5 at the wafer-level, and subsequently performing a dicing process of dividing the wafer-level bonded member into the multiple caps 6a by cutting the wafer-level bonded member with a dicing saw. However, in this method for manufacturing the light emitting device 1a, a production yield ratio may be lower in the case of adopting the product named as "8337B" available from SCHOTT AG as borosilicate glass for forming the second wafer, than in the case of adopting the product named as "8347" available from SCHOTT AG as borosilicate glass for forming the second wafer. In more detail, in this method for manufacturing the light emitting device 1a, the first wafer and the second wafer of the wafer-level bonded member appear to be bonded to each other. However, in the dicing process, the spacer 4 and the cover 5 are likely to separate from each other. In summary, in the method for manufacturing the light emitting device 1a, when the product named as "8337B" available from SCHOTT AG is adopted as borosilicate glass for forming the second wafer, incomplete bonding between the spacer 4 and the cover 5 may occur.

Figure 27:
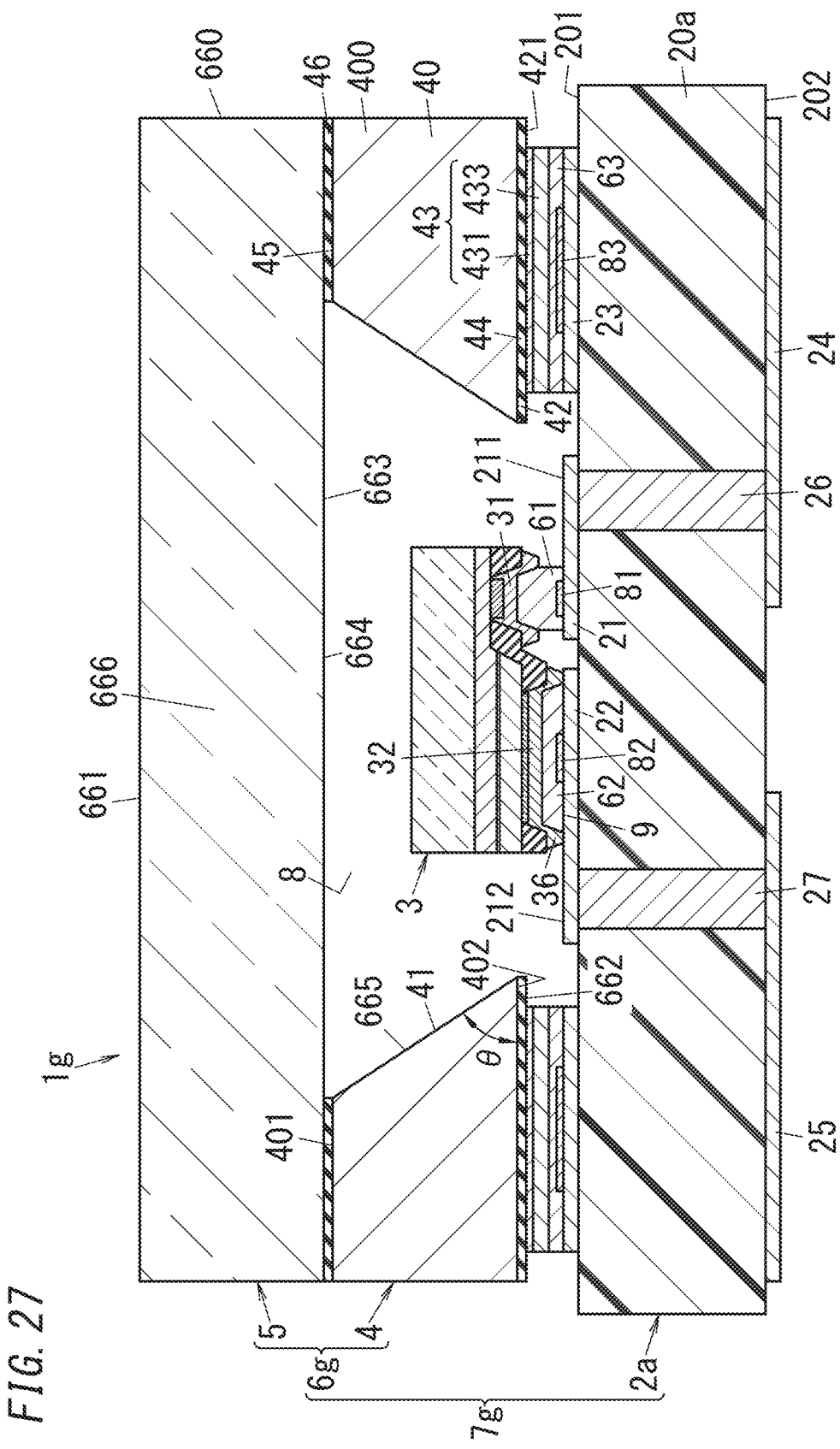
FIG. 27 is a schematic section of the light emitting device of Embodiment 6.

FIG. 27 shows a light emitting device 1g of the present embodiment which is different from the light emitting device 1a in that the spacer 4 includes a silicon oxide film 46 formed on a facing surface 45 of the spacer body 40 facing the cover 5 and that the spacer 4 and the cover 5 are boned to each other directly. The spacer body 40 has a thickness of about 0.3 mm. The cover 5 has a thickness of about 0.3 mm. The silicon oxide film 46 has a thickness of about 50 nm. The silicon oxide film 46 is of thermal oxide. In the light emitting device 1g, the glass forming the cover 5 contains an alkaline component, and the spacer 4 and the cover 5 are directly bonded. Note that, components common to the light emitting device 1g and the light emitting device 1a are attached with common reference signs to avoid redundant explanations.

In the light emitting device 1g of the present embodiment, the spacer 4 and the cover 5 constitutes a cap 6g for covering the ultraviolet light emitting element 3. Further, in the light emitting device 1g, the mounting substrate 2a and the cap 6g constitutes a package 7g for accommodating the ultraviolet light emitting element 3.

The light emitting device 1g of the present embodiment includes: the mounting substrate 2a; the ultraviolet light emitting element 3 mounted on the mounting substrate 2a; and the cap 6g placed on the mounting substrate 2a and including the recess 663 for accommodating the ultraviolet light emitting element 3. The cap 6g includes: the spacer 4 placed on the mounting substrate 2a and including the through hole 41 for exposing the ultraviolet light emitting element 3; and the cover 5 placed on the spacer 4 to cover the through hole 41 of the spacer 4 and bonded to the spacer 4. The cover 5 is made of borosilicate glass transmissive for ultraviolet light emitted from the ultraviolet light emitting element 3. The spacer 4 includes the spacer body 40 made of Si, and the silicon oxide film 46 formed on the facing surface 45 of the spacer body 40 facing the cover 5. The spacer 4 and the cover 5 are bonded directly. In the light emitting device 1g with the aforementioned configuration, the cover 5 can be made of borosilicate glass with higher in transmissivity for ultraviolet light emitted from the ultraviolet light emitting element 3, and therefore the output of ultraviolet light can be increased.

The second bonding metal layer 43 may be preferably formed of, for example, a laminated film of the foundation film 431 and a bonding layer 433. The foundation film 431 may be formed of, for example, an Al film. The bonding layer 433 may be formed of, for example, a laminated film of an Ni film and an Au film.

Figure 28:
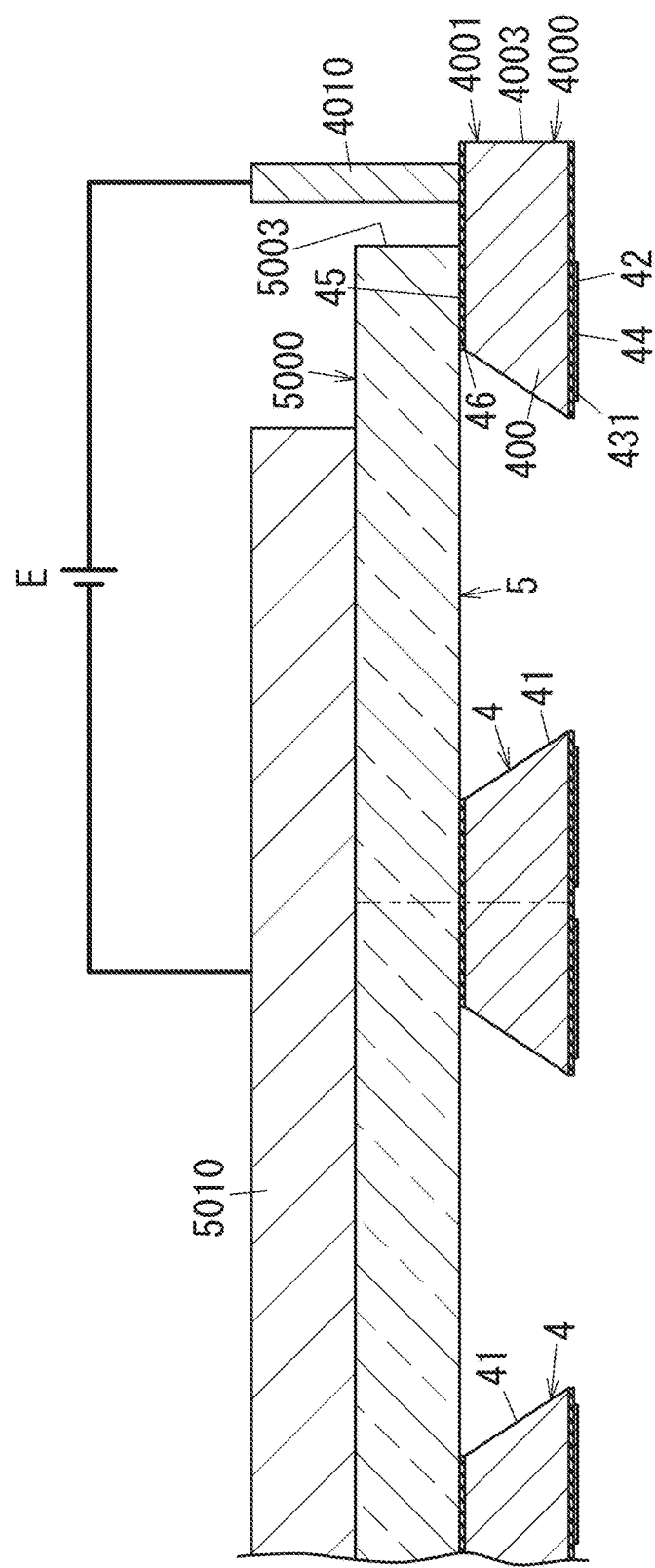
FIG. 28 is a primary section for illustration of the method for manufacturing the light emitting device of Embodiment 6.

The method for manufacturing the light emitting device 1g of the present embodiment is almost same as the method for manufacturing the light emitting device 1a described in relation to Embodiment 1, but is different in only that the process of forming the spacer 4 includes forming the silicon oxide film 46 on the facing surface 45 of the spacer 4 facing the cover 5 and subsequently bonding the spacer 4 and the cover 5 to each other directly. In the process of bonding the spacer 4 to the cover 5 by anodic bonding, for example, as shown in FIG. 28, a first wafer 4001 provided with the multiple spacers 4 and the second wafer 5000 for forming the multiple covers 5 are stacked, and subsequently an electrode 4010 is placed on exposed part of the front surface of the silicon oxide film 46 and an electrode 5010 is placed on the second wafer 5000. Thereafter, under a condition where the first wafer 4001 and the second wafer 5000 are heated at a predetermined temperature (for example, 305° C.), a DC voltage with a predetermined voltage value (for example, 600 V) is applied between the electrode 4010 and the electrode 5010 from a DC power supply E for a predetermined length of time (for example, 30 minutes) with the electrode 4010 used as an anode. Note that, in FIG. 28, a boundary between adjacent spacers 4 is schematically illustrated by a dashed-dotted line. Further, in FIG. 28, a boundary between adjacent covers 5 is also schematically illustrated by a dashed-dotted line. The first wafer 4001 is a wafer prepared by forming the silicon oxide film 46, the silicon oxide film 44, the foundation film 431, and the through hole 41 on/over an Si wafer 400 serving as a base for the single-crystalline Si substrate 400. The second wafer 5000 is made of borosilicate glass. The second wafer 5000 has a diameter equal to a diameter of the Si wafer 4000. A flat surface 5003 provided to part of a side surface of the second wafer 5000 has a width (dimension in a direction perpendicular to the sheet of FIG. 28) which is larger than a width of a flat surface (orientation flat) 4003 provided to part of a side surface of the Si wafer 4000. Hence, when the first wafer 4001 and the second wafer 5000 are stacked, the first wafer 4001 is partially exposed when viewed from the first wafer 5000 side.

The method for manufacturing the light emitting device 1g is defined as a method for manufacturing the light emitting device 1g including the following components.

The light emitting device 1g includes: the mounting substrate 2a; the ultraviolet light emitting element 3 mounted on the mounting substrate 2a; and the cap 6g placed on the mounting substrate 2a and including the recess 663 for accommodating the ultraviolet light emitting element 3. The cap 6g includes: the spacer 4 placed on the mounting substrate 2a and including the through hole 41 for exposing the ultraviolet light emitting element 3; and the cover 5 placed on the spacer 4 to cover the through hole 41 of the spacer 4 and bonded to the spacer 4. The cover 5 is made of borosilicate glass transmissive for ultraviolet light emitted from the ultraviolet light emitting element 3. The spacer 4 includes the spacer body 40 made of Si, and the silicon oxide film 46 formed on the facing surface 45 of the spacer body 40 facing the cover 5. The spacer 4 and the cover 5 are bonded directly.

The method for manufacturing the light emitting device 1g includes: forming the wafer-level bonded member by directly bonding the first wafer 4001 provided with a plurality of the spacers 4 to the second wafer 5000 allowing formation of a plurality of the covers 5, by anodic bonding; subsequently forming the cap 6g by dicing the wafer-level bonded member; and subsequently bonding the cap 6g to the mounting substrate 2a on which the ultraviolet light emitting element 3 is mounted. Therefore, the method for manufacturing the light emitting device 1g can offer advantageous effects of facilitating manufacturing the light emitting device 1g capable of increasing output of ultraviolet light. Further, the method for manufacturing the light emitting device 1g can offer advantageous effects of improving the production yield ratio, and reducing production cost. Note that, in the method for manufacturing the light emitting device 1g, the bonding layer 433 is not formed on the foundation film 431 of the spacer 4 before formation of the wafer-level bonded member. Further, in the method for manufacturing the light emitting device 1g, the foundation film 431 is subjected to zincate treatment after formation of the wafer-level bonded member but before dicing the wafer-level bonded member, and subsequently the bonding layer 433 formed of a laminated film of an Ni film and an Au film is formed on the foundation film 431 by electroless plating.

The present inventors formed the wafer-level bonded member by bonding the first wafer to the second wafer formed of the product named as "8337B" available from SCHOTT AG, by anodic bonding, in line with the method for manufacturing the light emitting device 1a of Embodiment 1, and observed an interface between the first wafer and the second wafer from the front surface side of the second wafer with an optical microscope. As a result, voids with sizes causing problems were not observed, and the first wafer and the second wafer appeared to be bonded to each other. Note that, the Si wafer serving as a base for the first wafer has a thickness of 0.3 mm. Further, the second wafer has a thickness in a range of 0.3 to 0.5 mm.

However, when this wafer-level bonded member is diced with a dicing saw, the spacer 4 and the cover 5 are likely to separate from each other.

In contrast, according to the method for manufacturing the light emitting device 1g, the spacer 4 and the cover 5 do not separate from each other even when the wafer-level bonded member is diced with a dicing saw.

Figure 29:
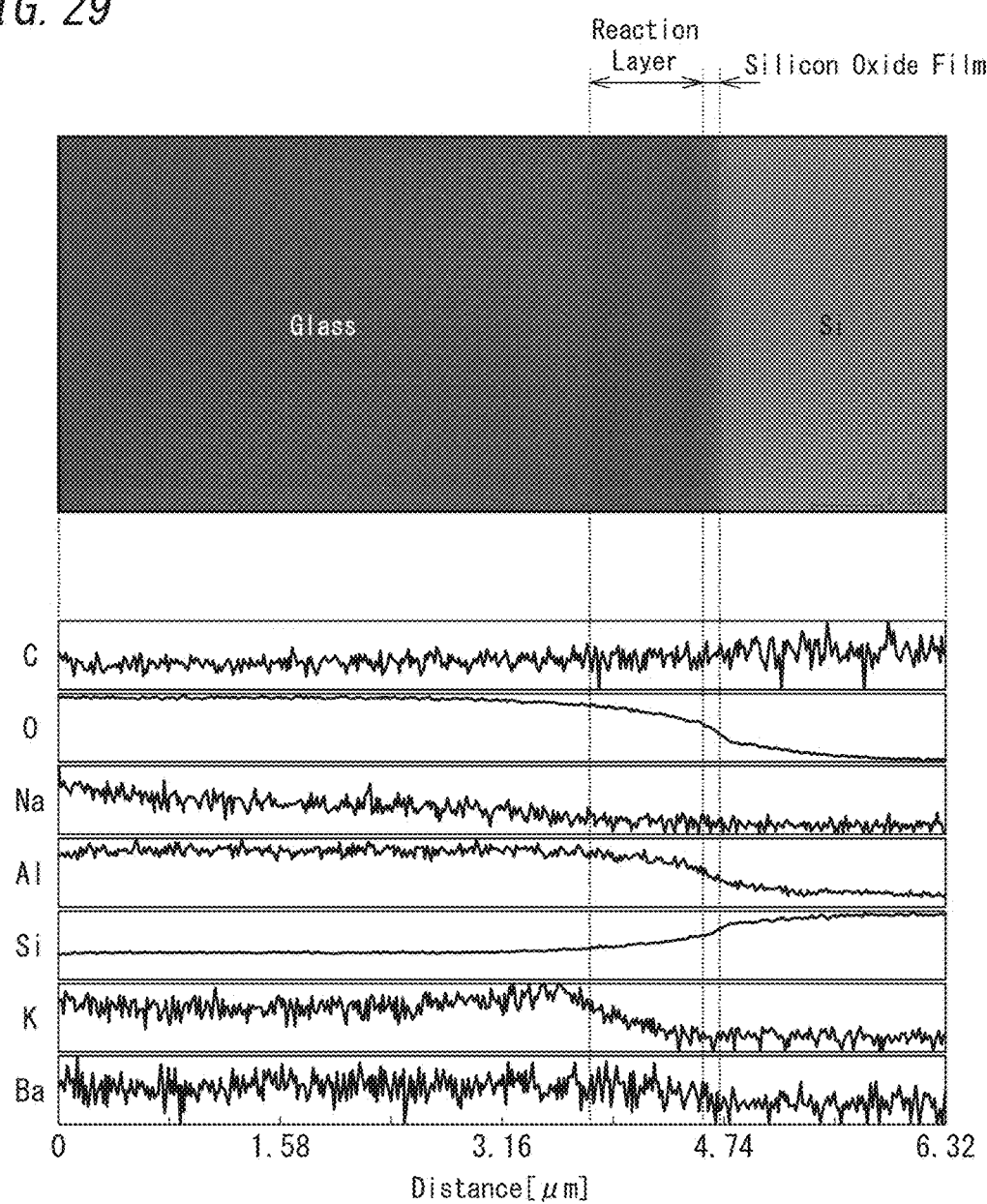
FIG. 29 is an explanatory diagram of a result of cross section observation of the cap with SEM (scanning electron microscope) and a result of composition analysis of the cap by EDX (energy dispersive x-ray spectroscopy).

FIG. 29 is a diagram of illustrating collectively results of composition analysis based on SEM images and EDX. In the composition analysis based on EDX, a depth distribution was examined for each of C, O, Na, Al, Si, K, and Ba. In this regard, the term "depth distribution" means a depth distribution of an element (C, O, Na, Al, Si, K and Ba) based on a reference position which is a position in the cover 5 at a distance of about 4.73 μm from the interface between the spacer body 40 and the silicon oxide film 46. The depth direction is defined as a direction from the reference position toward the spacer body 40. According to the results of observation based on SEM and analysis based on EDX, the present inventors confirmed that movement of K occurred near the front surface of the silicon oxide film 46 and a reaction layer with a thickness of about 350 nm was formed at part of the cover 5 closer to the silicon oxide film 46. The present inventors considered that the spacer 4 and the cover 5 were bonded to each other because the silicon oxide film 46 served as an adhesive layer between the Si wafer 4000 and the second wafer 5000.

The present inventors prepared multiple wafer-level bonded members including the silicon oxide film 46 with different thicknesses and experienced to observe bonding states of the multiple wafer-level bonded members with an optical microscope, SEM, and the like. In this regard, the different thicknesses of the silicon oxide films 46 were 0 nm, 25 nm, 40 nm, 50 nm, 80 nm, 100 nm, and 300 nm. The different thicknesses of the silicon oxide films 46 were measured with an ellipsometer.

As a result of experiment, the present inventors found that the cover 5 and the spacer 4 separated from each other in dicing with regard to the wafer-level bonded member with the silicon oxide films 46 having thicknesses of 0 nm, 25 nm, and 40 nm. Further, as a result of experiment, the present inventors found that the cover 5 and the spacer 4 did not separate from each other in dicing with regard to the wafer-level bonded member with the silicon oxide films 46 having thicknesses of 50 nm, 80 nm, 100 nm, and 300 nm. Hence, the bonding states of the wafer-level bonded members were evaluated by observing the sections of the wafer-level bonded members with SEM. As a result of observation with SEM, the present inventors determined that the bonding state of the wafer-level bonded member was fine when no void was observed in the interface between the silicon oxide film 46 and the cover 5 but the reaction layer was observed.

Further, the present inventors conducted a heat cycle test for examining thermal shock resistance of the wafer-level bonded members including the silicon oxide film 46 with thicknesses of 50 nm or more. In the heat cycle test, a temperature for a lower temperature period was −40° C., and a temperature for a higher temperature period was 105° C., and the number of cycles of heat cycle was 100.

According to the results of the above experiments, the present inventors found that each of the bonding state of the wafer-level bonded member, resistance to dicing, and thermal shock resistance was fine when the silicon oxide film 46 has a thickness of 50 nm or more.

In the light emitting device 1g, the silicon oxide film 46 may be preferably formed of thermal oxide. In this case, reliability can be improved more in the light emitting device 1g than in a case where the silicon oxide film 46 is a silicon oxide firm made by CVD.

In the light emitting device 1g, the silicon oxide film 46 may preferably have a thickness of 50 nm or more. In this case, the light emitting device 1g can offer advantageous effects of improving the production yield ratio, thereby reducing production cost. In consideration of improving the production yield ratio of the light emitting device 1g, the silicon oxide film 46 may preferably have a thickness of 80 μm or more. Note that, the voltage value of the DC voltage applied in anodic bonding is required to be increased with an increase in the thickness of the silicon oxide film 46, and therefore the thickness of the silicon oxide film 46 may be preferably equal to or smaller than 1 μm and more preferably equal to or smaller than 300 nm.

The cap 6g of the light emitting device 1g of the present embodiment can be used as an alternative to the cap 6a of the other light emitting devices 1b, 1d, or the like.

First Example

Figure 30:
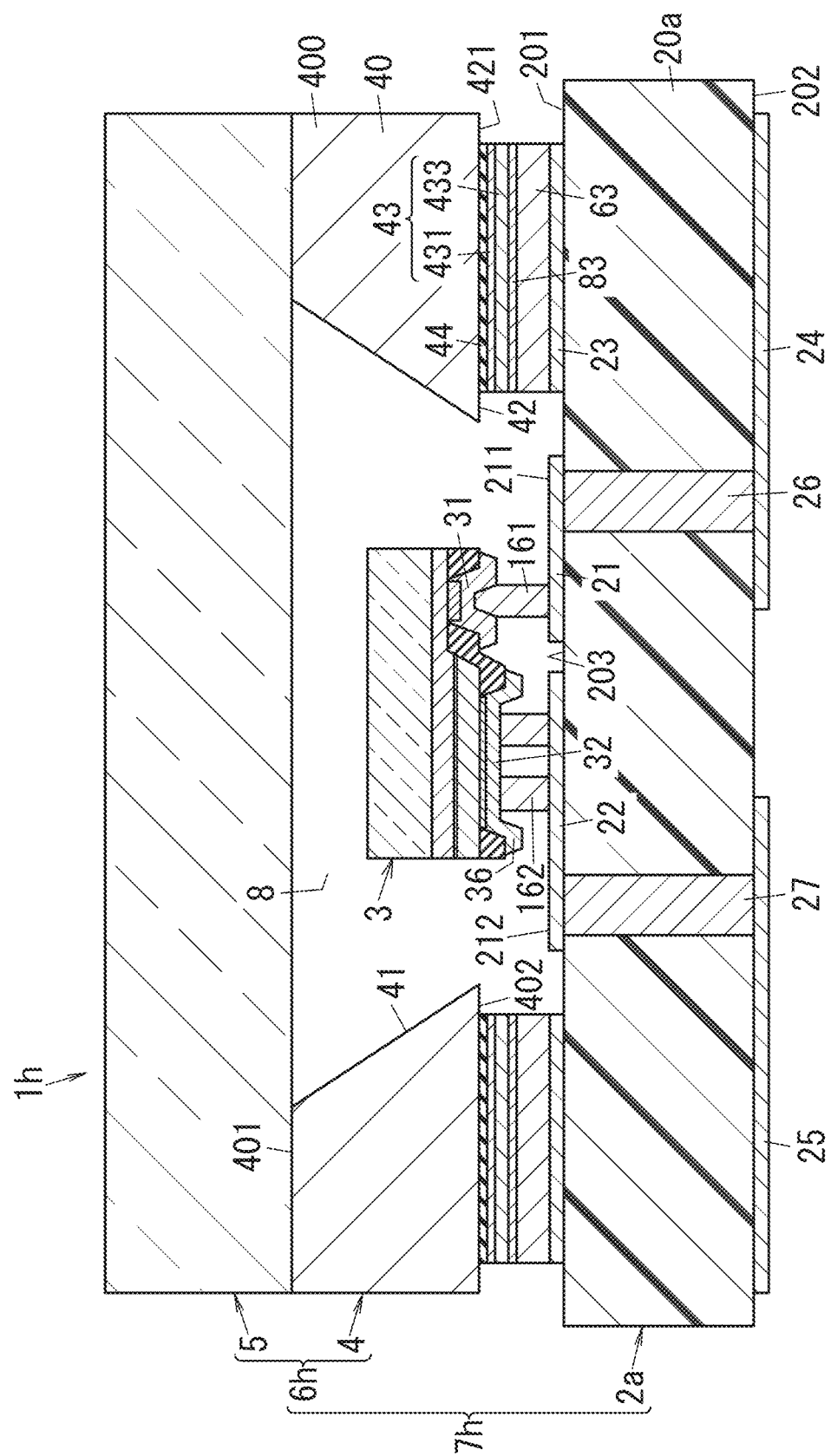
FIG. 30 is a schematic section of the light emitting device of the first example.
Figure 31:
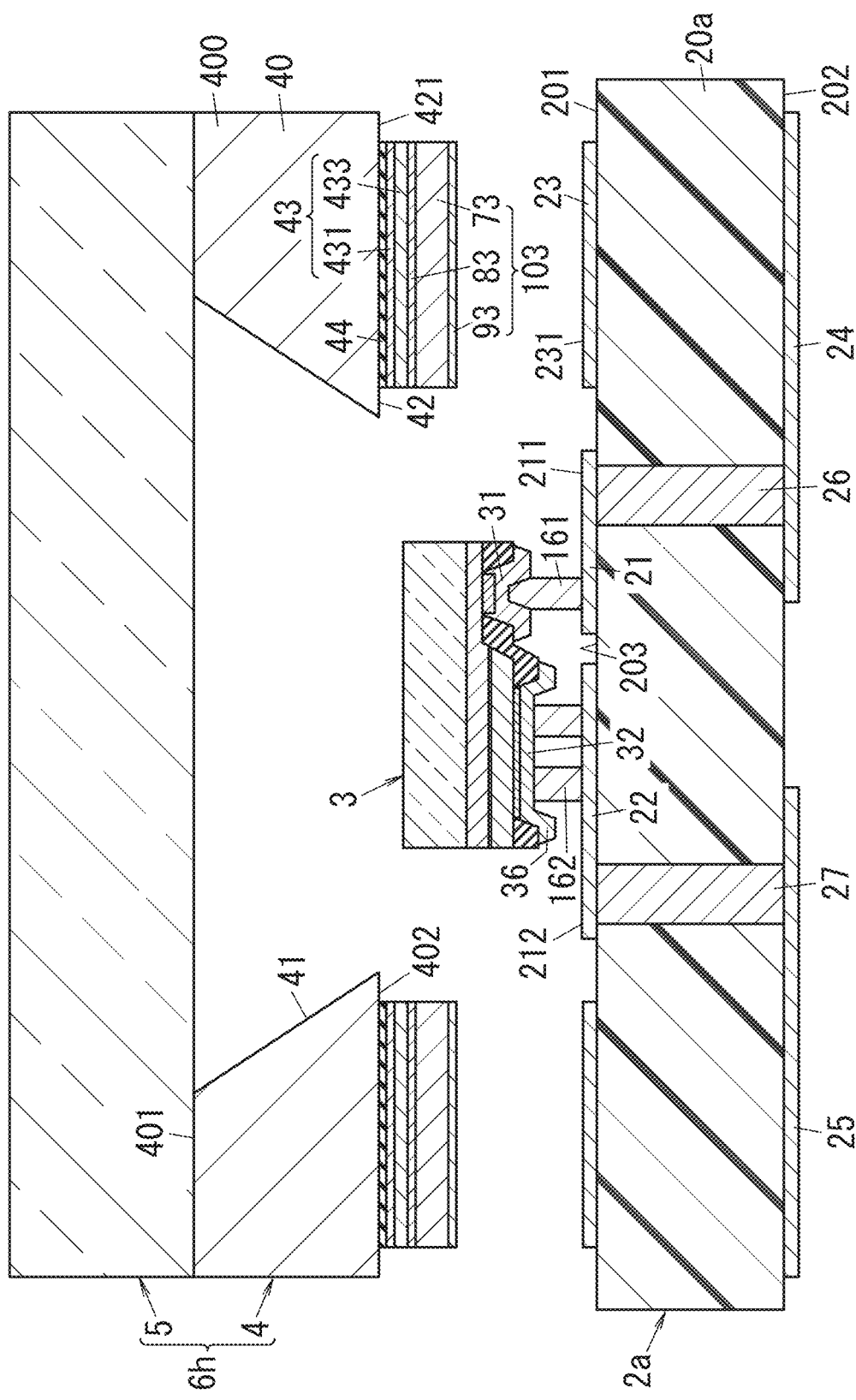
FIG. 31 is a primary section for illustration of the method for manufacturing the light emitting device of the first example.

Hereinafter, a light emitting device 1h of the first example is described with reference to FIG. 30 and FIG. 31. The light emitting device 1h is different from the light emitting device 1a of Embodiment 1 in that the first electrode 31 and the second electrode 32 of the ultraviolet light emitting element 3 are bonded to the first conductor 21 and the second conductor 22 of the mounting substrate 2a with a bond 161 formed of an Au bump and a bond 162 formed of an Au bump, respectively. Additionally, the light emitting device 1h is different from the light emitting device 1a in that the third barrier layer 83 is between the second bonding metal layer 43 and the third bond 63 of the spacer 4. Note that, components common to the light emitting device 1h and the light emitting device 1a are attached with common reference signs to avoid redundant explanations.

The Au bump may preferably be a stud bump formed by stud bumping (also referred to as ball bumping) on/over the mounting substrate 2a. In the light emitting device 1h, the first electrode 31 has a planar size larger than a planar size of the second electrode 32, and therefore it is preferable to provide multiple bonds 162 to the second electrode 32. This can lead to improvement of heat radiation performance of the light emitting device 1h compared to a case where one bond 162 is provided.

The second bonding metal layer 43 may be preferably formed of, for example, a laminated film of the foundation film 431 and the bonding layer 433. The foundation film 431 may be formed of, for example, an Al film. The bonding layer 433 may be formed of, for example, a laminated film of an Ni film, a Pd film, and an Au film.

In the light emitting device 1h, the spacer 4 and the cover 5 constitute a cap 6h for covering the ultraviolet light emitting element 3. Further, in the light emitting device 1h, the mounting substrate 2a and the cap 6h constitute a package 7h for accommodating the ultraviolet light emitting element 3.

Note that, Document 1 discloses that the spacer can be made of a silicon substrate or electrically insulating resin. Further, Document 1 discloses reflective metal films of Ag or Al may be preferably formed on side surfaces of the cavity to achieve sufficient effects of reflection of light by the side surfaces of the cavity.

Additionally, Document 3 discloses that there has been proposed, as light emitting devices, an optoelectronics element including a carrier, an optoelectronics semiconductor chip being a light emitting diode mounted on a main surface of the carrier, and an optical part mounted on the carrier. The carrier is a printed circuit substrate or a ceramic substrate. The optical part includes a frame, and a glass plate. The frame is made of silicon. The glass plate transmits radiation emitted from the optoelectronics semiconductor chip.

In fields of light emitting devices for emitting ultraviolet light, there may be a demand to increase output of ultraviolet light.

The light emitting device 1h includes the mounting substrate 2a, the ultraviolet light emitting element 3 mounted on the mounting substrate 2a, the spacer 4 placed on the mounting substrate 2a and including the through hole 41 for exposing the ultraviolet light emitting element 3, and the cover 5 placed on the spacer 4 to cover the through hole 41 of the spacer 4. The ultraviolet light emitting element 3 is configured to emit ultraviolet light with an emission peak wavelength within an ultraviolet wavelength range. The spacer 4 includes the spacer body 40 made of Si. The through hole 41 is formed in the spacer body 40. The through hole 41 has an opening area which gradually increases with an increase in the distance from the mounting substrate 2a. The cover 5 is made of glass transmissive for ultraviolet light emitted from the ultraviolet light emitting element 3. In the light emitting device 1h, the spacer 4 and the cover 5 are bonded to each other. The light emitting device 1h with such configuration can offer advantageous effects of increasing output of ultraviolet light.

Hereinafter, the method for manufacturing the light emitting device 1h is described briefly. Note that, the method for manufacturing the light emitting device 1h includes similar processes to the method for manufacturing the light emitting device 1a and such similar processes are omitted appropriately to avoid redundant explanations.

The method for manufacturing the light emitting device 1h may include, for example, the following first process, second process, third process and fourth process which are performed sequentially.

The first process includes forming the foundation film 431 of an Al film on the silicon oxide film 44 of the spacer 4, and subsequently forming a cap 6h by directly bonding the cover 5 and the spacer 4 by anodic bonding.

The second process includes subjecting the foundation film 431 of the cap 6e to zincate treatment, and subsequently forming the bonding layer 433 of a laminated film of an Ni film, a Pd film, and an Au film on the foundation film 431 by electroless plating. The second process includes forming the third barrier layer 83 of, for example, a Pt film on the bonding layer 433 subsequent to forming the bonding layer 433, and forming the third barrier layer 83 of, for example, a Pt film on the bonding layer 433, and thereafter forming the third AuSn layer 73 on the third barrier layer 83 by electroless plating, and subsequently forming the third Au layer 93 on the third AuSn layer 73 by electroless plating. The third barrier layer 83, the third AuSn layer 73, and the third Au layer 93 constitute the third bonding layer 103.

The aforementioned first process and second process may be preferably performed at the wafer-level. In the second process, after formation of the third Au layer 93, a structure prepared by bonding a first wafer provided with the multiple spacers 4, to a second wafer serving as a base for the multiple covers 5 may be preferably divided into the multiple caps 6h.

The third process includes bonding the first electrode 31 and the second electrode 32 of the ultraviolet light emitting element 3, to the first conductor 21 and the second conductor 22 of the mounting substrate 2a, with the bond 161 formed of an Au bump and the bond 162 formed of an Au bump, respectively. In the third process, flip-chip mounting is performed to mount the ultraviolet light emitting element 3 on the mounting substrate 2a by use of ultrasonic waves.

The fourth process includes bonding the cap 6h to the mounting substrate 2a by performing the first step and the second step sequentially. In the first step of the fourth process, the second bonding metal layer 43 of the cap 6h held by the second suction holder by suction is made to face the first bonding metal layer 23 of the mounting substrate 2d. In more detail, in the first step, the third bonding layer 103 on the second bonding metal layer 43 is made to face the first bonding metal layer 23. In the second step of the fourth process, the second bonding metal layer 43 of the cap 6h and the first bonding metal layer 23 of the mounting substrate 2a are bonded to each other with the third AuSn layer 73. In the second step, the cap 6h is placed on the mounting substrate 2a so that the third bonding layer 103 is in contact with the first bonding metal layer 23 under a condition where the mounting substrate 2a is heated to a temperature equal to or higher than a melting point of the third AuSn layer 73 with the first heater and the cap 6h is kept to have a temperature lower than the melting point of the third AuSn layer 73. Further, in the second step, the third AuSn layer 73 is melted with the cap 6h being pressed, and thereafter the third AuSn layer 73 is solidified by cooling to form the third bond 63. The second step may be preferably conducted under an $N_2$ gas atmosphere.

According to the method for manufacturing the light emitting device 1h, the first process, the second process, the third process, and the fourth process are performed sequentially, and thereby the light emitting device 1h can be obtained.

Second Example

Figure 32:
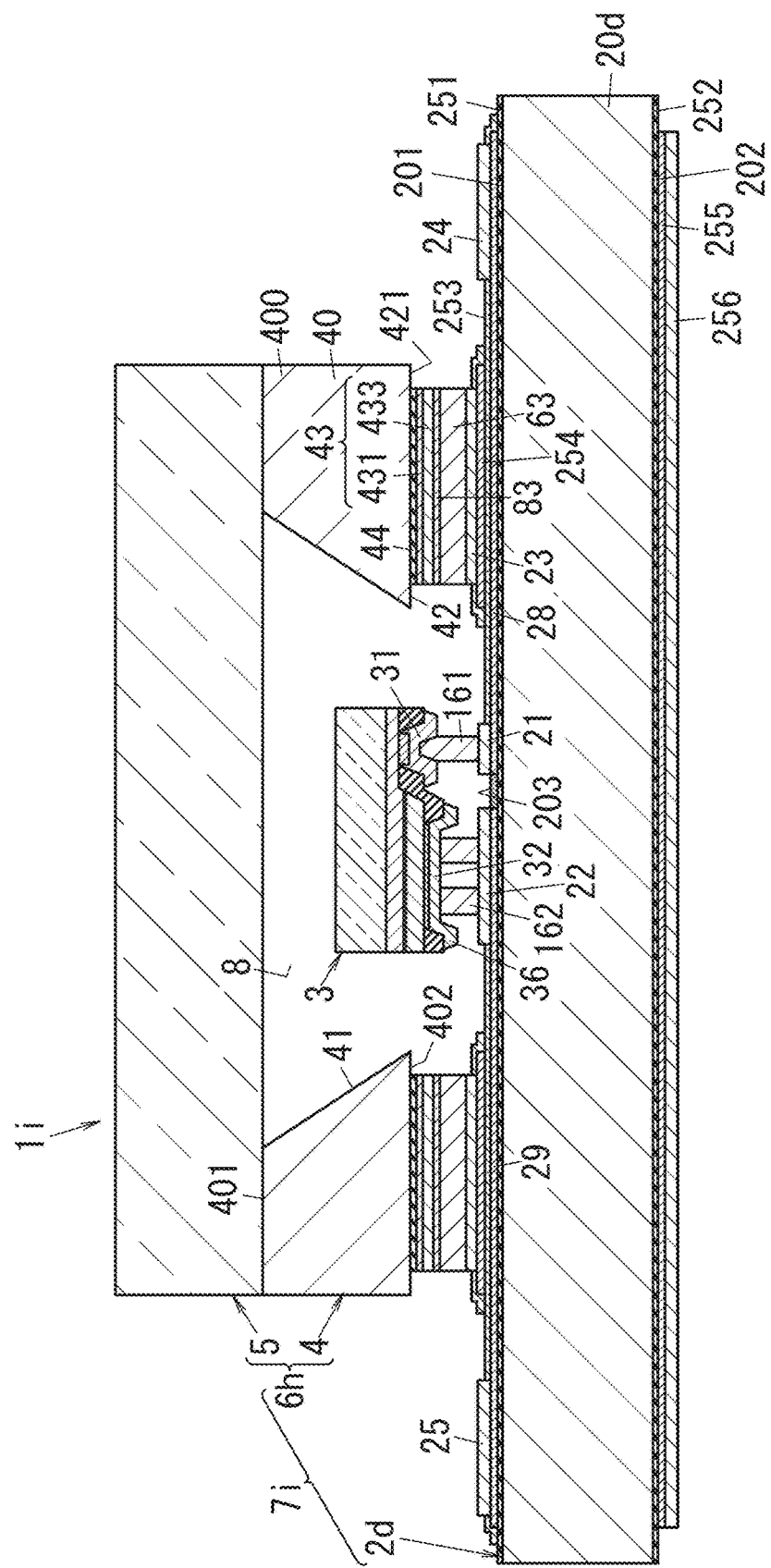
FIG. 32 is a schematic section of the light emitting device of the second example.
Figure 33:
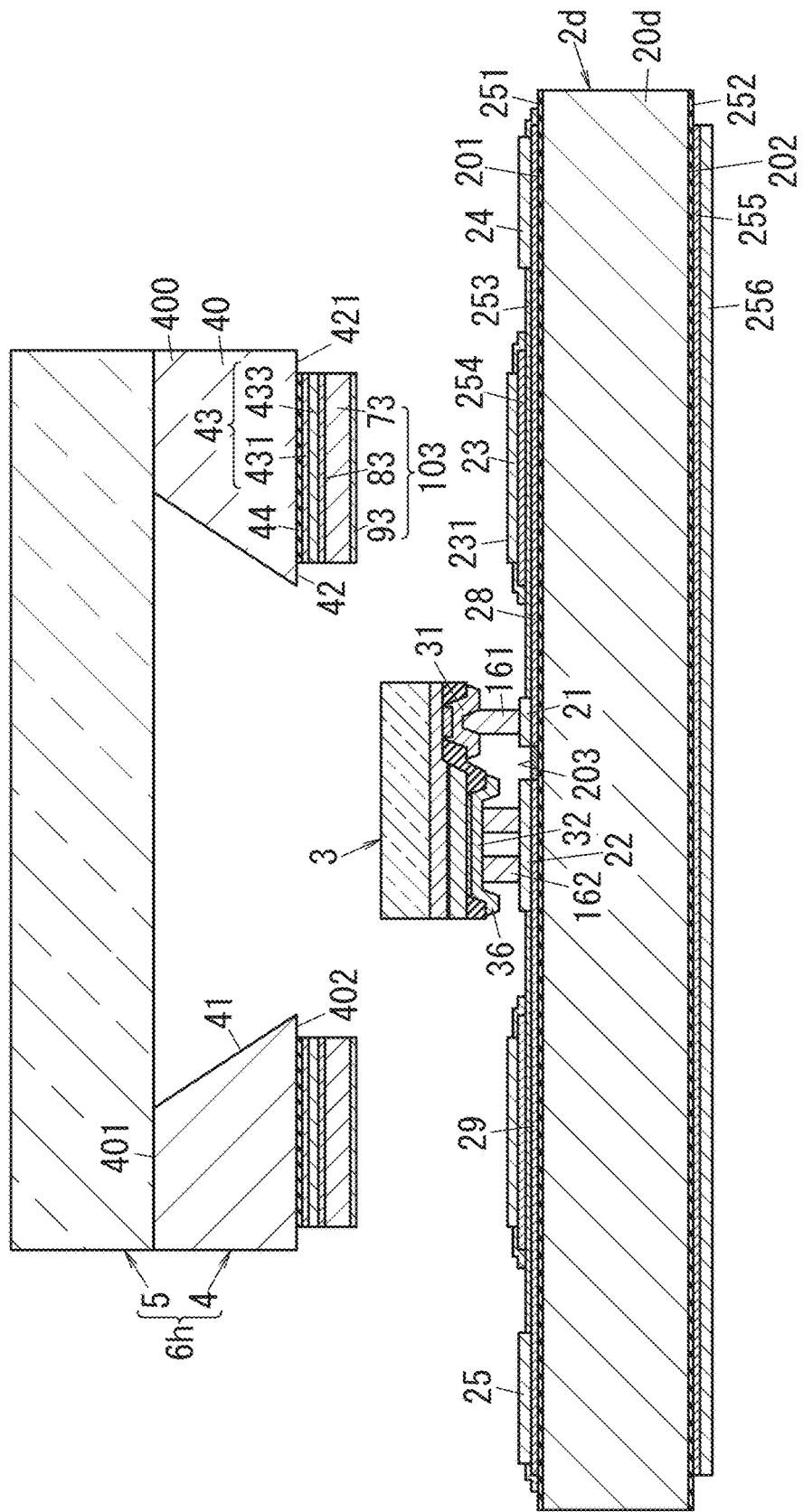
FIG. 33 is a primary section for illustration of the method for manufacturing the light emitting device of the second example.

Hereinafter, a light emitting device 1i of the present embodiment is described with reference to FIG. 32 and FIG. 33. The light emitting device 1i is different from the light emitting device 1d of Embodiment 3 in that the first electrode 31 and the second electrode 32 of the ultraviolet light emitting element 3 are bonded to the first conductor 21 and the second conductor 22 of the mounting substrate 2d with the bond 161 formed of an Au bump and the bond 162 formed of an Au bump, respectively. Additionally, the light emitting device 1i is different from the light emitting device 1d in that the third barrier layer 83 is between the second bonding metal layer 43 and the third bond 63 of the spacer 4. Note that, components common to the light emitting device 1i and the light emitting device 1d are attached with common reference signs to avoid redundant explanations.

The Au bump may preferably be a stud bump formed by stud bumping. In the light emitting device 1i, the first electrode 31 has a planar size larger than a planar size of the second electrode 32, and therefore it is preferable to provide multiple bonds 162 to the second electrode 32. This can lead to improvement of heat radiation performance of the light emitting device 1i compared to a case where one bond 162 is provided.

In the light emitting device 1i, the spacer 4 and the cover 5 constitute the cap 6h for covering the ultraviolet light emitting element 3. Further, in the light emitting device 1i, the mounting substrate 2d and the cap 6h constitute a package 7i for accommodating the ultraviolet light emitting element 3.

The method for manufacturing the light emitting device 1i is almost same as the method for manufacturing the light emitting device 1h and therefore explanations thereof are omitted.

Embodiment 7

Figure 34:
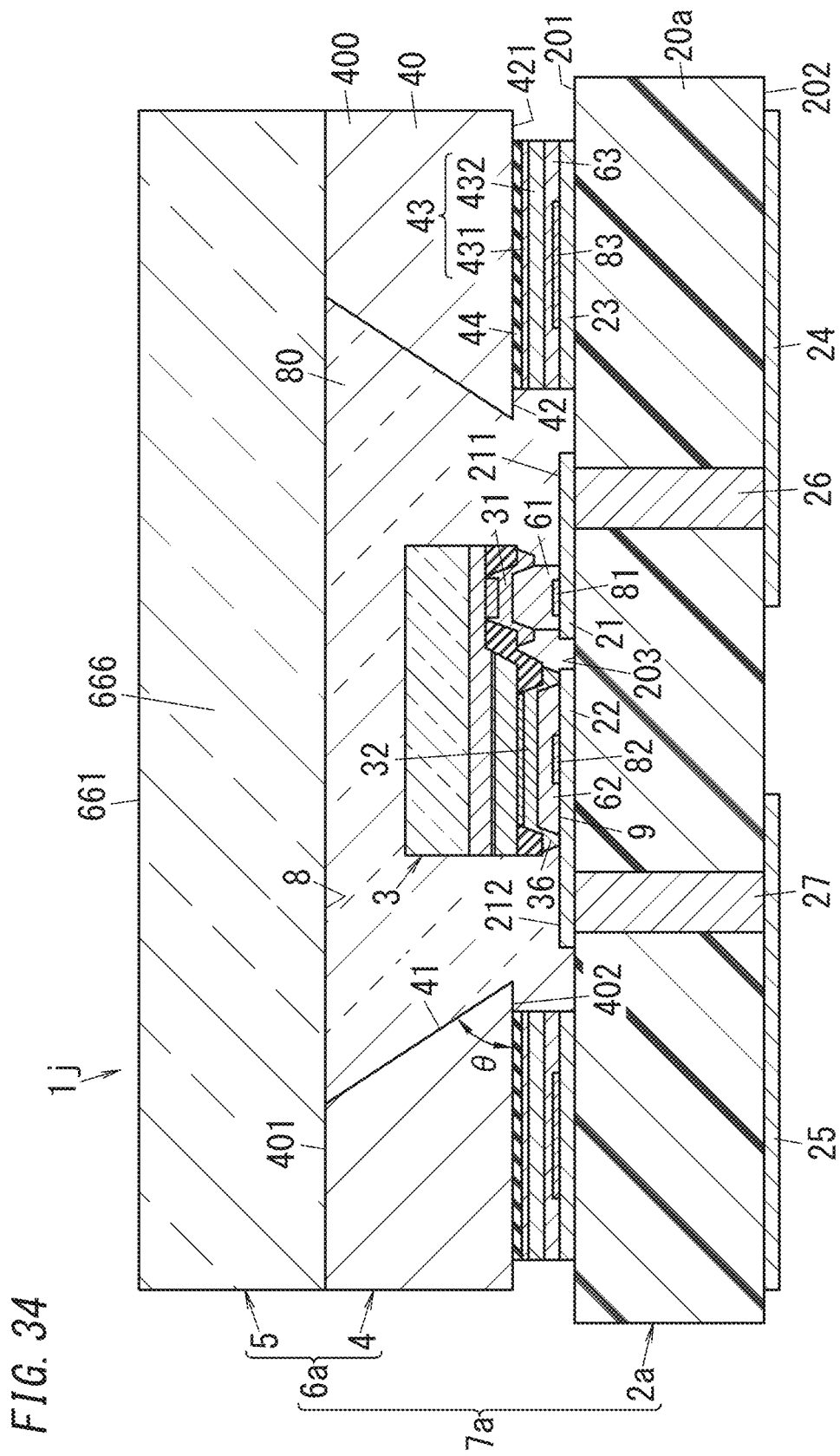
FIG. 34 is a schematic section of the light emitting device of Embodiment 7.
Figure 35A:
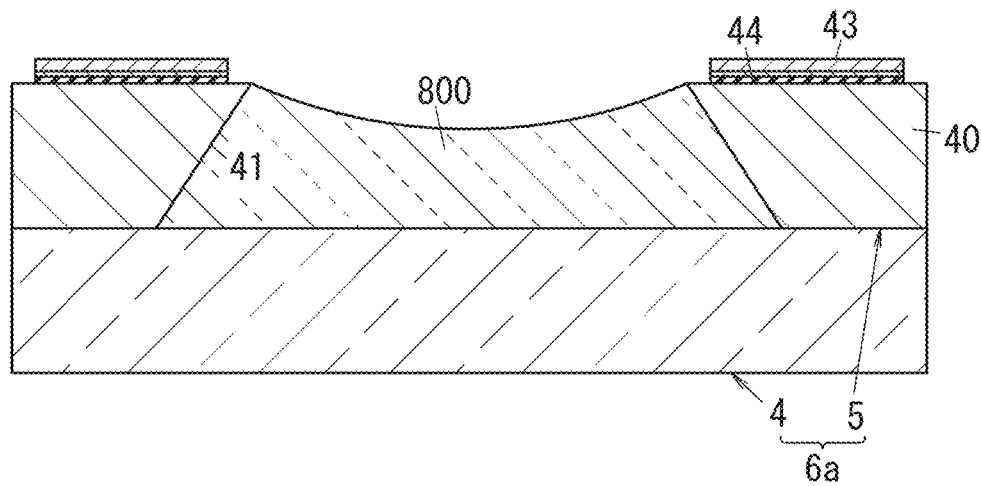
FIG. 35A is a primary section for illustration of the method for manufacturing the light emitting device of Embodiment 7.
Figure 35B:
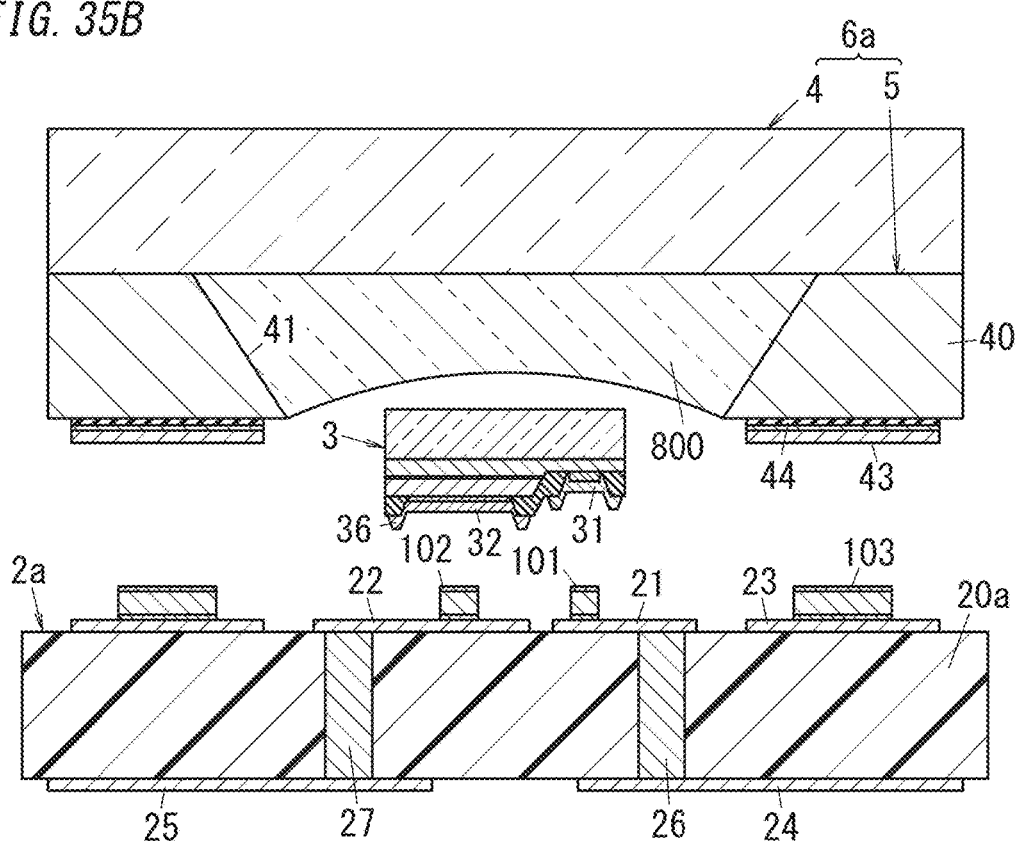
FIG. 35B is a primary section for illustration of the method for manufacturing the light emitting device of Embodiment 7.

Hereinafter, a light emitting device 1j of the present embodiment is described with reference to FIG. 34 and FIG. 35A and FIG. 35B. The light emitting device 1j is different from the light emitting device 1a of Embodiment 1 in including a sealing member 80 which is placed inside the space 8 enclosed by the mounting substrate 2a, the spacer 4, and the cover 5 to enclose the ultraviolet light emitting element 3. Note that, components common to the light emitting device 1j and the light emitting device 1a are attached with common reference signs to avoid redundant explanations.

The sealing member 80 is made of sealant having electrically insulating properties. Additionally, the sealant for forming the sealing member 80 has ultraviolet light resistance to ultraviolet light emitted from the ultraviolet light emitting element 3, and is transmissive for ultraviolet light emitted from the ultraviolet light emitting element 3. The expression "material has ultraviolet light resistance to ultraviolet light emitted from the ultraviolet light emitting element 3" means that the material shows a decrease ratio of transmissivities after and before a rated current is made to continuously flow through the ultraviolet light emitting element 3 for 2000 hours is 30% or less. The sealing member 80 has a refractive index higher than a refractive index of an inactive gas.

Examples of the sealant may include silicone resin which has a backbone of Si—O bonds and has transmissivity of 90% or more for ultraviolet light and fluorine-based resin (for example, amorphous fluoropolymer) which has a backbone of C—F bonds and has transmissivity of 90% or more for ultraviolet light, The cover 5 has a refractive index of about 1.5 for ultraviolet light with a wavelength of 265 nm. Further, the substrate 30 has a refractive index of about 1.8 for ultraviolet light with a wavelength of 265 nm. Meanwhile, the sealing member 80 has a refractive index in a range of, for example, about 1.3 to 1.5 for ultraviolet light with a wavelength of 265 nm.

The light emitting device 1j includes the sealing member 80 which is placed inside the space 8 enclosed by the mounting substrate 2a, the spacer 4, and the cover 5 to enclose the ultraviolet light emitting element 3, thereby improving light extraction efficiency and increasing output.

The method for manufacturing the light emitting device 1*j* of the present embodiment is almost same as the method for manufacturing the light emitting device 1*a*, but is different in filling a space surrounded by the cover 5 and the spacer 4 of the cap 6*a* with a sealing resin 800 serving as a base for the sealing member 80 (FIG. 35A), and thereafter making the cap 6*a* face the mounting substrate 2*a* (FIG. 35B), and subsequently bonding the cap 6*a* to the mounting substrate 2*a*, and after that thermally curing the sealing resin 800 to form the sealing member 80. Process conditions for thermally curing the sealing resin 800 includes, for example, a heating temperature of 150° C. and heating length of time of 2 hours.

Materials, values, and the like mentioned in the explanations of Embodiments 1 to 7 are preferable examples, and they are not used to limit the scope of the invention. Further, the embodiments embodying aspects of the present invention may be modified in appropriate ways without departing from the scope of the technical concept of the present invention.

For example, in the light emitting devices 1*a*, 1*b*, 1*c*, 1*d*, 1*e*, 1*f*, 1*g*, 1*h* and 1*j*, the ultraviolet light emitting element 3 is an ultraviolet LED chip. However, examples of the ultraviolet light emitting element 3 may include an ultraviolet LD (laser diode) chip in addition thereto.

Further, in the light emitting devices 1*a*, 1*b*, 1*c*, 1*d* and 1*j*, the spacer body 40 is made of Si. However, the spacer body 40 may be made of Al.

Aspects According to the Present Invention

As apparent from the aforementioned Embodiments 1 to 7, the light emitting device (1*a*, 1*b*, 1*c*, 1*d*, 1*e*, 1*f*, 1*g*, 1*j*) of the first aspect according to the present invention includes: a mounting substrate (2*a*, 2*b*, 2*d*); an ultraviolet light emitting element (3) mounted on the mounting substrate (2*a*, 2*b*, 2*d*); and a cap (6*a*, 6*c*, 6*e*, 6*g*) placed on the mounting substrate (2*a*, 2*b*, 2*d*) and including a recess (663) for accommodating the ultraviolet light emitting element (3). The mounting substrate (2*a*, 2*b*, 2*d*) includes a support (20*a*, 20*d*), and a first conductor (21), a second conductor (22) and a first bonding metal layer (23) supported on the support (20*a*, 20*d*). The first conductor (21) and the second conductor (22) are placed facing a front surface (201) of the support (20*a*, 20*d*) to face a bottom (664) of the recess (663) of the cap (6*a*, 6*c*, 6*e*, 6*g*). The cap (6*a*, 6*c*, 6*e*, 6*g*) includes a cap body (660) having a front surface (661) and a rear surface (662) and provided with the recess (663) in the rear surface (662), and a second bonding metal layer (43) placed on the rear surface (662) of the cap body (660) at a periphery of the recess (663) to face the first bonding metal layer (23). The cap (6*a*, 6*c*, 6*e*, 6*g*) further includes an ultraviolet light transmitting part (666) between the front surface (661) of the cap body (660) and the bottom (664) of the recess (663), and at least the ultraviolet light transmitting part (666) is made of glass for transmitting ultraviolet light emitted from the ultraviolet light emitting element (3). The ultraviolet light emitting element (3) includes a first electrode (31) and a second electrode (32) and the first electrode (31) and the second electrode (32) are placed facing a surface in a thickness direction of the ultraviolet light emitting element (3). The first conductor (21), the second conductor (22), and the first bonding metal layer (23) are formed of a same laminated film facing the front surface (201) of the support (20*a*, 20*d*). Each of the first conductor (21), the second conductor (22), and the first bonding metal layer (23) includes an uppermost layer which is the furthest from the support (20*a*, 20*d*) therein and is made of Au. The first electrode (31) and the first conductor (21) are bonded with a first bond (61) made of AuSn. The second electrode (32) and the second conductor (22) are bonded with a second bond (62) made of AuSn. The first bonding metal layer (23) and the second bonding metal layer (43) are bonded with a third bond (63) made of AuSn.

The light emitting device (1*a*, 1*b*, 1*c*, 1*d*, 1*e*, 1*f*, 1*g*, 1*j*) of the second aspect according to the present invention, which would be realized in combination with the first aspect, further includes: a first barrier layer (81) between the first conductor (21) and the first bond (61); a second barrier layer (82) between the second conductor (22) and the second bond (62); and a third barrier layer (83) between the first bonding metal layer (23) and the third bond (63). The first barrier layer (81), the second barrier layer (82), and the third barrier layer (83) are made of same material and have a same thickness.

In the light emitting device (1*a*, 1*b*, 1*c*, 1*d*, 1*e*, 1*f*, 1*g*, 1*j*) of the third aspect according to the present invention, which would be realized in combination with the first or second aspect, the first electrode (31) includes a first pad electrode layer (31B) including an Au film having a surface serving as an uppermost surface of the first pad electrode layer (31B). The second electrode (32) includes a second pad electrode layer (32B) including an Au film having a surface serving as an uppermost surface of the second pad electrode layer (32B). The second bonding metal layer (43) is a laminated film of a foundation film (431) and an Au film (432).

In the light emitting device (1*a*, 1*b*, 1*c*, 1*d*, 1*e*, 1*f*, 1*g*, 1*j*) of the fourth aspect according to the present invention, which would be realized in combination with any one of the first to third aspects, the third bond (63) extends an entire length of an outer periphery of the rear surface (662) of the cap body (660).

In the light emitting device (1*a*, 1*b*, 1*c*, 1*d*, 1*e*, 1*f*, 1*g*) of the fifth aspect according to the present invention, which would be realized in combination with the fourth aspect, a space enclosed by the mounting substrate (2*a*, 2*b*, 2*d*) and the cap (6*a*, 6*c*, 6*e*, 6*g*) is filled with an inactive gas atmosphere.

In the light emitting device (1*a*, 1*b*, 1*c*, 1*d*, 1*e*, 1*f*, 1*g*, 1*j*) of the sixth aspect according to the present invention, which would be realized in combination with any one of the first to fifth aspects, the cap (6*a*, 6*c*, 6*e*, 6*g*) is smaller than the mounting substrate (2*a*, 2*b*, 2*d*) in a plan view.

In the light emitting device (1*a*, 1*b*, 1*c*, 1*e*, 1*g*, 1*j*) of the seventh aspect according to the present invention, which would be realized in combination with any one of the first to sixth aspects, the mounting substrate (2*a*, 2*b*) includes a first external connection electrode (24) and a second external connection electrode (25), and further includes a first penetrating wire (26) and a second penetrating wire (27) which penetrate the support (20*a*) in a thickness direction thereof. The first external connection electrode (24) and the second external connection electrode (25) are formed on a rear surface (202) of the support (20*a*). The first external connection electrode (24) is electrically connected to the first conductor (21) through the first penetrating wire (26). The second external connection electrode (25) is electrically connected to the second conductor (22) through the second penetrating wire (27).

In the light emitting device (1*a*, 1*b*, 1*c*, 1*e*, 1*g*, 1*j*) of the eighth aspect according to the present invention, which would be realized in combination with the seventh aspect, the support (20*a*) is made of MN ceramic.

In the light emitting device (1d, 1f) of the ninth aspect according to the present invention, which would be realized in combination with any one of the first to sixth aspects, the mounting substrate (2d) is a multilayered substrate. The mounting substrate (2d) includes a first external connection electrode (24) and a second external connection electrode (25), and further includes a first wiring layer (28), a second wiring layer (29), and an electrically insulating layer (253). The first wiring layer (28) and the second wiring layer (29) are placed facing the front surface (201) of the support (20d). The first conductor (21) and the first external connection electrode (24) are placed on the first wiring layer (28) to be electrically connected to the first wiring layer (28). The second conductor (22) and the second external connection electrode (25) are placed on the second wiring layer (29) to be electrically connected to the second wiring layer (29). The electrically insulating layer (253) is placed facing the front surface (201) of the support (20d) to cover the first wiring layer (28) and the second wiring layer (29). The first bonding metal layer (23) is placed on the electrically insulating layer (253).

In the light emitting device (1d, 1f) of the tenth aspect according to the present invention, which would be realized in combination with the ninth aspect, the mounting substrate (2d) includes a second electrically insulating layer (251) different from a first electrically insulating layer (253) being the electrically insulating layer (253). The support (20d) is made of Si. The second electrically insulating layer (251) is placed on the front surface (201) of the support (20d). The first wiring layer (28) and the second wiring layer (29) are placed on the second electrically insulating layer (251).

In the light emitting device (1a, 1b, 1c, 1d, 1g, 1j) of the eleventh aspect according to the present invention, which would be realized in combination with any one of the first to tenth aspects, the cap (6a, 6c, 6g) includes a spacer (4) placed on the mounting substrate (2a, 2b, 2d) and includes a through hole (41) for exposing the ultraviolet light emitting element (3), and a cover (5) placed on the spacer (4) to cover the through hole (41) of the spacer (4) and bonded to the spacer (4). The bottom (664) of the recess (663) is part of a surface of the cover (5) exposed via the through hole (41). The cover (5) is made of glass transmissive for ultraviolet light emitted from the ultraviolet light emitting element (3). The spacer (4) includes a spacer body (40) made of Si, and the second bonding metal layer (43) placed facing a facing surface (42) of the spacer body (40) facing the mounting substrate (2a, 2b, 2d) to face the first bonding metal layer (23).

In the light emitting device (1a, 1b, 1c, 1d, 1g, 1j) of the twelfth aspect according to the present invention, which would be realized in combination with the eleventh aspect, the through hole (41) is formed in the spacer body (40). The through hole (41) has an opening area which gradually increases with an increase in a distance from the mounting substrate (2a, 2b, 2d).

In the light emitting device (1a, 1b, 1c, 1d, 1g, 1j) of the thirteenth aspect according to the present invention, which would be realized in combination with the twelfth aspect, the spacer body (40) is formed of a single-crystalline Si substrate (400) having a (100)-plane as a surface (401) thereof, and an internal side surface of the through hole (41) is parallel to a {111}-plane.

In the light emitting device (1a, 1b, 1c, 1d, 1g, 1j) of the fourteenth aspect according to the present invention, which would be realized in combination with the thirteenth aspect, the internal side surface of the through hole (41) in the spacer (4) is formed of a surface of a silicon oxide film formed parallel to the {111}-plane.

In the light emitting device (1a, 1b, 1c, 1d, 1g, 1j) of the fifteenth aspect according to the present invention, which would be realized in combination with any one of the eleventh to fourteenth aspects, the ultraviolet light emitting element (3) is configured to emit ultraviolet light having an emission peak wavelength in a wavelength-range of UV-C.

In the light emitting device (1a, 1b, 1d, 1g, 1j) of the sixteenth aspect according to the present invention, which would be realized in combination with any one of the eleventh to fifteenth aspects, the glass forming the cover (5) contains an alkaline component. The spacer (4) and the cover (5) are directly bonded.

In the light emitting device (1c) of the seventeenth aspect according to the present invention, which would be realized in combination with any one of the eleventh to fifteenth aspects, the spacer (4) and the cover (5) are bonded with a fourth bond (64) made of low melting point glass having a coefficient of thermal expansion between a coefficient of thermal expansion of the spacer body (40) and a coefficient of thermal expansion of the cover (5).

In the light emitting device (1g) of the eighteenth aspect according to the present invention, which would be realized in combination with the sixteenth aspect, the spacer (4) includes a silicon oxide film (46) formed on a facing surface (45) of the spacer body (40) facing the cover (5).

In the light emitting device (1e, 1f) of the nineteenth aspect according to the present invention, which would be realized in combination with any one of the first to tenth aspects, a whole of the cap body (660) is made of glass transmissive for ultraviolet light emitted from the ultraviolet light emitting element (3).

The method of the twentieth aspect according to the present invention is a method for manufacturing the light emitting device (1a, 1b, 1c, 1d, 1e, 1f, 1g, 1j). The light emitting device (1a, 1b, 1c, 1d, 1e, 1f, 1g, 1j) includes: a mounting substrate (2a, 2b, 2d); an ultraviolet light emitting element (3) mounted on the mounting substrate (2a, 2b, 2d); and a cap (6a, 6c, 6e, 6g) placed on the mounting substrate (2a, 2b, 2d) and including a recess (663) for accommodating the ultraviolet light emitting element (3). The mounting substrate (2a, 2b, 2d) includes a support (20a, 20d), and a first conductor (21), a second conductor (22) and a first bonding metal layer (23) supported on the support (20a, 20d). The first conductor (21) and the second conductor (22) are placed facing a front surface (201) of the support (20a, 20d) to face a bottom (664) of the recess (663) of the cap (6a, 6c, 6e, 6g). The cap (6a, 6c, 6e, 6g) includes a cap body (660) having a front surface (661) and a rear surface (662) and provided with the recess (663) in the rear surface (662), and a second bonding metal layer (43) placed on the rear surface (662) of the cap body (660) at a periphery of the recess (663) to face the first bonding metal layer (23). The cap (6a, 6c, 6e, 6g) further includes an ultraviolet light transmitting part (666) between the front surface (661) of the cap body (660) and the bottom (664) of the recess (663), and at least the ultraviolet light transmitting part (666) is made of glass for transmitting ultraviolet light emitted from the ultraviolet light emitting element (3). The ultraviolet light emitting element (3) includes a first electrode (31) and a second electrode (32) and the first electrode (31) and the second electrode (32) are placed facing a surface in a thickness direction of the ultraviolet light emitting element (3). The method includes: forming the cap (6a, 6c, 6e, 6g); and subsequently bonding the first electrode (31) and the second electrode (32) of the ultraviolet light emitting element (3), and the second bonding metal layer (43) of the cap (6a, 6c, 6e, 6g), to the first conductor (21), the second conductor (22), and the first bonding metal layer (23) of the mounting substrate (2a, 2b, 2d) with a first AuSn layer (71), a second AuSn layer (72), and a third AuSn layer (73), respectively. The first AuSn layer (71), the second AuSn layer (72), and the third AuSn layer (73) are formed collectively on/over the mounting substrate (2a, 2b, 2d) by a same process.

In the method for manufacturing the light emitting device (1a, 1b, 1c, 1d, 1e, 1f, 1g, 1j), of the twenty-first aspect according to the present invention, which would be realized in combination with the twenty aspect, a first bonding process is performed to bond the first electrode (31) and the second electrode (32) of the ultraviolet light emitting element (3), to the first conductor (21) and the second conductor (22) of the mounting substrate (2a, 2b, 2d) with the first AuSn layer (71) and the second AuSn layer (72), respectively. A second bonding process subsequent to the first bonding process is performed to bond the second bonding metal layer (43) of the cap (6a, 6c, 6e, 6g) to the first bonding metal layer (23) of the mounting substrate (2a, 2b, 2d) with the third AuSn layer (73). The first bonding process and the second bonding process are sequentially performed in a bonding room of single bonding apparatus.

The light emitting device (1a, 1b, 1c, 1d, 1e, 1f, 1g, 1h, 1i, 1j) of the twenty-second aspect according to the present invention includes: a mounting substrate (2a, 2b, 2d); an ultraviolet light emitting element (3) mounted on the mounting substrate (2a, 2b, 2d); a spacer (4) placed on the mounting substrate (2a, 2b, 2d) and includes a through hole (41) for exposing the ultraviolet light emitting element (3); and a cover (5) placed on the spacer (4) to cover the through hole (41) of the spacer (4) and bonded to the spacer (4). The ultraviolet light emitting element (3) is configured to emit ultraviolet light with an emission peak wavelength with a wavelength range of ultraviolet light. The spacer (4) includes a spacer body (40) made of Si. The through hole (41) is formed in the spacer body (40). The through hole (41) has an opening area gradually increasing with an increase in a distance from the mounting substrate (2a, 2b, 2d). The cover (5) is made of glass transmissive for ultraviolet light emitted from the ultraviolet light emitting element (3). The spacer (4) and the cover (5) are bonded to each other.

In the light emitting device (1a, 1b, 1c, 1d, 1f, 1g, 1h, 1i, 1j) of the twenty-third aspect according to the present invention, which would be realized in combination with the twenty-second aspect, the ultraviolet light emitting element (3) is configured to emit ultraviolet light having an emission peak wavelength in a wavelength-range of UV-C.

In the light emitting device (1a, 1b, 1c, 1d, 1f, 1g, 1h, 1i, 1j) of the twenty-fourth aspect according to the present invention, which would be realized in combination with the twenty-second or twenty-third aspect, the spacer body (40) is formed of a single-crystalline Si substrate (400) having a (100)-plane as a surface (401) thereof, and an internal side surface of the through hole (41) is parallel to a {111}-plane.

In the light emitting device (1a, 1b, 1c, 1d, 1f, 1g, 1h, 1i, 1j) of the twenty-fifth aspect according to the present invention, which would be realized in combination with the twenty-fourth aspect, the internal side surface of the through hole (41) in the spacer (4) is formed of a surface of a silicon oxide film formed parallel to the {111}-plane.

The light emitting device (1j) of the twenty-sixth aspect according to the present invention, which would be realized in combination with any one of the twenty-second to twenty-fifth aspects, further includes a sealing member (80) which is placed inside a space (8) enclosed by the mounting substrate (2a, 2b, 2d), the spacer (4), and the cover (5) to enclose the ultraviolet light emitting element (3).

The light emitting device (1g) of the twenty-seventh aspect according to the present invention includes: a mounting substrate (2a, 2b, 2d); an ultraviolet light emitting element (3) mounted on the mounting substrate (2a, 2b, 2d); and a cap (6g) placed on the mounting substrate (2a, 2b, 2d) and including a recess (663) for accommodating the ultraviolet light emitting element (3). The cap (6g) includes: a spacer (4) placed on the mounting substrate (2a, 2b, 2d) and including a through hole (41) for exposing the ultraviolet light emitting element (3); and a cover (5) placed on the spacer (4) to cover the through hole (41) of the spacer (4) and bonded to the spacer (4). The cover (5) is made of borosilicate glass transmissive for ultraviolet light emitted from the ultraviolet light emitting element (3). The spacer (4) includes a spacer body (40) made of Si, and a silicon oxide film (46) formed on a facing surface (45) of the spacer body (40) facing the cover (5). The spacer (4) and the cover (5) are bonded directly.

In the light emitting device (1g) of the twenty-eighth aspect according to the present invention, which would be realized in combination with the twenty-seventh aspect, the silicon oxide film (46) is of thermal oxide.

In the light emitting device (1g) of the twenty-ninth aspect according to the present invention, which would be realized in combination with the twenty-seventh or twenty-eighth aspect, the silicon oxide film (46) has a thickness of 50 nm or more.

The method of the thirtieth aspect according to the present invention is a method for manufacturing the light emitting device (1g). The light emitting device (1g) includes: a mounting substrate (2a, 2b, 2d); an ultraviolet light emitting element (3) mounted on the mounting substrate (2a, 2b, 2d); and a cap (6g) placed on the mounting substrate (2a, 2b, 2d) and including a recess (663) for accommodating the ultraviolet light emitting element (3). The cap (6g) includes: a spacer (4) placed on the mounting substrate (2a, 2b, 2d) and including a through hole (41) for exposing the ultraviolet light emitting element (3); and a cover (5) placed on the spacer (4) to cover the through hole (41) of the spacer (4) and bonded to the spacer (4). The cover (5) is made of borosilicate glass transmissive for ultraviolet light emitted from the ultraviolet light emitting element (3). The spacer (4) includes a spacer body (40) made of Si, and a silicon oxide film (46) formed on a facing surface (45) of the spacer body (40) facing the cover (5). The spacer (4) and the cover (5) are bonded directly. The method includes: forming a wafer-level bonded member by directly bonding a first wafer (4001) provided with a plurality of the spacers (4) to a second wafer (5000) allowing formation of a plurality of the covers (5), by anodic bonding; subsequently forming the cap (6g) by dicing the wafer-level bonded member; and subsequently bonding the cap (6g) to the mounting substrate (2a, 2b, 2d) on which the ultraviolet light emitting element (3) is mounted.

The invention claimed is:
1. A light emitting device, comprising:
a mounting substrate;
an ultraviolet light emitting element mounted on the mounting substrate; and
a cap placed on the mounting substrate and including a recess for accommodating the ultraviolet light emitting element, the mounting substrate including a support, and a first conductor, a second conductor and a first bonding metal layer supported on the support, the first conductor and the second conductor being placed facing a front surface of the support to face a bottom of the recess of the cap, the cap including a cap body having a front surface and a rear surface and provided with the recess in the rear surface, and a second bonding metal layer placed on the rear surface of the cap body at a periphery of the recess to face the first bonding metal layer, the cap further including an ultraviolet light transmitting part between the front surface of the cap body and the bottom of the recess, at least the ultraviolet light transmitting part being made of glass for transmitting ultraviolet light emitted from the ultraviolet light emitting element, the ultraviolet light emitting element including a first electrode and a second electrode, the first electrode and the second electrode being placed facing a surface in a thickness direction of the ultraviolet light emitting element, the first conductor, the second conductor, and the first bonding metal layer being formed of a same laminated film facing the front surface of the support, each of the first conductor, the second conductor, and the first bonding metal layer including an uppermost layer which is furthest from the support therein and is made of Au, the first electrode and the first conductor being bonded with a first bond made of AuSn, the second electrode and the second conductor being bonded with a second bond made of AuSn, and the first bonding metal layer and the second bonding metal layer being bonded with a third bond made of AuSn.

2. The light emitting device of claim 1, further comprising:

a first barrier layer between the first conductor and the first bond;

a second barrier layer between the second conductor and the second bond; and a third barrier layer between the first bonding metal layer and the third bond, the first barrier layer, the second barrier layer, and the third barrier layer being made of same material and have a same thickness.

3. The light emitting device of claim 1, wherein:

the first electrode includes a first pad electrode layer including an Au film having a surface serving as an uppermost surface of the first pad electrode layer;

the second electrode includes a second pad electrode layer including an Au film having a surface serving as an uppermost surface of the second pad electrode layer; and the second bonding metal layer is a laminated film of a foundation film and an Au film.

4. The light emitting device of claim 1, wherein the third bond extends an entire length of an outer periphery of the rear surface of the cap body.

5. The light emitting device of claim 4, wherein a space enclosed by the mounting substrate and the cap is filled with an inactive gas atmosphere.

6. The light emitting device of claim 1, wherein the cap is smaller than the mounting substrate in a plan view.

7. The light emitting device of claim 1, wherein:

the mounting substrate includes a first external connection electrode and a second external connection electrode, and further includes a first penetrating wire and a second penetrating wire which penetrate the support in a thickness direction thereof;

the first external connection electrode and the second external connection electrode are formed on a rear surface of the support;

the first external connection electrode is electrically connected to the first conductor through the first penetrating wire; and the second external connection electrode is electrically connected to the second conductor through the second penetrating wire.

8. The light emitting device of claim 7, wherein the support is made of AN ceramic.

9. The light emitting device of claim 1, wherein:

the mounting substrate is a multilayered substrate;

the mounting substrate includes a first external connection electrode and a second external connection electrode, and further includes a first wiring layer, a second wiring layer, and an electrically insulating layer;

the first wiring layer and the second wiring layer are placed facing the front surface of the support;

the first conductor and the first external connection electrode are placed on the first wiring layer to be electrically connected to the first wiring layer;

the second conductor and the second external connection electrode are placed on the second wiring layer to be electrically connected to the second wiring layer;

the electrically insulating layer is placed facing the front surface of the support to cover the first wiring layer and the second wiring layer;

the first bonding metal layer is placed on the electrically insulating layer.

10. The light emitting device of claim 9, wherein:

the mounting substrate includes a second electrically insulating layer different from a first electrically insulating layer which is the electrically insulating layer;

the support is made of Si;

the second electrically insulating layer is placed on the front surface of the support; and the first wiring layer and the second wiring layer are placed on the second electrically insulating layer.

11. The light emitting device of claim 1, wherein:

the cap includes a spacer placed on the mounting substrate and includes a through hole for exposing the ultraviolet light emitting element, and a cover placed on the spacer to cover the through hole of the spacer and bonded to the spacer, the bottom of the recess is part of a surface of the cover exposed via the through hole;

the cover is made of glass transmissive for ultraviolet light emitted from the ultraviolet light emitting element; and the spacer includes a spacer body made of Si, and the second bonding metal layer placed facing a facing surface of the spacer body facing the mounting substrate to face the first bonding metal layer.

12. The light emitting device of claim 11, wherein:

the through hole is formed in the spacer body; and the through hole has an opening area which gradually increases with an increase in a distance from the mounting substrate.

13. The light emitting device of claim 12, wherein
the spacer body is formed of a single-crystalline Si substrate having a (100)-plane as a surface thereof, and an internal side surface of the through hole is parallel to a {111}-plane.

14. The light emitting device of claim 13, wherein
the internal side surface of the through hole in the spacer is formed of a surface of a silicon oxide film formed parallel to the {111}-plane.

15. The light emitting device of claim 11, wherein
the ultraviolet light emitting element is configured to emit ultraviolet light having an emission peak wavelength in a wavelength-range of UV-C.

16. The light emitting device of claim 11, wherein:
the glass forming the cover contains an alkaline component; and
the spacer and the cover are directly bonded.

17. The light emitting device of claim 11, wherein
the spacer and the cover are bonded with a fourth bond made of low melting point glass having a coefficient of thermal expansion between a coefficient of thermal expansion of the spacer body and a coefficient of thermal expansion of the cover.

18. The light emitting device of claim 16, wherein
the spacer includes a silicon oxide film formed on a facing surface of the spacer body facing the cover.

19. The light emitting device of claim 1, wherein
a whole of the cap body is made of glass transmissive for ultraviolet light emitted from the ultraviolet light emitting element.

20. A method for manufacturing a light emitting device, the light emitting device including:
- a mounting substrate;
- an ultraviolet light emitting element mounted on the mounting substrate; and
- a cap placed on the mounting substrate and including a recess for accommodating the ultraviolet light emitting element,
- the mounting substrate including a support, and a first conductor, a second conductor and a first bonding metal layer supported on the support,
- the first conductor and the second conductor being placed facing a front surface of the support to face a bottom of the recess of the cap,
- the cap including a cap body having a front surface and a rear surface and provided with the recess in the rear surface, and a second bonding metal layer placed on the rear surface of the cap body at a periphery of the recess to face the first bonding metal layer, the cap further including an ultraviolet light transmitting part between the front surface of the cap body and the bottom of the recess, at least the ultraviolet light transmitting part being made of glass for transmitting ultraviolet light emitted from the ultraviolet light emitting element,
- the ultraviolet light emitting element including a first electrode and a second electrode, the first electrode and the second electrode being placed facing a surface in a thickness direction of the ultraviolet light emitting element, the method comprising:
forming the cap; and
subsequently bonding the first electrode and the second electrode of the ultraviolet light emitting element, and the second bonding metal layer of the cap, to the first conductor, the second conductor, and the first bonding metal layer of the mounting substrate with a first AuSn layer, a second AuSn layer, and a third AuSn layer, respectively,
the first AuSn layer, the second AuSn layer, and the third AuSn layer being formed collectively on/over the mounting substrate by a same process.

21. The method of claim 20, wherein:
a first bonding process is performed to bond the first electrode and the second electrode of the ultraviolet light emitting element, to the first conductor and the second conductor of the mounting substrate with the first AuSn layer and the second AuSn layer, respectively;
a second bonding process subsequent to the first bonding process is performed to bond the second bonding metal layer of the cap to the first bonding metal layer of the mounting substrate with the third AuSn layer; and
the first bonding process and the second bonding process are sequentially performed in a bonding room of single bonding apparatus.

* * * * *